United States Patent
Mukaiyama et al.

(10) Patent No.: US 10,564,545 B2
(45) Date of Patent: *Feb. 18, 2020

(54) PHOTOSENSITIVE RESIN COMPOSITION, LITHOGRAPHIC PRINTING PLATE PRECURSOR, AND METHOD FOR PRODUCING LITHOGRAPHIC PRINTING PLATE

(71) Applicant: FUJIFILM Corporation, Tokyo (JP)

(72) Inventors: Rena Mukaiyama, Shizuoka (JP); Atsuyasu Nozaki, Shizuoka (JP); Takashi Sato, Shizuoka (JP); Kotaro Asano, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 52 days.

This patent is subject to a terminal disclaimer.

(21) Appl. No.: 15/278,715

(22) Filed: Sep. 28, 2016

(65) Prior Publication Data

US 2017/0017154 A1 Jan. 19, 2017

Related U.S. Application Data

(63) Continuation of application No. PCT/JP2015/060068, filed on Mar. 31, 2015.

(30) Foreign Application Priority Data

| Mar. 31, 2014 | (JP) | ................................ 2014-074367 |
| Aug. 29, 2014 | (JP) | ................................ 2014-176551 |

(51) Int. Cl.
| G03F 7/32 | (2006.01) |
| G03F 7/039 | (2006.01) |
| B41C 1/10 | (2006.01) |
| G03F 7/09 | (2006.01) |
| G03F 7/20 | (2006.01) |

(52) U.S. Cl.
CPC .......... *G03F 7/0392* (2013.01); *B41C 1/1008* (2013.01); *G03F 7/09* (2013.01); *G03F 7/2055* (2013.01); *G03F 7/322* (2013.01)

(58) Field of Classification Search
CPC ....................................................... G03F 7/00
See application file for complete search history.

(56) References Cited

U.S. PATENT DOCUMENTS

| 2003/0224281 A1 | 12/2003 | Ishizuka et al. |
| 2005/0064325 A1 | 3/2005 | Nakamura et al. |
| 2005/0202342 A1 | 9/2005 | Nagashima |

FOREIGN PATENT DOCUMENTS

| JP | H07-20620 | A1 | * | 1/1995 |
| JP | 3199295 | B2 | * | 8/2001 |
| JP | 2003-315995 | A | | 11/2003 |
| JP | 2005-91429 | A | | 4/2005 |
| JP | 2005-258070 | A | | 9/2005 |
| JP | 2006-225432 | A | | 8/2006 |
| JP | 2010139860 | A | * | 6/2010 |

OTHER PUBLICATIONS

English Abstract, JP 3199295 B2, p. 1 (2001).*
English Abstract, JP H07-20620 A1, p. 1 (1995).*
JP-2010139860-A Machine Translation (2019) (Year: 2019).*
Communication dated Feb. 24, 2017 from the European Patent Office in counterpart Application No. 15772211.7.
Written Opinion for PCT/JP2015/060068 dated May 26, 2015 [PCT/ISA/237].
International Search Report for PCT/JP2015/060068 dated May 26, 2015 [PCT/ISA/210].

* cited by examiner

*Primary Examiner* — Chanceity N Robinson
(74) *Attorney, Agent, or Firm* — Sughrue Mion, PLLC

(57) ABSTRACT

A photosensitive resin composition contains a polymer compound having a linking group represented by Formula A-1 in the main chain; and an infrared absorbing material. In Formula A-1, $R^1$ and $R^2$ each independently represent a hydrogen atom or a monovalent organic group, and $X^1$ is a specific linking group.

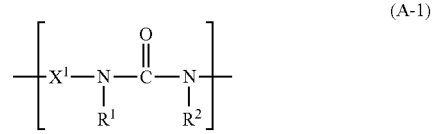

(A-1)

19 Claims, No Drawings

PHOTOSENSITIVE RESIN COMPOSITION, LITHOGRAPHIC PRINTING PLATE PRECURSOR, AND METHOD FOR PRODUCING LITHOGRAPHIC PRINTING PLATE

CROSS-REFERENCE TO RELATED APPLICATIONS

This application is a continuation application of International Application No. PCT/JP2015/060068, filed on Mar. 31, 2015, which is incorporated herein by reference in its entirety The disclosures of Japanese Patent Application No. 2014-074367, filed Mar. 31, 2014 and Japanese Patent Application No. 2014-176551, filed Aug. 29, 2014 are incorporated herein by reference in their entirety.

All publications, patent applications, and technical standards mentioned in this specification are herein incorporated by reference to the same extent as if each individual publication, patent application, or technical standard was specifically and individually indicated to be incorporated by reference.

BACKGROUND OF THE INVENTION

1. Field of the Invention

The present invention relates to a photosensitive resin composition, a lithographic printing plate precursor, and a method for producing a lithographic printing plate.

2. Description of the Related Art

In the related art, various photosensitive compositions have been used as a visible image forming material and a lithographic printing plate material. In particular, the development of lasers in the lithographic printing field in recent years has been remarkable, and in particular, solid lasers and semiconductor lasers having an emission region in a near infrared region to an infrared region, with a high output and a small size, has become easily available. In the field of lithographic printing, as an exposure light source when manufacturing a printing plate directly from digital data from a computer or the like, these lasers are very useful.

A positive type lithographic printing plate precursor for infrared laser has an alkali-soluble binder resin and an IR dye which absorbs light and generates heat, as essential components. In the unexposed portion (image portion), the IR dye and the like act as a development restrainer which substantially decreases the solubility of a binder resin in a developer due to an interaction with the binder resin, and in the exposed portion (non-image portion), the interaction between the IR dye and the like and the binder resin weakens due to generated heat, and the IR dye and the like dissolve in an alkaline developer, and as a result, a lithographic printing plate is formed.

As the lithographic printing plate in the related art, the lithographic printing plates described in JP2005-91429A, JP2005-258070A, JP2003-315995A, or JP2006-225432A are known.

SUMMARY OF THE INVENTION

However, if a recording layer formed of a resin composition exhibiting characteristics in which the solubility in an alkali aqueous solution in the exposure region is better is used in the lithographic printing plate material obtained by applying such a photosensitive resin composition, the strength of the image forming layer in the unexposed region is reduced, and both developability and printing durability are less likely to be achieved.

In addition, in recent years, there is an increasing demand for cost reduction in printing market, and inexpensive print materials are being widely used. Among the inexpensive print materials, there are a paper material and ink including coarse particles, and if printing is performed using these, the coarse particles damage the image portions, and due to this, the number of printed sheets is significantly reduced.

To solve the above problems, a lithographic printing plate precursor provided with a recording layer having excellent alkali solubility, including a polyurethane resin, a polyamide resin, or a phenolic resin is disclosed (refer to JP2005-91429A, JP2005-258070A, JP2003-315995A, or JP2006-225432A). This lithographic printing plate has excellent chemical resistance, but there is room for improvement in any of the developability of the exposed portion or the printing durability.

An object of the present invention is to provide a photosensitive resin composition which enables production of a lithographic printing plate precursor having a non-image portion which has good solubility in an alkali aqueous solution and which enables production of a lithographic printing plate having excellent printing durability, excellent chemical resistance, and, in particular, excellent printing durability at the time of using a low quality print material, a lithographic printing plate precursor obtained by using the photosensitive resin composition, and a method for producing a lithographic printing plate.

The above-described object of the present invention has been achieved by the means according to the following <1>, <8>, or <12>. <1>, <8>, and <12> are described below with <2> to <7> and <9> to <11> which are preferable embodiments.

<1> A photosensitive resin composition containing a polymer compound having a linking group represented by Formula A-1 in a main chain and an infrared absorbing material.

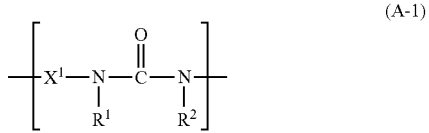

wherein in Formula A-1, $R^1$ and $R^2$ each independently represent a hydrogen atom or a monovalent organic group, and $X^1$ represents a linking group represented by any one of the following Formulas A-2 to A-6.

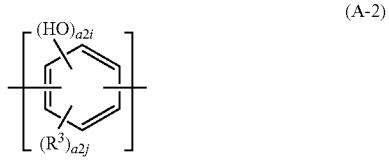

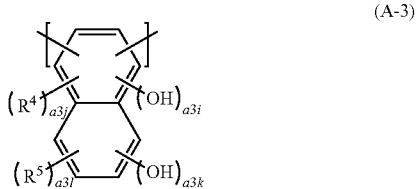

-continued

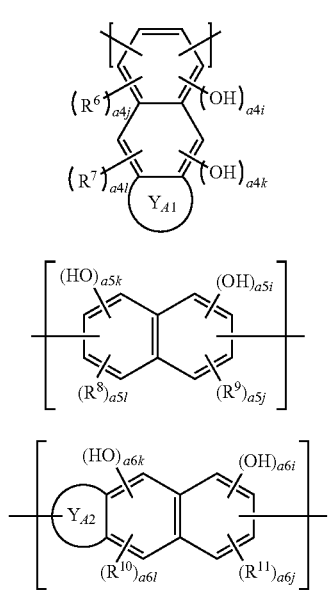

In Formulas A-2 to A-6, $R^3$ represents a halogen atom or a monovalent organic group, a2i represents an integer of 1 to 4, a2j represents an integer of 0 to 3, a2i+a2j is 1 to 4, $R^4$ and $R^5$ each independently represent a halogen atom or a monovalent organic group, a3i and a3j each independently represent an integer of 0 to 2, a3k and a3l each independently represent an integer of 0 to 4, a3i+a3k is 1 to 6, a3j+a3l is 0 to 6−(a3i+a3k), $R^6$ and $R^7$ each independently represent a halogen atom or a monovalent organic group, a4i and a4k each independently represent an integer of 0 to 2, a4i+a4k is 1 to 4, a4j and a4l each independently represent an integer of 0 to 2, a4j+a4l is 0 to 4−(a4i+a4k), $Y_{A1}$ represents an aromatic hydrocarbon ring or an aliphatic hydrocarbon ring, $R^8$ and $R^9$ each independently represent a halogen atom or a monovalent organic group, a5i and a5k each independently represent an integer of 0 to 3, a5i+a5k is 1 to 6, a5j and a5l each independently represent an integer of 0 to 3, a5j+a5l is 0 to 6−(a5i+a5k). $R^{10}$ and $R^{11}$ each independently represent a halogen atom or a monovalent organic group, a6k represents an integer of 0 to 2, a6i represents an integer of 0 to 3, a6i+a6k is 1 to 5, a6l represents an integer of 0 to 2, a6j represents an integer of 0 to 3, a6l+a6j is 0 to 5−(a6i+a6k), and $Y_{A2}$ represents an aromatic hydrocarbon ring or an aliphatic hydrocarbon ring.

<2> The photosensitive resin composition according to <1>, wherein the polymer compound includes a linking group represented by the following Formula A-7 in the main chain.

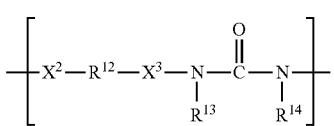

In Formula A-7, $R^{12}$ represents a single bond or a divalent linking group, $R^{13}$ and $R^{14}$ each independently represent a hydrogen atom or a monovalent organic group, and $X^2$ and $X^3$ each independently represent a linking group represented by any one of Formulas A-2 to A-6.

<3> The photosensitive resin composition according to <2>, wherein the linking group represented by Formula A-7 is a linking group represented by the following Formula A-8.

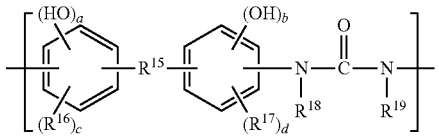

In Formula A-8, $R^{15}$ represents a single bond or a divalent linking group, $R^{16}$ and $R^{17}$ each independently represent a halogen atom or a monovalent organic group, $R^{18}$ and $R^{19}$ each independently represent a hydrogen atom or a monovalent organic group, a, b, c and d each independently represent an integer of 0 to 4, a+b is 1 to 8, and c+d is 0 to 8−(a+b).

<4> The photosensitive resin composition according to any one of <1> to <3>, wherein the polymer compound further has a linking group represented by the following Formula A-9 in the main chain.

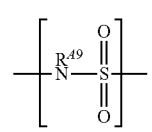

In Formula A-9, $R^{49}$ represents a hydrogen atom or a monovalent organic group.

<5> The photosensitive resin composition according to any one of <1> to <4>, wherein the polymer compound has a linking group represented by the following Formula B-1 or B-2 in the main chain.

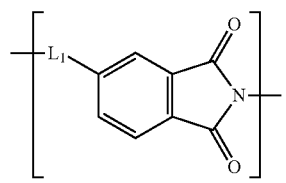

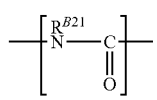

In Formulas B-1 and B-2, $L_1$ represents a single bond or a divalent linking group, and $R^{B21}$ represents a hydrogen atom or a monovalent organic group.

<6> The photosensitive resin composition according to any one of <1> to <5>, wherein the polymer compound further has at least one selected from the group consisting of linking groups represented by each of the following Formulas B-3 to B-7 in the main chain.

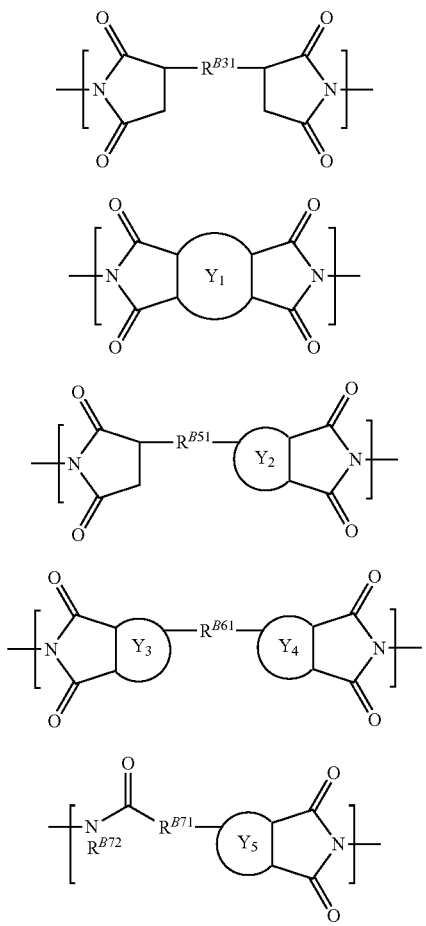

In Formulas B-3 to B-7, $R^{B31}$, $R^{B51}$, $R^{B61}$, and $R^{B71}$ each independently represent a single bond or a divalent linking group, $R^{B72}$ represents a hydrogen atom or a monovalent organic group, and $Y_1$ to $Y_5$ each independently represent an aromatic hydrocarbon ring or an aliphatic hydrocarbon ring.

<7> The photosensitive resin composition according to <6>, wherein the polymer compound further has the linking group represented by Formula B-4 or B-7 in the main chain.

<8> A lithographic printing plate precursor comprising an image recording layer including the photosensitive resin composition according to any one of <1> to <7> on a support having a hydrophilic surface.

<9> The lithographic printing plate precursor according to <8> which is a positive type.

<10> The lithographic printing plate precursor according to <8> or <9> which is a positive type lithographic printing plate precursor having an image recording layer formed of an underlayer and an upper layer on a support, wherein the photosensitive resin composition is contained in the underlayer and/or the upper layer.

<11> The lithographic printing plate precursor according to <10>, wherein the photosensitive resin composition is contained in the underlayer.

<12> A method for producing a lithographic printing plate comprising a step of image-exposing the lithographic printing plate precursor according to any one of <8> to <11> and a step of developing using an alkali aqueous solution with a pH of 8.5 to 13.5 in this order.

According to the present invention, it is possible to provide a photosensitive resin composition which enables production of a lithographic printing plate precursor having a non-image portion which has good solubility in an alkali aqueous solution and which enables production of a lithographic printing plate having excellent printing durability, excellent chemical resistance, and, in particular, excellent printing durability at the time of using a low quality print material, a lithographic printing plate precursor obtained by using the photosensitive resin composition, and a method for producing a lithographic printing plate.

DESCRIPTION OF THE PREFERRED EMBODIMENTS

Hereinafter, the content of the present invention will be described in detail. The description of the constitutive elements as described below is based on representative embodiments of the present invention, but the present invention is not limited to such embodiments.

Moreover, in the present specification, "to" which indicates a numerical range is used to show a range in which the numerical values described before and after "to" indicate the upper limit value and the lower limit value.

In addition, in the present invention, "a linking group represented by Formula A-1" is also simply referred to as "a linking group A-1".

Furthermore, in the present invention, preferable aspects in a combination are more preferable.

As a result of conducting extensive studies, the inventors of the present invention found that by including a linking group represented by Formula (A-1) and an infrared absorbent in a photosensitive resin composition, it is possible to provide a lithographic printing plate precursor having excellent printing durability, chemical resistance, and alkaline aqueous solution developability.

Although the action mechanism of the excellent effects due to containing the above materials is not clear, it is estimated as follows.

By studies by the present inventors, it was found that the film hardness of a resin is important to the printing durability in printing and the film hardness is significantly influenced by an interaction between binders. In particular, in poor quality print materials, the effect is significant, and in general acrylic resins or polyurethane resins, sufficient film hardness is less likely to be imparted. It is thought that this is because inorganic salt particles (calcium carbonate, kaolin, or the like) included in a print material (paper, ink, or the like) are eluted during printing, this polishes to the image portion of the printing plate, and as a result, abrasion is promoted. In contrast, the specific polymer compound used in the present invention has a plurality of linking groups having a very high interaction in the main chain, and thus, the specific polymer compound has excellent printing durability. It is estimated that this is caused by improvement of the film hardness of the resin and effects of suppressing abrasion of the image portion of the printing plate.

In addition, the specific polymer compound used in the present invention has a plurality of linking groups directly bonded to the urea bond in the main chain. Therefore, in the image forming layer, a phenol group is present near the aggregation portion of the urea group in the polymer, and the permeability of a developer is increased. By the above mechanism, it is assumed that a lithographic printing plate precursor having excellent developability is obtained.

By studies by the present inventors, it was found that it is effective for chemical resistance to increase the polarity of a binder polymer. The specific polymer compound used in the present invention has a urea bond having very high polarity in the main chain, and thus, the specific polymer compound has excellent chemical resistance. As a result, it is thought that, in the lithographic printing plate of the present invention, both strength and chemical resistance of an image portion can be achieved.

(Photosensitive Resin Composition)

The photosensitive resin composition of the present invention contains a polymer compound (hereinafter, also referred to as a "specific polymer compound") having a linking group represented by Formula A-1 in the main chain and an infrared absorbing material.

First, the specific polymer compound and the infrared absorbing material which are essential components of the photosensitive resin composition of the present invention will be described.

<Polymer Compound Having Linking Group A-1 in Main Chain>

The specific polymer compound used in the present invention has a linking group represented by Formula A-1 in the main chain. In the present invention, the "main chain" represents a relatively longest bonding chain in a molecule of a polymer compound configuring a resin, and the "side chain" represents a carbon chain which has been branched from the main chain.

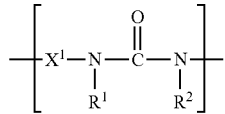
(A-1)

In Formula A-1, $R^1$ and $R^2$ each independently represent a hydrogen atom or a monovalent organic group, is preferably a hydrogen atom, an alkyl group, or an aryl group, more preferably a hydrogen atom, an alkyl group having 6 or less carbon atoms, or an aryl group having 6 to 10 carbon atoms, still more preferably a hydrogen atom or an alkyl group having 3 or less carbon atoms, and particularly preferably a hydrogen atom, and both $R^1$ and $R^2$ particularly preferably represent hydrogen atoms.

$X^1$ represents a linking group represented by any one of Formulas A-2 to A-6, is preferably a linking group represented by any one of A-2, A-4, and A-5, and more preferably a linking group represented by A-2.

In addition, the specific polymer compound may have a plurality of linking groups represented by A-1 in which the linking groups represented by $X^1$ are different, and among these, at least one is preferably a group including a linking group represented by A-2.

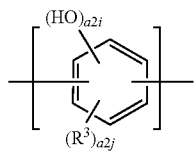
(A-2)

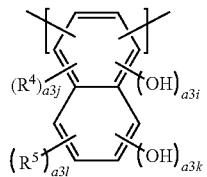
(A-3)

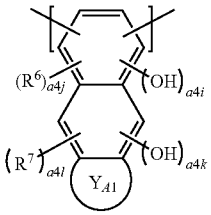
(A-4)

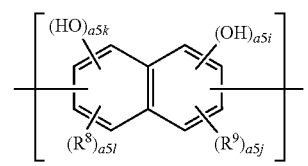
(A-5)

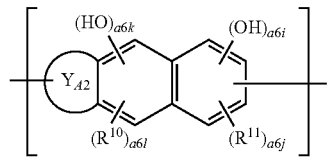
(A-6)

In Formulas A-2 to A-6, $R^3$ represents a halogen atom or a monovalent organic group, a2i represents an integer of 1 to 4, a2j represents an integer of 0 to 3, a2i+a2j is 1 to 4, $R^4$ and $R^5$ each independently represent a halogen atom or a monovalent organic group, a3i and a3j each independently represent an integer of 0 to 2, a3k and a3l each independently represent an integer of 0 to 4, a3i+a3k is 1 to 6, a3j+a3l is 0 to 6−(a3i+a3k), $R^6$ and $R^7$ each independently represent a halogen atom or a monovalent organic group, a4i and a4k each independently represent an integer of 0 to 2, a4i+a4k is 1 to 4, a4j and a4l each independently represent an integer of 0 to 2, a4j+a4l is 0 to 4−(a4i+a4k), $Y_{A1}$ represents an aromatic hydrocarbon ring or an aliphatic hydrocarbon ring, $R^8$ and $R^9$ each independently represent a halogen atom or a monovalent organic group, a5i and a5k each independently represent an integer of 0 to 3, a5i+a5k is 1 to 6, a5j and a5l each independently represent an integer of 0 to 3, a5j+a5l is 0 to 6−(a5i+a5k), $R^{10}$ and $R^{11}$ each independently represent a halogen atom or a monovalent organic group, a6k represents an integer of 0 to 2, a6i represents an integer of 0 to 3, a6i+a6k is 1 to 5, a6l represents an integer of 0 to 2, a6j represents an integer of 0 to 3, and a6l+a6j is 0 to 5−(a6i+a6k). $Y_{A2}$ represents an aromatic hydrocarbon ring or an aliphatic hydrocarbon ring.

$R^3$ represents a halogen atom or a monovalent organic group, preferably a halogen atom, an alkyl group, or an aryl group, more preferably a halogen atom, an alkyl group having 6 or less carbon atoms, or an aryl group having 6 to 10 carbon atoms, and still more preferably a halogen atom or an alkyl group having 3 or less carbon atoms.

a2i represents an integer of 1 to 4, preferably 1 or 2, and more preferably 1.

a2i+a2j is 1 to 4, a2j represents an integer of 0 to 3, preferably 0 or 1, and more preferably 0.

In addition, in Formula A-2 representing a divalent linking group, there are binding sites with other structures at two positions, and with respect to one binding site present on the benzene ring described in Formula A-2, the other binding site is preferably present at the para position or the meta position.

The hydroxy group in Formula A-2 is preferably bonded to the ortho position of the binding sites with other structures at two positions.

$R^4$ and $R^5$ each independently represent a halogen atom or a monovalent organic group, is preferably a halogen atom, an alkyl group, or an aryl group, more preferably a halogen atom, an alkyl group having 6 or less carbon atoms, or an aryl group having 6 to 10 carbon atoms, and still more preferably a halogen atom or an alkyl group having 3 or less carbon atoms.

a3i and a3j each independently represent an integer of 0 to 2, and a3k and a3l each independently represent an integer of 0 to 4.

a3i+a3k is 1 to 6, and preferably 1 or 2. In a case where a3i+a3k is 2, it is preferable that a3i represents 1, and a3k represents 1, respectively.

a3j+a3l is 0 to 6−(a3i+a3k), and preferably 0.

In addition, there are binding sites with other structures at two positions in Formula A-3 representing a divalent linking group, and both $R^4$ and $R^5$ are preferably bonded to the α-position carbon atoms of the naphthalene ring described in Formula A-3.

The hydroxy groups in Formula A-3 are preferably bonded to the α-position carbon atoms of the naphthalene ring described in Formula A-3.

$R^6$ and $R^7$ each independently represent a halogen atom or a monovalent organic group, is preferably a halogen atom, an alkyl group, or an aryl group, more preferably a halogen atom, an alkyl group having 6 or less carbon atoms, or an aryl group having 6 to 10 carbon atoms, and still more preferably a halogen atom or an alkyl group having 3 or less carbon atoms.

a4i and a4k each independently represent an integer of 0 to 2.

a4i+a4k is 1 to 4, and preferably 1 or 2. In a case where a4i+a4k is 2, it is preferable that a4i represents 0, and a4k represents 2, respectively.

a4j and a4l each independently represent an integer of 0 to 2.

a4j+a4l is 0 to 4−(a4i+a4k), and preferably 0.

$Y_{A1}$ is preferably an aromatic hydrocarbon ring or an aliphatic hydrocarbon ring, more preferably an aromatic hydrocarbon ring, and more preferably a benzene ring.

In a case where $Y_{A1}$ represents a benzene ring, that is, Formula A-4 includes an anthracene ring structure, the hydroxy groups in Formula A-4 are preferably bonded to the 9-position and/or the 10-position carbon atoms of the anthracene ring.

In addition, there are binding sites with other structures at two positions in Formula A-4 representing a divalent linking group, and $R^6$ and $R^7$ each are preferably bonded to the 1-position and the 4-position carbon atom of the anthracene ring.

$R^8$ and $R^9$ each independently represent a halogen atom or a monovalent organic group, is preferably a halogen atom, an alkyl group, or an aryl group, more preferably a halogen atom, an alkyl group having 6 or less carbon atoms, or an aryl group having 6 to 10 carbon atoms, and still more preferably a halogen atom or an alkyl group having 3 or less carbon atoms.

a5i and a5k each independently represent an integer of 0 to 3.

a5i+a5k is 1 to 6, and preferably 1 or 2.

a5j and a5l each independently represent an integer of 0 to 3, a5j+a5l is 0 to 6−(a5i+a5k), and preferably 0.

In addition, there are binding sites with other structures at two positions in Formula A-5 representing a divalent linking group, and both $R^8$ and $R^9$ are preferably bonded to the α-position carbon atoms of the naphthalene ring described in Formula A-5, and more preferably bonded to the 1-position carbon atom and the 5-position carbon atom of the naphthalene ring, respectively.

The hydroxy groups in Formula A-5 are preferably bonded to the α-position carbon atoms of the naphthalene ring described in Formula A-5.

$R^{10}$ and $R^{11}$ each independently represent a halogen atom or a monovalent organic group, preferably an alkyl group, or an aryl group, more preferably a halogen atom, an alkyl group having 6 or less carbon atoms, or an aryl group having 6 to 10 carbon atoms, and still more preferably a halogen atom or an alkyl group having 3 or less carbon atoms.

a6k represents an integer of 0 to 2, and a6i represents an integer of 0 to 3.

a6i+a6k represents 1 to 5, and preferably 1 or 2.

a6l represents an integer of 0 to 2, and a6j represents an integer of 0 to 3.

a6l+a6j is 0 to 5−(a6i+a6k), and preferably 0.

$Y_{A2}$ is preferably an aromatic hydrocarbon ring or an aliphatic hydrocarbon ring, more preferably an aromatic hydrocarbon ring, and more preferably a benzene ring.

In a case where $Y_{A2}$ represents a benzene ring, that is, Formula A-6 includes an anthracene ring structure, the hydroxy groups in Formula A-6 are preferably bonded to the 9-position and/or the 10-position carbon atoms of the anthracene ring.

In addition, there are binding sites with other structures at two positions in Formula A-6 representing a divalent linking group, and both $R^{10}$ and $R^{11}$ are preferably bonded to the 1-position and the 8-position carbon atoms of the anthracene ring, respectively.

[Linking Group A-7]

The specific polymer compound preferably includes a linking group represented by the following Formula A-7 in the main chain.

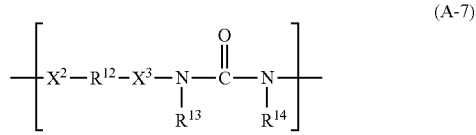

In Formula A-7, $R^{12}$ represents a single bond or a divalent linking group, $R^{13}$ and $R^{14}$ each independently represent a hydrogen atom or a monovalent organic group, and $X^2$ and $X^3$ each independently represent a linking group represented by any one of Formulas A-2 to A-6.

$R^{12}$ preferably represents a single bond or a divalent linking group, is preferably a single bond, an alkylene group having 6 or less carbon atoms, or a sulfonyl group, more preferably a single bond or an alkylene group having 5 or less carbon atoms, still more preferably a single bond or a methylene group, and particularly preferably a single bond. The alkylene group represented by $R^{12}$ may have any one of a linear chain shape, a branched chain shape, and a cyclic shape. In addition, the alkylene group represented by $R^{12}$ may be substituted, and preferable examples of the substituent include an alkyl group having 4 or less carbon atoms, an aryl group, and a halogen atom. In addition, the aryl group may be further substituted, and examples of a preferable substituent include a hydroxy group.

$R^{13}$ and $R^{14}$ each independently represent a hydrogen atom or a monovalent organic group, preferably an alkyl group or an aryl group, more preferably an alkyl group having 6 or less carbon atoms or an aryl group having 6 to 10 carbon atoms, and still more preferably an alkyl group having 3 or less carbon atoms.

$X^2$ and $X^3$ each independently represent a linking group represented by any one of Formulas A-2 to A-6, and at least one is preferably a linking group represented by Formula A-2, and both are more preferably linking groups represented by Formula A-2.

The linking group represented by Formula A-7 is preferably a linking group represented by Formula A-8.

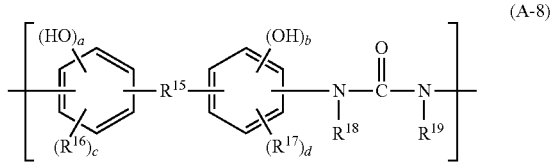

In Formula A-8, $R^{15}$ represents a single bond or a divalent linking group, $R^{16}$ and $R^{17}$ each independently represent a halogen atom or a monovalent organic group, $R^{18}$ and $R^{19}$ each independently represent a hydrogen atom or a monovalent organic group, a, b, c and d each independently represent an integer of 0 to 4, a+b is 1 to 8, and c+d is 0 to 8−(a+b).

$R^{15}$ preferably represents a single bond or a divalent linking group, is preferably a single bond, an alkylene group having 6 or less carbon atoms, or a sulfonyl group, more preferably a single bond or an alkylene group having 5 or less carbon atoms, still more preferably a single bond or a methylene group, and particularly preferably a single bond. The alkylene group represented by $R^{12}$ may have any one of a linear chain shape, a branched chain shape, and a cyclic shape. In addition, the alkylene group represented by $R^{12}$ may be substituted, and preferable examples of the substituent include an alkyl group having 4 or less carbon atoms, an aryl group, and a halogen atom. In addition, the aryl group may be further substituted, and examples of a preferable substituent include a hydroxy group.

$R^{16}$ and $R^{17}$ each independently represent a halogen atom or a monovalent organic group, is preferably a halogen atom, an alkyl group, or an aryl group, more preferably a halogen atom, an alkyl group having 6 or less carbon atoms, or an aryl group having 6 to 10 carbon atoms, and still more preferably a halogen atom or an alkyl group having 3 or less carbon atoms.

$R^{18}$ and $R^{19}$ each independently represents a hydrogen atom or a monovalent organic group, preferably an alkyl group or an aryl group, more preferably an alkyl group having 6 or less carbon atoms or an aryl group having 6 to 10 carbon atoms, and still more preferably an alkyl group having 3 or less carbon atoms.

a, b, c, and d each independently represent an integer of 0 to 4, a+b is 1 to 8, and c+d is 0 to 8−(a+b).

a and b each independently preferably represent 1 or 2, more preferably, both are 1 or 2, and still more preferably, both are 1.

c and d each are independently preferably 0 or 1, and both are more preferably 0.

[Linking Group a-1]

In addition, the linking group represented by Formula A-1 is preferably a linking group represented by the following Formula a-1.

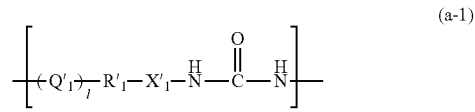

In Formula a-1, $R'_1$ represents a single bond or a divalent linking group, $Q'_1$ represents a divalent linking group, l represents an integer of 0 or greater, $X'_1$ represents a divalent linking group and has the same meaning as $X^1$ in Formula A-1, and the preferable range thereof is also the same.

In Formula a-1, $R'_1$ is preferably a single bond or an alkylene group having 6 or less carbon atoms, more preferably a single bond or an alkylene group having 5 or less carbon atoms, still more preferably a single bond or a methylene group, and particularly preferably a single bond. The alkylene group represented by $R'_1$ may have any one of a linear chain shape, a branched chain shape, and a cyclic shape. In addition, the alkylene group represented by $R'_1$ may be substituted, and preferable examples of the substituent include an alkyl group having 1 to 4 carbon atoms, an aryl group, and a halogen atom.

In a case where $X'_1$ is a linking group represented by Formula A-2, $Q'_1$ represents a divalent linking group, is preferably a divalent linking group including a urea bond, more preferably a divalent linking group including a urea bond and a phenylene group having a hydroxy group, still more preferably a divalent linking group including a linking group to which a urea bond and a phenylene group having a hydroxy group are directly bonded, and particularly preferably a divalent linking group to which a urea bond and a phenylene group having a hydroxy group are directly bonded. In addition, in any of the above linking groups, the phenylene group is preferably bonded to $R_1$.

In a case where $X'_1$ is a linking group represented by any of Formulas A-3 to A-6, $Q'_1$ represents a divalent linking group, preferably a divalent linking group including a urea bond, and more preferably a urea bond.

l represents an integer of 0 or greater, preferably 0 or 1, and more preferably 1.

[Linking Group a-2]

In addition, the linking group a-1 is preferably a linking group represented by the following Formula a-2

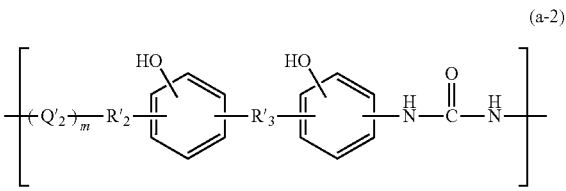

In Formula a-2, $R'_2$ and $R'_3$ each independently represent a single bond or a divalent linking group, $Q'_2$ represents a divalent linking group, and m represents an integer of 0 or greater.

In Formula a-2, R'$_2$ represents a divalent linking group, is preferably a divalent linking group including a urea bond, more preferably a urea bond.

Q'$_2$ represents a single bond or a divalent linking group. Q'$_2$ is preferably a single bond.

m is preferably an integer of 3 or less, more preferably an integer of 1 or less, and still more preferably 0.

In Formula a-2, R'$_3$ is preferably a single bond, an alkylene group having 6 or less carbon atoms, a sulfonyl group, more preferably a single bond or an alkylene group having 5 or less carbon atoms, still more preferably a single bond or a methylene group, and particularly preferably a single bond. The alkylene group represented by R'$_3$ may have any one of a linear chain shape, a branched chain shape, and a cyclic shape. In addition, the alkylene group represented by R'$_3$ may be substituted, and preferable examples of the substituent include an alkyl group having 4 or less carbon atoms, an aryl group, and a halogen atom. In addition, the aryl group may be further substituted, and examples of a preferable substituent include a hydroxy group.

In addition, in a case where R'$_3$ is a single bond, the urea bond bonded to the benzene ring which is not bonded to R'$_2$ in Formula a-2 is preferably bonded to the para position of R'$_3$. In addition, in this case, the hydroxy group in Formula a-2 is preferably bonded to the ortho position of the urea bond.

In a case where R'$_2$ represents a urea bond and R'$_3$ represents a single bond, the two urea bonds bonded to the benzene ring in Formula a-2 are preferably bonded to the para position of R'$_3$. In addition, in this case, the hydroxy group in Formula a-2 is preferably bonded to the ortho position of the urea bond.

In a case where R'$_3$ is an alkylene group, the urea bond bonded to the benzene ring which is not bonded to R'$_2$ in Formula a-2 is preferably bonded to the meta position of R'$_3$. In addition, in this case, the hydroxy group in Formula a-2 is preferably bonded to the ortho position of the urea bond.

In a case where R'$_2$ represents a urea bond and R'$_3$ represents an alkylene group, the two urea bonds bonded to the benzene ring in Formula a-2 are preferably bonded to the meta position of R'$_3$. In addition, in this case, the hydroxy group in Formula a-2 is preferably bonded to the ortho position of the urea bond.

On the benzene rings in Formula a-2, by the hydroxy group being bonded to the ortho position of the urea bond, a printing plate precursor having excellent developability is obtained.

[Linking Group a-2']

In addition, the linking group a-1 is preferably a linking group represented by the following Formula a-2'.

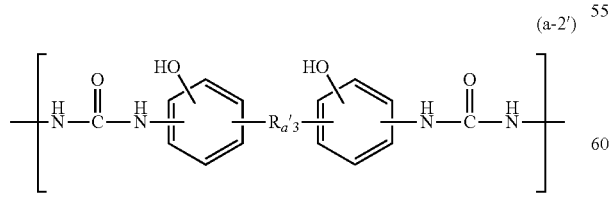

(a-2')

In Formula a-2', R$_{a'3}$ represents a divalent linking group.

Since description of R$_{a'3}$ in Formula a-2' is the same as that of R'$_3$ in Formula A-2, the description of R$_{a'3}$ will not be repeated.

In addition, in a case where R$_{a'3}$ is a single bond, the two urea bonds bonded to the two benzene rings in Formula a-2' are preferably bonded to the para position of R$_{a'3}$. In addition, in this case, the hydroxy group in Formula a-2' is preferably bonded to the ortho position of the urea bond.

In a case where R$_{a'3}$ is an alkylene group, the two urea bonds bonded to the two benzene rings in Formula a-2' are preferably bonded to the meta position of R$_{a'3}$. In addition, in this case, the hydroxy group in Formula a-2' is preferably bonded to the ortho position of the urea bond.

On the benzene rings in Formula a-2', by the hydroxy group being bonded to the ortho position of the urea bond, a printing plate precursor having excellent developability is obtained.

In addition, the linking group A-1 in the specific polymer compound used in the present invention is preferably a linking group obtained by reacting a diisocyanate compound with a diamine compound described below.

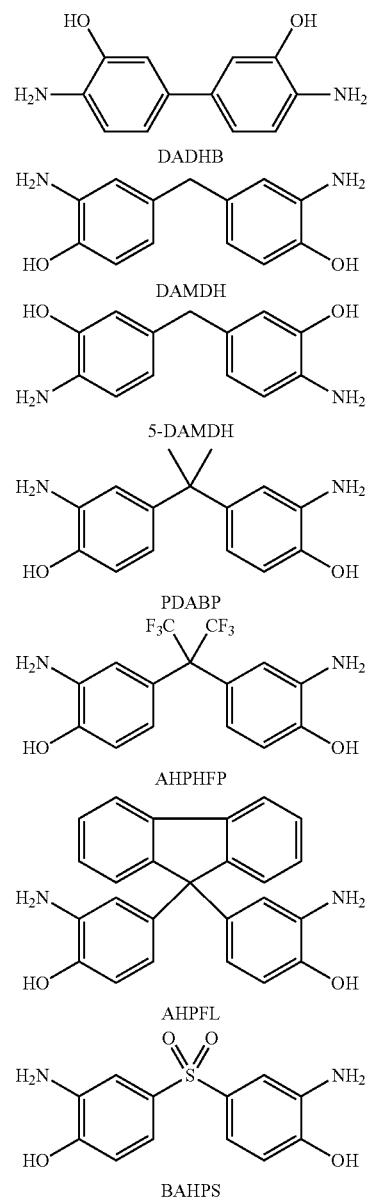

DADHB

DAMDH

5-DAMDH

PDABP

AHPHFP

AHPFL

BAHPS

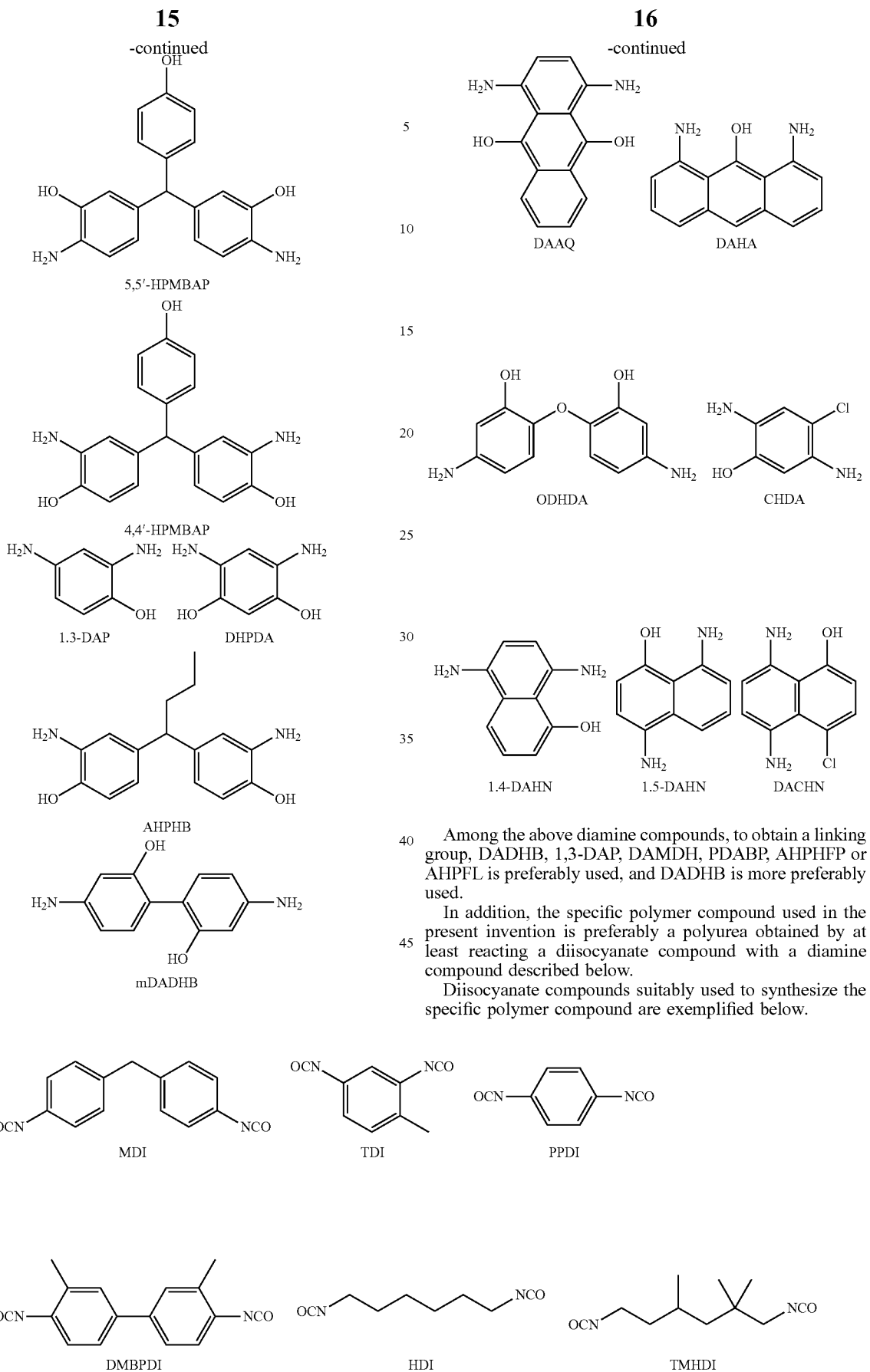

Among the above diamine compounds, to obtain a linking group, DADHB, 1,3-DAP, DAMDH, PDABP, AHPHFP or AHPFL is preferably used, and DADHB is more preferably used.

In addition, the specific polymer compound used in the present invention is preferably a polyurea obtained by at least reacting a diisocyanate compound with a diamine compound described below.

Diisocyanate compounds suitably used to synthesize the specific polymer compound are exemplified below.

-continued
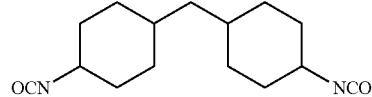
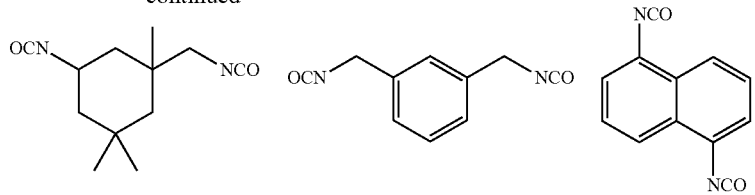
H12 MDI IPDI XDI NDI
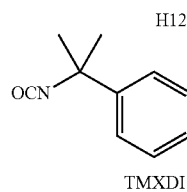
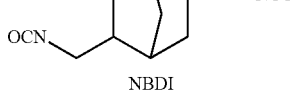
TMXDI H6 XDI NBDI
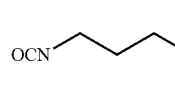
3HUDI
Other diamine compounds suitably used to synthesize the specific polymer compound are exemplified below.
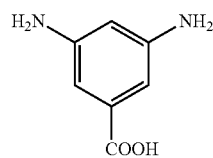 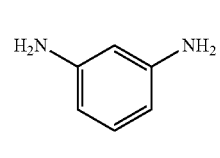 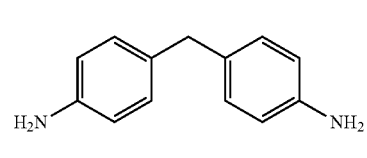 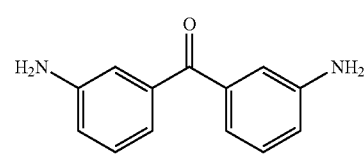
DABA 1.3-DAB DDM 2.3,3-DADPM
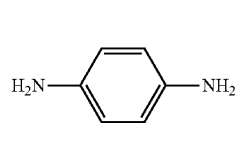 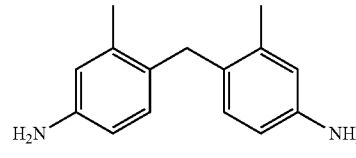 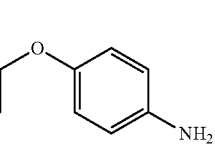
1.4-DAB m-DDM DDE
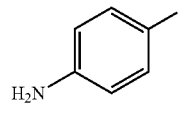 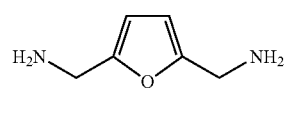
DEGDAPE FDMA
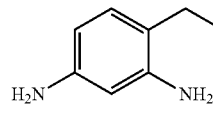 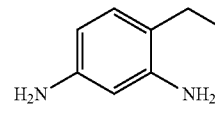
2,4-DAEA 2,4-DAEB
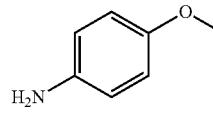 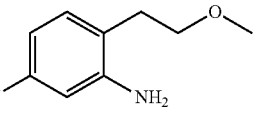 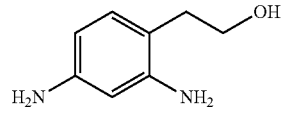
TPE-R 2,4-DAPEM 2.4-DAPE
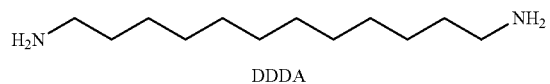 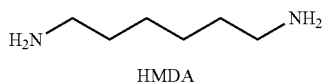
DDDA HMDA -continued

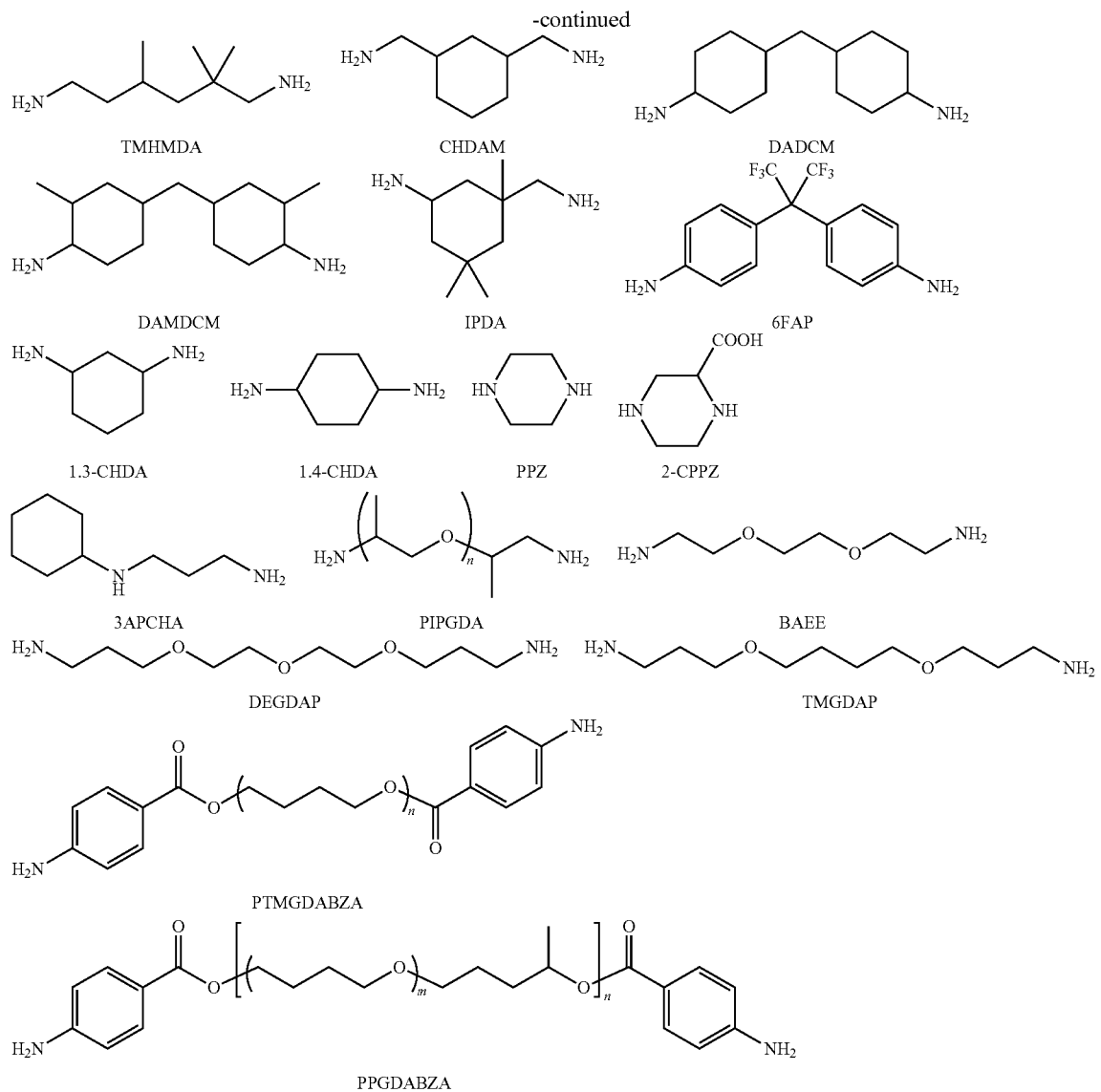

Moreover, in the formula, m and n each independently represent an integer of 1 to 100.

A polymer compound having the linking group A-1 in the main chain is produced, for example, by sequential polymerization of a compound having two or more isocyanate groups and a compound having two or more amino groups.

The specific polymer compound used in the present invention is preferably produced by a sequential polymerization reaction of a diisocyanate compound and a diamine compound.

The portion excluding the urea bond in the linking group A-1 is preferably included in the diamine compound.

The diisocyanate compound is preferably an aliphatic or aromatic hydrocarbon having 20 or less carbon atoms which has two isocyanate groups, more preferably an alkylene diisocyanate, and still more preferably hexamethylene diisocyanate.

In addition, it is also possible to allow to react after a diamine compound is further added.

Preferable specific examples of the polymer compound having the linking group A-1 in the main chain used in the present invention are shown in the following Tables 1 and 2. Exemplified Compounds PU-1 to PU-29 each mean a polymer compound obtained by reacting a diamine compound with a diisocyanate compound described in Tables 1 and 2 in a ratio (molar ratio) described in Tables 1 and 2.

In addition, the weight average molecular weight (Mw) of a polymer is a value measured by a GPC method.

The polymer compound containing the linking group A-1 used in the present invention is not limited to the specific examples described in Tables 1 and 2.

TABLE 1

| | Diisocyanate compound (molar ratio) | | Diamine compound (molar ratio) | | Mw (x 10,000) |
|---|---|---|---|---|---|
| PU-1 | HDI | — | DADHB | — | 5.6 |
| | 50 | — | 50 | — | |
| PU-2 | TMHDI | — | DADHB | — | 6.2 |
| | 50 | — | 50 | — | |
| PU-3 | H6 XDI | — | DADHB | — | 5.8 |
| | 50 | — | 50 | — | |

TABLE 1-continued

|  | Diisocyanate compound (molar ratio) | | Diamine compound (molar ratio) | | Mw (× 10,000) |
| --- | --- | --- | --- | --- | --- |
| PU-4 | XDI 50 | — | DADHB 50 | — | 5.2 |
| PU-5 | XDI 25 | TMHDI 25 | DADHB 50 | — | 5.2 |
| PU-6 | XDI 25 | HDI 25 | DADHB 50 | — | 5.1 |
| PU-7 | XDI 25 | H6 XDI 25 | DADHB 50 | — | 5.3 |
| PU-8 | H6 XDI 25 | TMHD1 25 | DADHB 50 | — | 6.1 |
| PU-9 | HDI 50 | — | DADHB 25 | AHPHFP 25 | 6.2 |
| PU-10 | HDI 50 | — | DADHB 45 | AHPFL 5 | 5.8 |
| PU-11 | HDI 25 | MDI 25 | 1,3DAP 50 | — | 5.4 |
| PU-12 | HDI 25 | XDI 25 | 1,3DAP 50 | — | 6.2 |
| PU-13 | HDI 50 | — | PDABP 50 | — | 5.1 |
| PU-14 | HDI 50 | — | DAMDH 50 | — | 5.4 |
| PU-15 | HDI 50 | — | DADHB 40 | DABA 10 | 5.0 |

TABLE 2

|  | Diisocyanate compound (molar ratio) | | Diamine compound (molar ratio) | | Mw (× 10,000) |
| --- | --- | --- | --- | --- | --- |
| PU-16 | HDI 50 | — | 1,3DAP 40 | 2,2-DAEA 10 | 5.2 |
| PU-17 | HDI 50 | — | DAAQ 50 | — | 5.3 |
| PU-18 | HDI 50 | — | DADHB 45 | BAEE 5 | 5.5 |
| PU-19 | HDI 50 | — | DADHB 45 | DEGDAP 5 | 4.8 |
| PU-20 | HDI 50 | — | DADHB 45 | TMGDAP 5 | 4.9 |
| PU-21 | HDI 45 | 3HUDI 5 | DADHB 50 | — | 5.1 |
| PU-22 | HDI 50 | — | DADHB 45 | PIPGDA 5 | 4.8 |
| PU-23 | HDI 50 | — | 1,5-DAHN 50 | — | 4.5 |
| PU-24 | HDI 50 | — | DAHA 50 | — | 4.7 |
| PU-25 | HDI 50 | — | 1,4-DAHN 50 | — | 5.0 |
| PU-26 | HDI 50 | — | mDADHB 50 | — | 5.8 |
| PU-27 | H6 XDI 50 | — | ODHDA 50 | — | 5.2 |
| PU-28 | H6 XDI 50 | — | DADHB 40 | CHDA 10 | 5.4 |
| PU-29 | H6 XDI 50 | — | DADHB 40 | DACHN 10 | 5.1 |

Among these, as the polymer compound having the linking group A-1, PU-1, PU-4, PU-5, or PU-7 is preferable.

As one example of the specific polymer compound used in the present invention, the structural formula of PU-1 in Table 1 is shown below. Moreover, the number at the bottom right of the parenthesis represents a molar ratio.

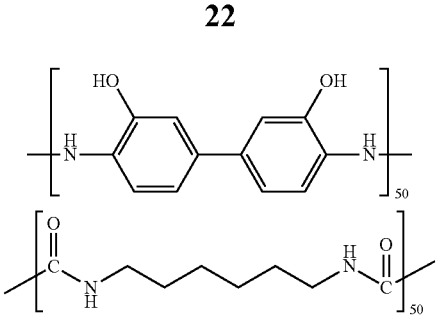

The content of the linking group A-1 in the polymer compound having the linking group A-1 is preferably 10% by mass to 80% by mass, more preferably 20% by mass to 70% by mass, and still more preferably 40% by mass to 70% by mass.

If the content of the linking group A-1 is within the above range, it is possible to obtain a resin composition having excellent chemical resistance.

[Linking Group A-9]

The polymer compound having the linking group A-1 in the main chain, used in the present invention preferably further has a linking group represented by Formula A-9 in the main chain.

(A-9)

In Formula A-9, $R^{49}$ represents a hydrogen atom or a monovalent organic group, is preferably a hydrogen atom, an alkyl group, or an aryl group, more preferably a hydrogen atom an alkyl group having 6 or less carbon atoms, or an aryl group having 6 to 10 carbon atoms, still more preferably a hydrogen atom or an alkyl group having 3 or less carbon atoms, and particularly preferably a hydrogen atom.

[Linking Group a-3]

The polymer compound having the linking group A-1 in the main chain, used in the present invention preferably further has a linking group (constitutional unit) represented by Formula a-3 in the main chain.

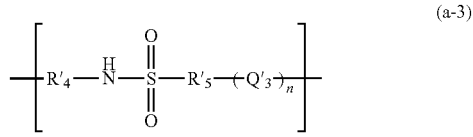

(a-3)

In Formula a-3, $R'_4$ and $R'_5$ each independently represent a divalent linking group, $Q'_3$ represents a divalent group including a sulfonamide group, and n represents an integer of 0 or greater.

In Formula a-3, $R'_4$ is preferably an alkylene group or an arylene group, more preferably an alkylene group having 4 or less carbon atoms or an arylene group having 6 to 10 carbon atoms, and still more preferably a phenylene group.

In addition, $R'_5$ is preferably an arylene group, more preferably an arylene group having 6 to 10 carbon atoms, and still more preferably a phenylene group.

Both R'₄ and R'₅ are preferably arylene groups, and more preferably phenylene groups. The alkylene group or the arylene group represented by R'₄ or R'₅ may be substituted, and the substituent is preferably an alkyl group having 6 or less carbon atoms, an alkoxy group having 6 or less carbon atoms, or a halogen atom, and more preferably an alkyl group having 4 or less carbon atoms.

Q'₃ represents a divalent group including a sulfonamide group, and is preferably a structure represented by the following Formula Q-1.

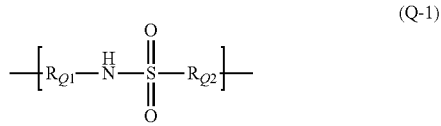

(Q-1)

In Formula Q-1, $R_{Q1}$ and $R_{Q2}$ each independently represent a single bond or a divalent linking group.

In Formula Q-1, $R_{Q1}$ is preferably a single bond, an alkylene group, or an arylene group, more preferably an alkylene group or an arylene group, still more preferably an alkylene group having 4 or less carbon atoms or an arylene group having 6 to 10 carbon atoms, and particularly preferably a phenylene group. The arylene group or the alkylene group represented by $R_{Q1}$ may be substituted, and the substituent is preferably an alkyl group having 6 or less carbon atoms, an alkoxy group having 6 or less carbon atoms, or a halogen atom, and more preferably an alkyl group having 4 or less carbon atoms.

In Formula Q-1, $R_{Q2}$ is preferably a single bond, an alkylene group, an arylene group, a carbonyl group, an ether bond, an amide bond, a sulfonyl group, or a group obtained by combing these linking groups, and more preferably a single bond, an arylene group, or a group obtained by combining an arylene group with a sulfonyl bond or an ether bond.

In a case where $R_{Q2}$ represents a group obtained by combining an arylene group with a sulfonyl bond or an ether bond, the arylene group is preferably bonded directly to the sulfur atom of the sulfonamide group in Formula Q-1.

The alkylene group represented by $R_{Q2}$ may have any one of a linear chain shape, a branched chain shape, and a cyclic shape. In addition, the alkylene group is preferably an alkylene group having 6 or less carbon atoms, and the alkylene group represented by $R_{Q2}$ may be further substituted with a halogen atom an aryl group, or an alkoxy group.

In Formula a-3, $R_{Q1}$ in the structure represented by Formula Q-1 may be bonded to R'₅ in Formula a-3, and $R_{Q2}$ may be bonded to R'₅, but $R_{Q2}$ is preferably bonded to R'₅.

n represents an integer of 0 or greater, preferably 0 or 1, and more preferably 1.

In addition, the linking group a-3 is preferably a linking group represented by the following Formula a-4.

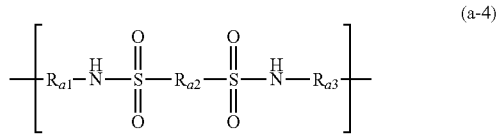

(a-4)

In Formula a-4, $R_{a1}$, $R_{a2}$, and $R_{a3}$ each independently represent a divalent linking group.

In Formula a-4, $R_{a1}$ and $R_{a3}$ each are independently preferably an alkylene group or an arylene group, more preferably an alkylene group having 4 or less carbon atoms or an arylene group having 6 to 10 carbon atoms, and still more preferably a phenylene group.

Both $R_{a1}$ and $R_{a3}$ are preferably arylene groups, and more preferably phenylene groups.

The arylene group or the alkylene group represented by $R_{a1}$ or $R_{a3}$ may be substituted, and the substituent is preferably an alkyl group having 6 or less carbon atoms, an alkoxy group having 6 or less carbon atoms, or a halogen atom, and more preferably an alkyl group having 4 or less carbon atoms.

In Formula a-4, $R_{a2}$ represents a divalent linking group, and is preferably an arylene group or a linking group represented by —$R_{a4}$—O—$R_{a5}$— or —$R_{a4}$—SO₂—$R_{a5}$—, more preferably an arylene group, and still more preferably a phenylene group. $R_{a4}$ and $R_{a5}$ each independently represent an arylene group, and is preferably a phenylene group.

The arylene group or the phenylene group represented by $R_{a2}$ may be substituted, and the substituent is preferably an alkyl group having 6 or less carbon atoms, an alkoxy group having 6 or less carbon atoms, or a halogen atom, and more preferably an alkyl group having 4 or less carbon atoms.

In addition, the linking group a-3 in the specific polymer compound used in the present invention is preferably a linking group derived from a structure obtained by removing two amino groups from the following exemplified compounds.

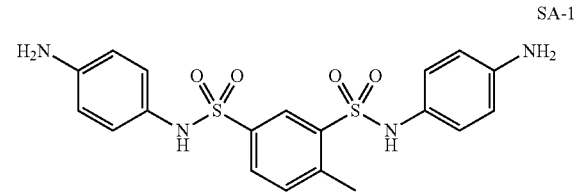

SA-1

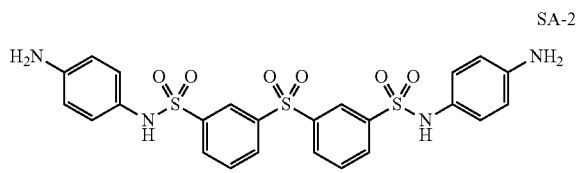

SA-2

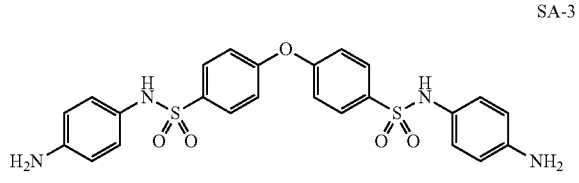

SA-3

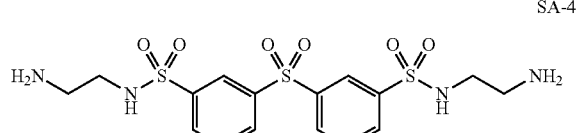

SA-4

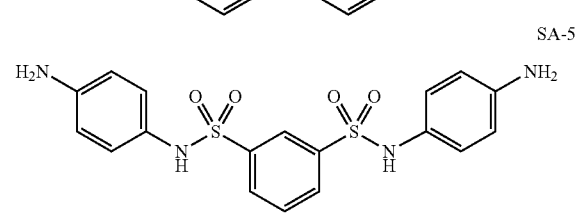

SA-5

-continued

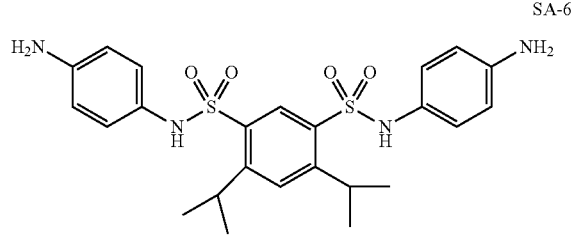
SA-6

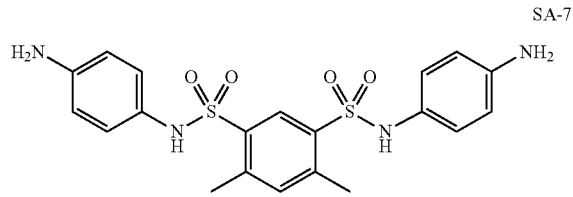
SA-7

[Linking Groups B-1 and B-2]

The specific polymer compound preferably has a linking group represented by the following Formula B-1 or B-2 in the main chain.

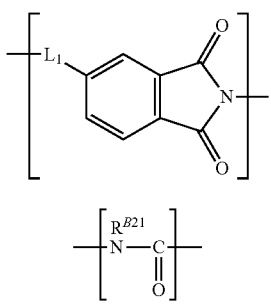
(B-1)

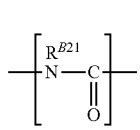
(B-2)

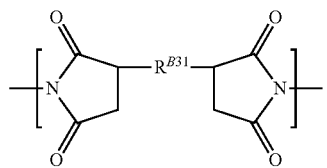
(B-3)

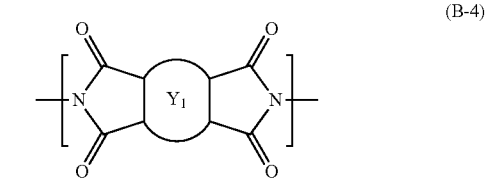
(B-4)

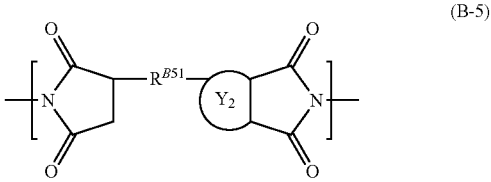
(B-5)

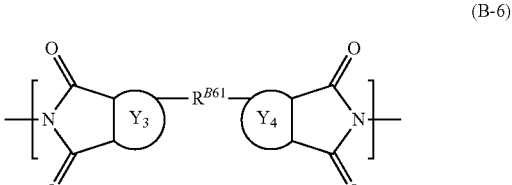
(B-6)

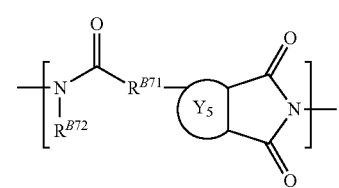
(B-7)

In Formula B-1 and B-2, $L_1$ represents a single bond or a divalent linking group, and $R^{B21}$ represents a hydrogen atom or a monovalent organic group.

In Formula B-1, $L_1$ preferably represents a single bond, an alkylene group, a carbonyl group, an ether bond, an amide bond, an arylene group, a sulfonyl group, or a group obtained by combing these linking groups.

In addition, the benzene ring in Formula B-1 may be substituted, and examples of a preferable substituent include an alkyl group having 1 to 6 carbon atoms, an alkoxy group having 1 to 6 carbon atoms, an aryl group, and a halogen atom.

In Formula B-2, $R^{B21}$ represents a hydrogen atom or a monovalent organic group, is preferably a hydrogen atom, an alkyl group, or an aryl group, more preferably a hydrogen atom, an alkyl group having 6 or less carbon atoms, or an aryl group having 6 to 10 carbon atoms, still more preferably a hydrogen atom or an alkyl group having 3 or less carbon atoms, and particularly preferably a hydrogen atom.

The linking group represented by Formula B-1 or B-2 is preferably included in the main chain of the polymer compound of the present invention as a part of linking groups B-3 to B-7 described below.

[Linking Groups B-3 to B-7]

The specific polymer compound used in the present invention preferably has at least one selected from the group consisting of the linking groups (constitutional units) represented by each of the following Formulas B-3 to B-7 in the main chain.

In Formulas B-3 to B-7, $R^{B31}$, $R^{B51}$, $R^{B61}$, and $R^{B71}$ each independently represent a single bond or a divalent linking group, $R^{B72}$ represents a hydrogen atom or a monovalent organic group, and $Y_1$ to $Y_5$ each independently represent an aromatic hydrocarbon ring or an aliphatic hydrocarbon ring.

In Formula B-3, $R^{B31}$ preferably represents a single bond, an alkylene group, or an arylene group, and more preferably a single bond.

In a case where $R^{B31}$ represents an alkylene group, the alkylene group may have any one of a linear chain shape, a branched chain shape, and a cyclic shape.

The linear or branched alkylene group preferably has 1 to 20 carbon atoms, more preferably 1 to 14 carbon atoms, and still more preferably 1 to 10 carbon atoms. The alkylene group may have a substituent, and examples of a preferable substituent include a halogen atom, an aryl group, and an alkoxy group.

In a case where $R^{B31}$ represents an arylene group, the arylene group preferably has 6 to 20 carbon atoms, and more preferably has 6 to 16 carbon atoms. The arylene group may have a substituent, and examples of a preferable substituent include an alkyl group having 1 to 6 carbon atoms, an alkoxy group having 1 to 6 carbon atoms, and a halogen atom.

In Formula B-4, $Y_1$ is preferably an aromatic hydrocarbon ring, and more preferably a benzene ring.

In addition, in a case where $Y_1$ represents an aliphatic hydrocarbon ring, the aliphatic hydrocarbon ring is preferably an aliphatic hydrocarbon ring having 4 to 20 carbon atoms, and more preferably an aliphatic hydrocarbon ring having 4 to 10 carbon atoms.

$Y_1$ may be substituted, and examples of a preferable substituent include an alkyl group having 1 to 6 carbon atoms, an alkoxy group having 1 to 6 carbon atoms, and a halogen atom.

In Formula B-5, $Y_2$ is preferably an aromatic hydrocarbon ring, and more preferably a benzene ring.

In addition, in a case where $Y_2$ represents an aliphatic hydrocarbon ring, the aliphatic hydrocarbon ring is preferably an aliphatic hydrocarbon ring having 4 to 20 carbon atoms, and more preferably an aliphatic hydrocarbon ring having 4 to 12 carbon atoms.

$Y_2$ may be substituted, and examples of a preferable substituent include an alkyl group having 1 to 6 carbon atoms, an alkoxy group having 1 to 6 carbon atoms, a halogen atom, and an aryl group.

In Formula B-5, $R^{B51}$ preferably represents a single bond, an alkylene group, or an arylene group, and more preferably a single bond.

In a case where $R^{B51}$ represents an alkylene group, the alkylene group may have any one of a linear chain shape, a branched chain shape, and a cyclic shape.

The linear or branched alkylene group preferably has 1 to 20 carbon atoms, more preferably 1 to 14 carbon atoms, and still more preferably 1 to 10 carbon atoms. The alkylene group may have a substituent, and examples of a preferable substituent include a halogen atom, an aryl group, and an alkoxy group.

In Formula B-6, both $Y_3$ and $Y_4$ are preferably aromatic hydrocarbon rings, and more preferably benzene rings.

$Y_3$ and $Y_4$ may be substituted, and examples of a preferable substituent include a hydrocarbon group having 1 to 6 carbon atoms, a halogen atom, and an alkoxy group having 1 to 6 carbon atoms.

In Formula B-6, $R^{B61}$ preferably represents a single bond, an alkylene group, a carbonyl group, an ether bond, an amide bond, an arylene group, a sulfonyl group, or a group obtained by combing these linking groups, and more preferably a single bond.

The alkylene group may have any one of a linear chain shape, a branched chain shape, and a cyclic shape. In addition, the alkylene group is preferably an alkylene group having 6 or less carbon atoms, and the alkylene group may be further substituted with a halogen atom, an aryl group, or an alkoxy group.

In addition, in a case where at least one of $Y_3$ or $Y_4$ represents an aliphatic hydrocarbon ring, $R^{B61}$ preferably includes an arylene group.

In Formula B-7, $Y_5$ is preferably an aromatic hydrocarbon ring, and more preferably a benzene ring.

$Y_5$ may be substituted, and examples of a preferable substituent include a hydrocarbon group having 1 to 12 carbon atoms, a halogen atom, and an alkoxy group having 1 to 12 carbon atoms.

In Formula B-7, $R^{B71}$ preferably represents a single bond, an alkylene group, or an arylene group, and more preferably a single bond.

$R^{B72}$ represents a hydrogen atom or a monovalent organic group, is preferably a hydrogen atom, an alkyl group, or an aryl group, more preferably a hydrogen atom, an alkyl group having 6 or less carbon atoms, or an aryl group having 6 to 10 carbon atoms, still more preferably a hydrogen atom or an alkyl group having 3 or less carbon atoms, and particularly preferably a hydrogen atom.

In addition, the specific polymer compound used in the present invention preferably has the linking group represented by Formula B-4 or B-7 in the main chain form the viewpoint of the printing durability of the obtained lithographic printing plate.

In addition, the linking groups B-3 to B-7 in the specific polymer compound used in the present invention are preferably linking groups obtained by reacting a diamine compound with exemplified compounds described below.

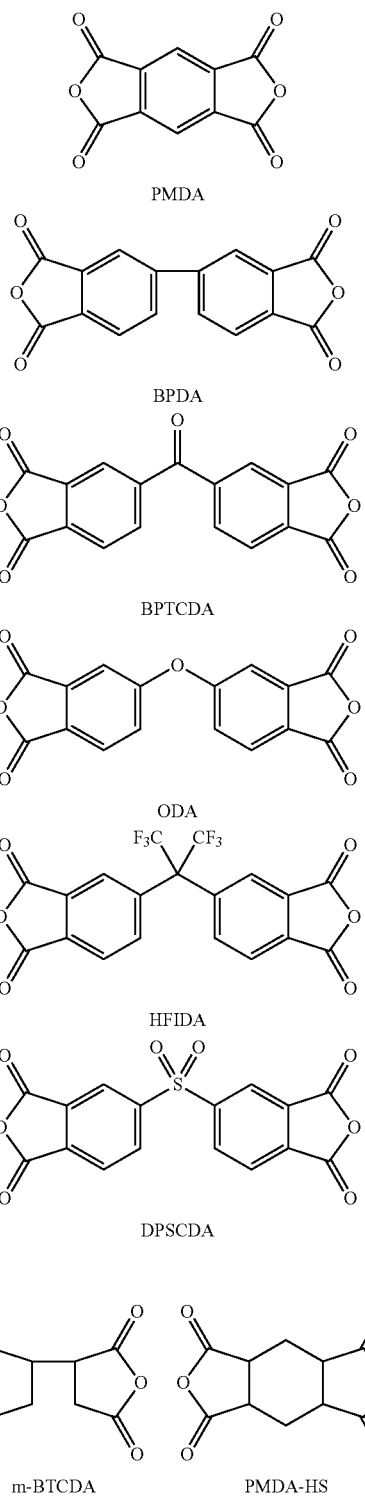

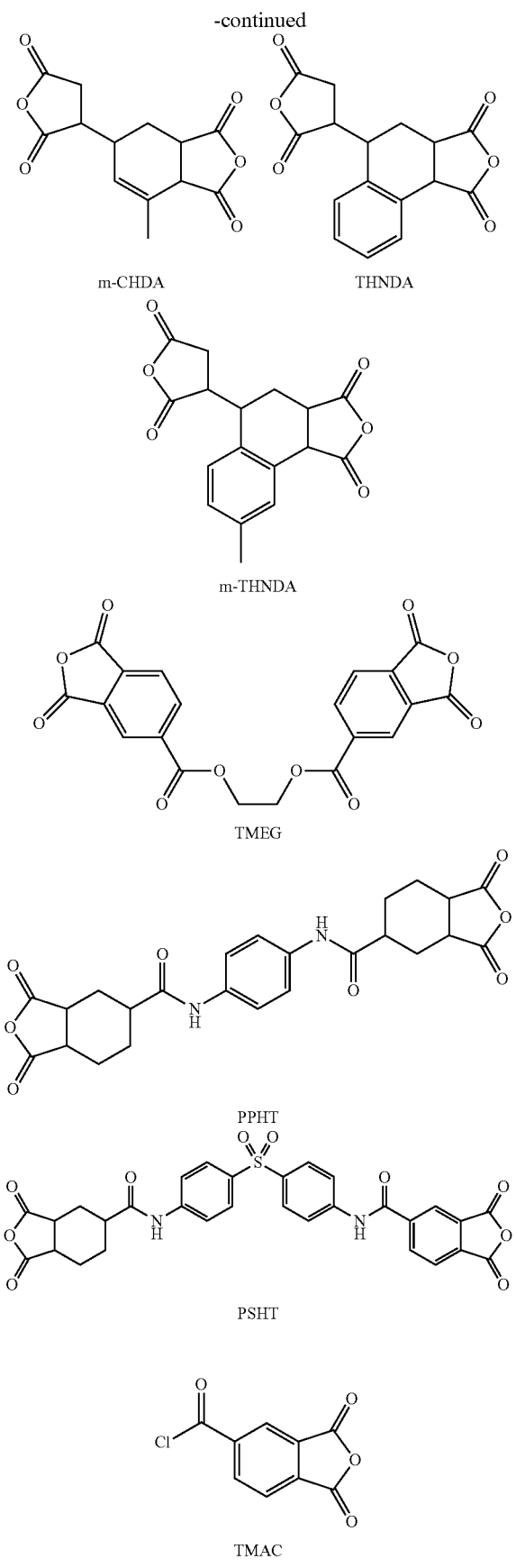

[Polymer Compound Having Linking Group a-3 and/or at Least One of Linking Group B-3, . . . , or B-7]

A polymer compound of the present invention having the linking group a-3 in the main chain is produced, for example, by sequential polymerization of a compound having two or more isocyanate groups and a compound having two or more amino groups.

The specific polymer compound is preferably produced by a sequential polymerization reaction of a diisocyanate compound and a diamine compound.

The portion excluding the urea bond in the linking group A-1 and the linking group a-3 are preferably included in the diamine compound.

The diisocyanate compound is preferably an aliphatic or aromatic hydrocarbon having 20 or less carbon atoms which has two isocyanate groups, more preferably phenylene diisocyanate or alkylene diisocyanate, and still more preferably 1,4-phenylene diisocyanate, xylylene diisocyanate, 1,3-bis(isocyanatomethyl)cyclohexane, or hexamethylene diisocyanate.

In addition, the polymer compound of the present invention having at least one of linking group B-3, . . . , or B-7 is produced, for example, by a condensation reaction between a compound having two or more acid anhydride groups or a compound having at least one of each of an acid halide group and an acid anhydride group and a compound having one or more amino groups.

The specific polymer compound is preferably produced by a condensation reaction between a compound having two acid anhydride groups or a compound having an acid halide group and an acid anhydride group and a diamine compound.

The portion excluding the urea bond in the linking group A-1 is preferably included in the diamine compound.

In addition, it is also possible to allow to react after an isocyanate compound is further added. The diisocyanate compound is preferably an aliphatic or aromatic hydrocarbon having 20 or less carbon atoms which has two isocyanate groups, more preferably an alkylene diisocyanate, and still more preferably 1,3-bis(isocyanatomethyl)cyclohexane or hexamethylene diisocyanate.

The polymer compound of the present invention having the linking group a-3 and at least one of linking group B-3, . . . , or B-7 is produced, for example, by a condensation reaction between a compound having two or more acid anhydride groups or a compound having at least one of each of an acid halide group and an acid anhydride group and a compound having one or more amino groups.

The specific polymer compound is preferably produced by a condensation reaction between a compound having two or more acid anhydride groups or a compound having at least one of each of an acid halide group and an acid anhydride group and a diamine compound.

The portion excluding the urea bond in the linking group A-1 and the linking group a-3 are preferably included in the diamine compound.

In addition, it is also possible to allow to react after an isocyanate compound is further added. The diisocyanate compound is preferably an aliphatic or aromatic hydrocarbon having 20 or less carbon atoms which has two isocyanate groups, more preferably an alkylene diisocyanate, and still more preferably hexamethylene diisocyanate.

Preferable specific examples of the polymer compound having the linking group a-3 and at least one of the linking group B-3, . . . , or B-7 which can be used in the present invention are shown in the following Table 3. PX-1 to PX-15 each mean a specific polymer compound obtained by reacting a compound having an acid anhydride group with a diamine compound described in Table 2 in a ratio (molar ratio) described in Table 2.

In addition, the weight average molecular weight (Mw) of a polymer is a value measured by GPC method.

The specific polymer compound having the linking group a-3 and at least one of the linking group B-3, . . . , or B-7 used in the present invention is not limited to the specific examples described in the following Table 3.

TABLE 3

| | Diisocyanate compound (molar ratio) | | Anhydride or acid halide compound (molar ratio) | | Diamine compound (molar ratio) | | Mw (×10,000) |
|---|---|---|---|---|---|---|---|
| PX-1 | PPDI 50 | — | — | — | — | DADHB 25 | SA-1 25 | 6.1 |
| PX-2 | TMHDI 50 | — | — | — | — | DADHB 30 | SA-1 20 | 6.2 |
| PX-3 | H6 XDI 50 | — | — | — | — | DADHB 25 | SA-1 25 | 5.8 |
| PX-4 | XDI 50 | — | — | — | — | DADHB 25 | SA-1 25 | 5.4 |
| PX-5 | HDI 50 | — | — | — | — | DADHB 25 | SA-1 25 | 6.2 |
| PX-6 | XDI 25 | HDI 25 | — | — | — | DADHB 25 | SA-1 25 | 5.2 |
| PX-7 | XDI 25 | H6 XDI 25 | — | — | — | DADHB 25 | SA-1 25 | 5.4 |
| PX-8 | H6 XDI 25 | TMHDI 25 | — | — | — | DADHB 25 | SA-1 25 | 5.0 |
| PX-9 | HDI 50 | — | — | — | — | DADHB 30 | SA-2 20 | 5.2 |
| PX-10 | HDI 40 | — | PMDA 10 | — | — | DADHB 50 | — | 5.9 |
| PX-11 | HDI 40 | — | BPDA 10 | — | — | DADHB 50 | — | 5.5 |
| PX-12 | HDI 40 | — | THNDA 10 | — | — | DADHB 50 | — | 5.5 |
| PX-13 | XDI 40 | — | TMAC 10 | — | — | DADHB 50 | — | 5.2 |
| PX-14 | H6 XDI 40 | — | TMAC 10 | — | — | DADHB 50 | — | 5.1 |
| PX-15 | HDI 40 | — | TMAC 10 | — | — | DADHB 25 | SA-1 25 | 5.3 |

Among these, as the specific polymer compound of the present invention, PX-1, PX-3, PX-4, PX-7, PX-10, or PX-14 is preferable, and PX-10 or PX-14 is more preferable.

As one example of the specific polymer compound used in the present invention, the structural formula of PX-4 in Table 3 is shown below. Moreover, the number at the bottom right of the parenthesis represents a molar ratio.

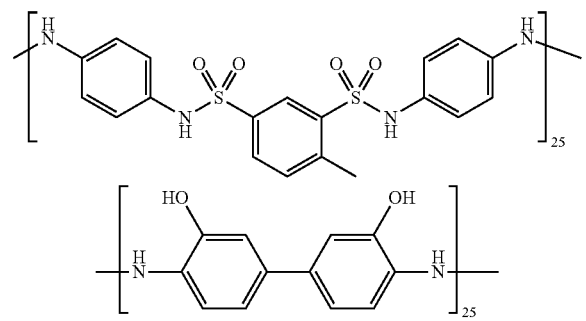

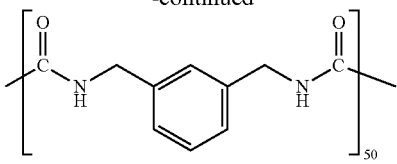

The molar ratio between of the linking group A-1 and all the linking groups included in the linking group a-3 in the polymer compound having the linking group A-1 and the linking group a-3 is preferably 3:1 to 1:3, more preferably 2:1 to 1:2, and still more preferably 1.5:1 to 1:1.

The molar ratio between of the linking group A-1 and all the linking groups included in the linking groups B-3 to B-7 in the polymer compound having the linking group A-1 and at least one of the linking group B-3, . . . , or B-7 is preferably 20:1 to 1:3, more preferably 20:1 to 1:1, and still more preferably 10:1 to 2:1.

The molar ratio between of the linking group A-1 and the total of the molar amount of the linking group a-3 and all the linking groups included in the linking groups B-3 to B-7 in the polymer compound having the linking group A-1, the linking group a-3, and at least one of the linking group B-3, . . . , or B-7 is preferably 20:1 to 1:3, more preferably 20:1 to 1:1, and still more preferably 10:1 to 2:1.

If the content of the linking group A-1, the linking group a-3, and the linking groups B-4 to B-6 is within the above range, it is possible to obtain a resin composition having excellent chemical resistance.

The content of the specific polymer compound in the photosensitive resin composition of the present invention is preferably 10% by mass to 90% by mass, more preferably 20% by mass to 80% by mass, and still more preferably 40% by mass to 70% by mass, with respect to the total solid content in the photosensitive resin composition. If the content is within the above range, the pattern formability at the time of development becomes good. Moreover, the total solid content mass of the photosensitive resin composition refers to the amount of the photosensitive resin composition excluding a volatile component such as a solvent.

The weight average molecular weight of the specific polymer compound in the photosensitive resin composition of the present invention is preferably 5,000 to 300,000, more preferably 10,000 to 200,000, and still more preferably 30,000 to 100,000.

Moreover, the measurement of the weight average molecular weight and the number average molecular weight in the present invention is preferably measured by a standard polystyrene conversion method using gel permeation chromatography (GPC). In the measurement performed by gel permeation chromatography in the present invention, as the GPC column, a column filled with polystyrene crosslinked gel (TSKgel SuperAWM-H; manufactured by Tosoh Corporation) was used, and as the GPC solvent, N-methylpyrrolidone (0.01 mol/L of each of phosphoric acid and lithium bromide) was used.

<Infrared Absorbent>

The photosensitive resin composition of the present invention contains an infrared absorbent.

The infrared absorbent is not particularly limited as long as it is a dye which generates heat by absorbing infrared light, and various dyes known as the infrared absorbent can be used.

As the infrared absorbent which can be used in the present invention, commercially available dyes or known dyes described in documents (for example, "Dye Handbook", compiled by the Society of Synthetic Organic Chemistry, published in 1970) can be used. Specifically, dyes such as azo dyes, metal complex azo dyes, pyrazolone azo dyes, anthraquinone dyes, phthalocyanine dyes, carbonium dyes, quinone imine dyes, methine dyes, and cyanine dyes are exemplified. In the present invention, among these dyes, a dye absorbing at least infrared light or near infrared light is preferable from the viewpoint of being suitable for use in laser emitting infrared light or near infrared light, and a cyanine dye is particularly preferable.

Examples of such a dye absorbing at least infrared light or near infrared light include the cyanine dyes described in JP1983-125246A (JP-S58-125246A), JP1984-84356A (JP-S59-84356A), JP-1984-202829A (JP-S59-202829A), or JP1985-78787A (JP-S60-78787A), the methine dyes described in JP1983-173696A (JP-S58-173696A), JP1983-181690A (JP-S58-181690A), or JP1983-194595A (JP-S58-194595A), the naphthoquinone dyes described in JP1983-112793A (JP-S58-112793A), JP1983-224793A (JP-S58-224793A), JP1984-48187A (JP-S59-48187A), JP1984-73996A (JP-S59-73996A), JP1985-52940A (JP-S60-52940A), or JP1985-63744A (JP-S60-63744A), the squarylium coloring agents described in JP1983-112792A (JP-S58-112792A), and the cyanine dyes described in GB434875B.

In addition, as the dye, the near infrared absorbing sensitizers described in U.S. Pat. No. 5,156,938A are also suitably used, also, the substituted aryl benzo(thio)pyrylium salts described in U.S. Pat. No. 3,881,924A, the trimethine thiapyrylium salts described in JP1982-142645A (JP-S57-142645A) (U.S. Pat. No. 4,327,169A), the pyrylium-based compounds described in JP1983-181051A (JP-S58-181051A), JP1983-220143A (JP-S58-220143A), JP1984-41363A (JP-S59-41363A), JP1984-84248A (JP-S59-84248A), JP1984-84249A (JP-S59-84249A), JP1984-146063A (JP-S59-146063A), or JP1984-146061A (JP-S59-146061A), the cyanine coloring agents described in JP1984-216146A (JP-S59-216146A), the pentamethinethiopyrylium salts described in U.S. Pat. No. 4,283,475A, or the pyrylium compounds described in JP1993-13514B (JP-H05-13514B) or JP1993-19702B (JP-H05-19702B) are used, and as commercially available products, Epolight III-178, Epolight III-130, Epolight III-125 manufactured by Epolin Inc., or the like is particularly preferably used.

In addition, particularly preferable other examples of the dye include near infrared absorbing dyes described as Formula I or II in U.S. Pat. No. 4,756,993A.

Among these dyes, examples of a particularly preferable dye include a cyanine coloring agent, a phthalocyanine dye, an oxonol dye, a squarylium coloring agent, a pyrylium salt, a thiopyrylium dye, and a nickel thiolate complex. Furthermore, in a case where a cyanine coloring agent represented by the following Formula a is used in the upper layer in the present invention, a high polymerization activity is given and the stability and the economic efficiency becomes excellent, and thus, the cyanine coloring agent is most preferable.

Formula (a)

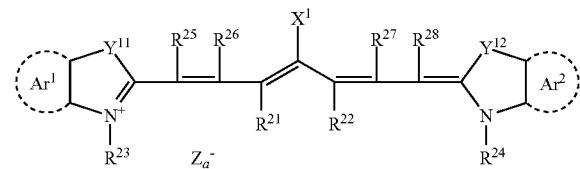

In Formula a, $X^1$ represents a hydrogen atom, a halogen atom, a diarylamino group (—$NPh_2$), $X^2$-$L^2$, or a group shown below. $X^2$ represents an oxygen atom or a sulfur atom. $L^2$ represents a hydrocarbon group having 1 to 12 carbon atoms, an aromatic ring having a heteroatom, or a hydrocarbon group having 1 to 12 carbon atoms including a heteroatom. Here, the heteroatom represents N, S, O, a halogen atom, or Se.

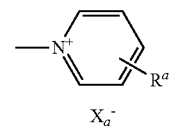

In the formula, $X_a^-$ has the same definition as $Z_a^-$ described below, and $R^a$ represents a substituent selected from a hydrogen atom, an alkyl group, an aryl group, a substituted or unsubstituted amino group, and a halogen atom.

$R^{21}$ and $R^{22}$ each independently represent a hydrocarbon group having 1 to 12 carbon atoms. From the viewpoint of storage stability of a photosensitive layer coating solution, $R^{21}$ and $R^{22}$ each are preferably a hydrocarbon group having two or more carbon atoms, and $R^{21}$ and $R^{22}$ are particularly preferably bonded to each other to form a 5-membered ring or a 6-membered ring.

$Ar^1$ and $Ar^2$ may be the same as or different from each other, and $Ar^1$ and $Ar^2$ each represent an aromatic hydrocarbon group which may have a substituent. Examples of a preferable aromatic hydrocarbon group include a benzene ring and a naphthalene ring. In addition, examples of a preferable substituent include a hydrocarbon group having 12 or less carbon atoms, a halogen atom, and an alkoxy group having 12 or less carbon atoms.

$Y^{11}$ and $Y^{12}$ may be the same as or different from each other, and $Y^{11}$ and $Y^{12}$ each represent a sulfur atom or a dialkyl methylene group having 12 or less carbon atoms. $R^{23}$ and $R^{24}$ may be the same as or different from each other, and $R^{23}$ and $R^{24}$ each represent a hydrocarbon group having 20 or less carbon atoms which may have a substituent. Examples of a preferable substituent include an alkoxy group having 12 or less carbon atoms, a carboxyl group, and a sulfo group.

$R^{25}$, $R^{26}$, $R^{27}$, and $R^{28}$ may be the same as or different from each other, and $R^{25}$, $R^{26}$, $R^{27}$, and $R^{28}$ each represent a hydrogen atom or a hydrocarbon group having 12 or less carbon atoms. From the viewpoint of availability of a raw material, $R^{25}$, $R^{26}$, $R^{27}$, and $R^{28}$ each are preferably a hydrogen atom. In addition, $Z_a^-$ represents a counter anion. Here, the cyanine coloring agent represented by Formula a has an anionic substituent in the structure thereof, and in a case where neutralization of the charge is not necessary, $Z_a^-$ is not necessary. From the viewpoint of storage stability of a photosensitive layer coating solution, preferable $Z_a^-$ is a halide ion, a perchlorate ion, a tetrafluoroborate ion, a hexafluorophosphate ion, or a sulfonate ion, and particularly preferably a perchlorate ion, a hexafluorophosphate ion, or an arylsulfonate ion.

Specific examples of the cyanine coloring agent represented by General Formula a which can be suitably used include the cyanine coloring agents described in paragraphs 0017 to 0019 of JP2001-133969A, paragraphs 0012 to 0038 of JP2002-40638A, and paragraphs 0012 to 0023 of JP2002-23360A.

The infrared absorbent contained in the upper layer is particularly preferably a cyanine dye A shown below.

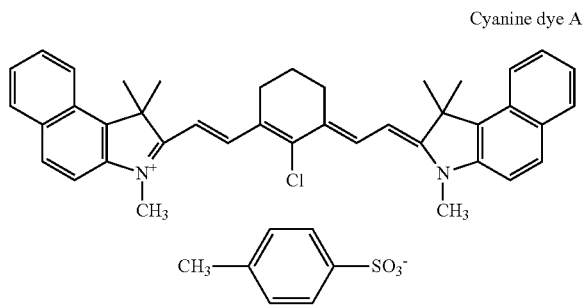

Cyanine dye A

The addition amount when an infrared absorbent is added to the photosensitive resin composition of the present invention is preferably 0.01% by mass to 50% by mass, more preferably 0.1% by mass to 30% by mass, and particularly preferably 1.0% by mass to 30% by mass, with respect to the total solid content in the photosensitive resin composition. If the addition amount is 0.01% by mass or greater, the layer becomes high sensitive, and if the addition amount is 50% by mass or less, the uniformity of the layer is good and the durability of the layer is excellent.

Other components may be contained in the photosensitive resin composition of the present invention, as desired, as long as the effects of the present invention are not impaired.

Hereinafter, other alkali-soluble resins, an acid generator, an acid proliferative agent, and other additives which are arbitrary components of the photosensitive resin composition of the present invention will be described.

<Other Alkali-Soluble Resins>

In the present invention, the "alkali-soluble" means "being solubilized by a treatment for a standard development time in an alkali aqueous solution with a pH of 8.5 to 13.5".

Although the alkali-soluble resin other than the specific polymer compound used in the photosensitive resin composition of the present invention is not particularly limited as long as it has a characteristic of being dissolved by contact with an alkali developer, the alkali-soluble resin preferably has an acidic functional group such as a phenolic hydroxyl group, a sulfonate group, a phosphate group, a sulfonamide group, or an active imide group in the main chain and/or a side chain in the polymer, a resin including 10 mol % or greater of a monomer having such an acidic functional group imparting alkali-solubility is exemplified, and a resin including 20 mol % or greater is more preferable. If the copolymerization component of the monomer imparting alkali-solubility is 10 mol % or greater, sufficient alkali-solubility is obtained, and developability is excellent.

In addition, as the alkali-soluble resin, a novolac resin is also preferably exemplified.

As the novolac resin which can be used in the present invention, novolac resins such as a phenol formaldehyde resin, an m-cresol formaldehyde resin, a p-cresol formaldehyde resin, an m-/p-mixed cresol formaldehyde resin, a phenol/cresol (which may be any one of m-, p-, and a mixture of m-/p-) mixed formaldehyde resin or pyrogallol acetone resins are preferably exemplified.

In addition, a polycondensate of phenol having an alkyl group having 3 to 8 carbon atoms as a substituent and formaldehyde, such as a t-butylphenol formaldehyde resin or an octylphenol formaldehyde resin, as described in U.S. Pat. No. 4,123,279A, is exemplified. In addition, the weight average molecular weight (Mw) thereof is preferably 500 or greater, and more preferably 1,000 to 700,000. In addition, the number average molecular weight (Mn) thereof is preferably 500 or greater, and more preferably 750 to 650,000. The dispersity (weight average molecular weight/number average molecular weight) is preferably 1.1 to 10.

Other alkali-soluble resins preferably have a weight-average molecular weight of 2,000 or greater and a number average molecular weight of 500) or greater, and more preferably have a weight average molecular weight of 5,000 to 300,000 and a number average molecular weight of 800 to 250,000. The dispersity (weight average molecular weight/number average molecular weight) of other alkali-soluble resins is preferably 1.1 to 10.

Other alkali-soluble resins included in the resin composition of the present invention as desired may be used alone or in combination of two or more types thereof.

The content of other alkali-soluble resins with respect to the total solid content in the photosensitive resin composition of the present invention is preferably 0% by mass to 98% by mass and more preferably 0% by mass to 80% by mass. In addition, 80 parts by mass or less thereof is preferably included with respect to 100 parts by of the specific polymer compound used in the present invention.

<Acid Generator>

The photosensitive resin composition of the present invention preferably contains an acid generator from the viewpoint of sensitivity improvement.

The acid generator in the present invention is a compound which generates an acid by light or heat, and indicates a compound which generates an acid due to decomposition by irradiation with infrared rays or heating at 100° C. or higher. The acid generated is preferably a strong acid having a pKa of 2 or less such as sulfonic acid or hydrochloric acid. The acid generated from the acid generator functions as a catalyst, due to this, the chemical bond in the acid-decomposable group is cleaved to become an acid group, and as a result, the solubility in the alkali aqueous solution of the image recording layer is further improved.

Examples of the acid generator suitably used in the present invention include onium salts such as an iodonium salt, a sulfonium salt, a phosphonium salt, and a diazonium salt. Specifically, the compounds described in U.S. Pat. No. 4,708,925A or JP1995-20629A (JP-H07-20629A) can be exemplified. In particular, an iodonium salt, a sulfonium salt, or a diazonium salt, which has a sulfonate ion as a counter ion, is preferable. As the diazonium salt, the diazonium compound described in U.S. Pat. No. 3,867,147A, the diazonium compound described in U.S. Pat. No. 2,632,703A, or the diazo resins described in JP1989-102456A (JP-H01-102456A) or JP1989-102457A (JP-H01-102457A) are also preferable. In addition, the benzyl sulfonates described in U.S. Pat. Nos. 5,135,838A or 5,200,544A are also preferable. Furthermore, the active sulfonic esters or the disulfonyl compounds described in JP1990-100054A (JP-H02-100054A), JP1990-100055A (JP-H02-100055A), or JP1997-197671A (JP-H09-197671A) are also preferable. In addition, the S-triazines haloalkyl-substituted described in JP1995-271029A (JP-H07-271029A) are also preferable.

Furthermore, the compound described as an "acid precursor" in JP1996-220752A (JP-H08-220752A) or the compound described as "(a) a compound which can generates an acid by irradiation with active light" in JP1997-171254A (JP-H09-171254A) can also be applied as the acid generator of the present invention.

Among these, from the viewpoint of sensitivity and stability, an onium salt compound is preferably used as an acid generator. The onium salt compound will be described below.

As the onium salt compound which can be suitably used in the present invention, compounds known as a compound which generates an acid due to decomposition by infrared ray exposure or heat energy generated from the infrared absorbent by exposure can be exemplified. As the onium salt compound suitable in the present invention, from the viewpoint of sensitivity, compounds having an onium salt structure described below, having a known thermal polymerization initiator or a bond with small bond dissociation energy can be exemplified.

Examples of the onium salt suitably used in the present invention include known diazonium salts, iodonium salts, sulfonium salts, ammonium salts, pyridinium salts, and azinium salts, and among these, sulfonate of triarylsulfonium or diaryliodonium, carboxylate, $BF_4^-$, $PF_6^-$, or $ClO_4^-$ is preferable.

Examples of the onium salt which can be used as an acid generator in the present invention include onium salts represented by each of the following Formulas III to V.

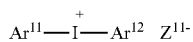

Formula (III)

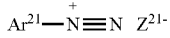

Formula (IV)

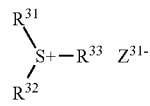

Formula (V)

In Formula III, $Ar^{11}$ and $Ar^{12}$ each independently represent an aryl group having 20 or less carbon atoms which may have a substituent. Examples of a preferably substituent in a case where the aryl group has a substituent include a halogen atom, a nitro group, an alkyl group having 12 or less carbon atoms, an alkoxy group having 12 or less carbon atoms, and an aryloxy group having 12 or less carbon atoms. $Z^{11-}$ represents a counter ion selected from the group consisting of a halogen ion, a perchlorate ion, a tetrafluoroborate ion, a hexafluorophosphate ion, a sulfonate ion, or a sulfonate ion having a fluorine atom such as a perfluoroalkyl sulfonate ion, and a perchlorate ion, a hexafluorophosphate ion, an aryl sulfonate ion, or a perfluoroalkyl sulfonic acid is preferable.

In Formula IV, $Ar^{21}$ represents an aryl group having 20 or less carbon atoms which may have a substituent. Examples of a preferable substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms. $Z^{21-}$ represents a counter ion having the same meaning as $Z^{11-}$.

In Formula V, $R^{31}$, $R^{32}$, and $R^{33}$ may be the same as or different from each other, and $R^{31}$, $R^{32}$, and $R^{33}$ each represent a hydrocarbon group having 20 or less carbon atoms which may have a substituent. Examples of a preferably substituent include a halogen atom, a nitro group, an alkyl group having 12 or less carbon atoms, an alkoxy group having 12 or less carbon atoms, and an aryloxy group having 12 or less carbon atoms. $Z^{31-}$ represents a counter ion having the same meaning as $Z^{11-}$.

Specific examples of onium salts (OI-1 to OI-10) represented by Formula III, onium salts (ON-1 to OI-5) represented by Formula IV, and onium salts (OS-1 to OS-6) represented by Formula V which can be suitably used in the present invention are exemplified below.

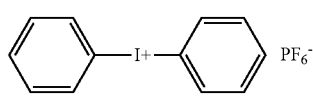

[OI-1]

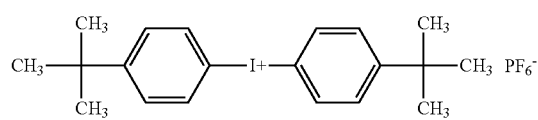

[OI-2]

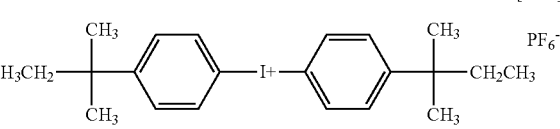

[OI-3]

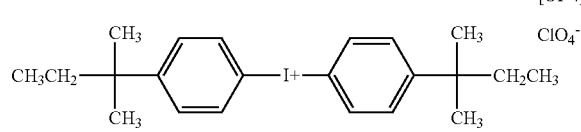

[OI-4]

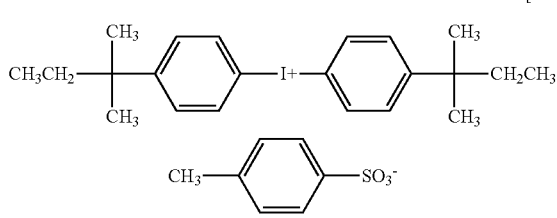

[OI-5]

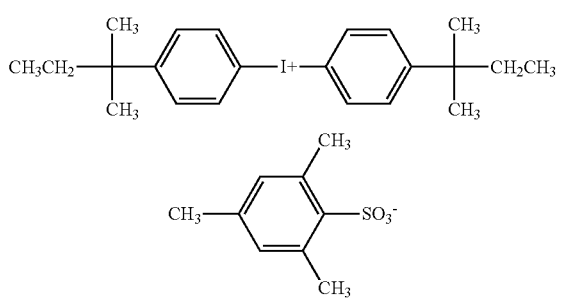

[OI-6]

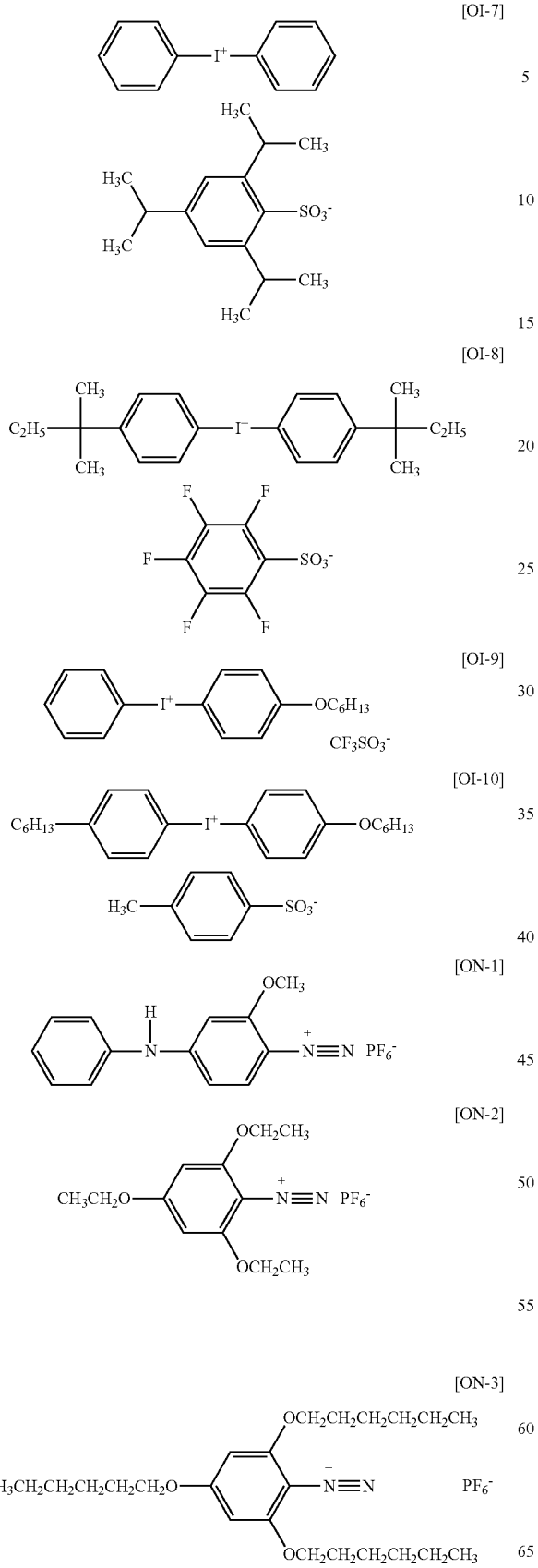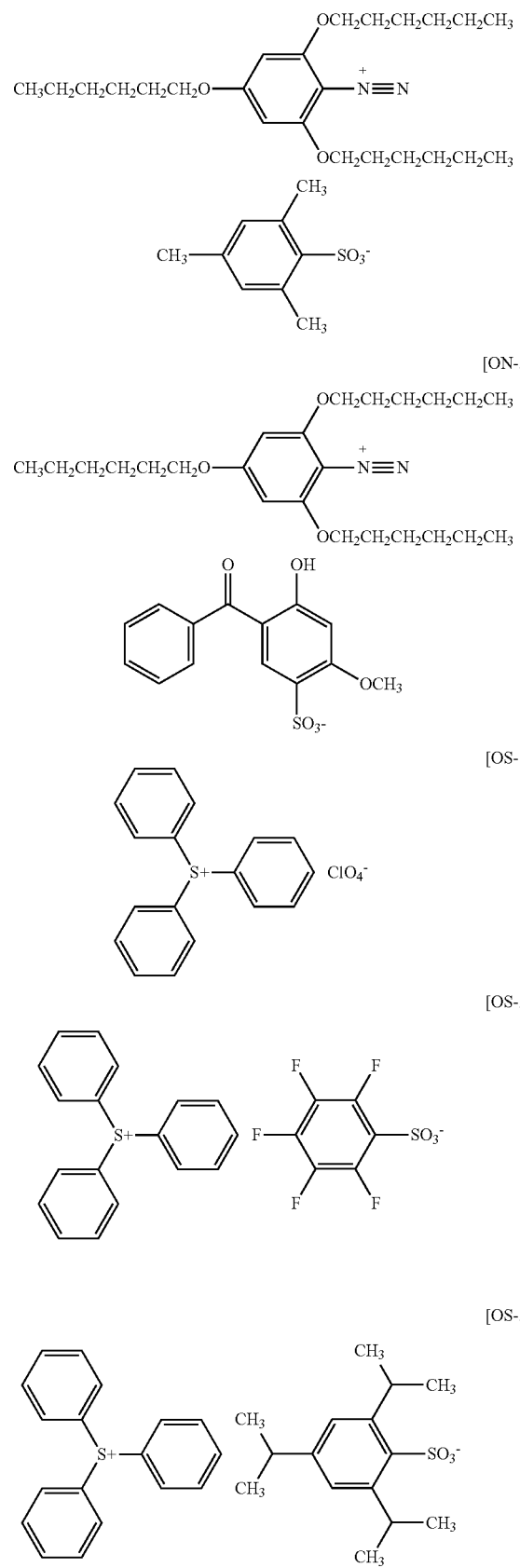

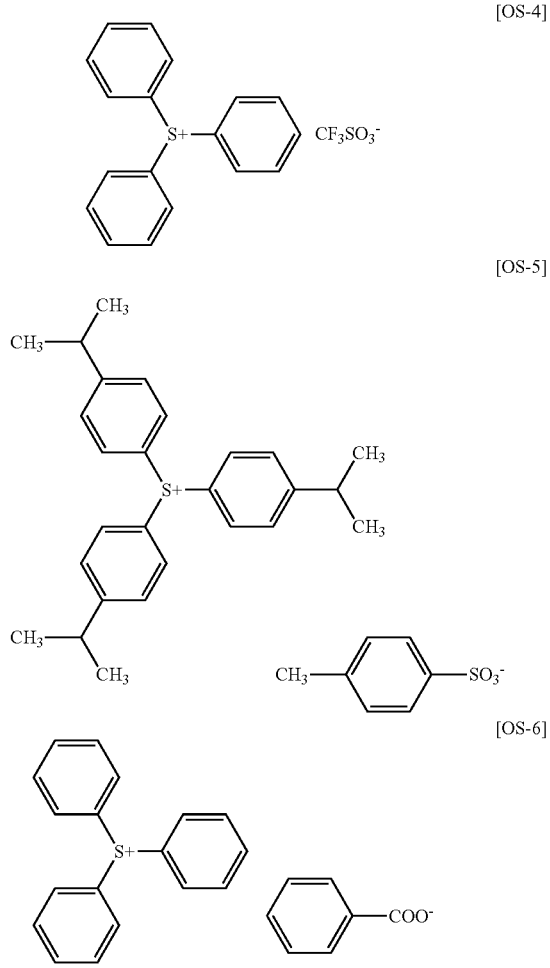

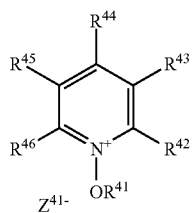

In addition, as another example of the compounds represented by each of Formulas III to V, the compounds described as an example of a radical polymerization initiator in paragraphs 0036 to 0045 of JP2008-195018A can be suitably used as an acid generator in the present invention.

Another example of a preferable onium salt as the acid generator used in the present invention include an azinium salt compound represented by the following Formula VI.

Formula (VI)

$$\begin{array}{c} R^{44} \\ R^{45} \diagup\diagdown R^{43} \\ R^{46} \diagdown N^{+} \diagup R^{42} \\ Z^{41-} \quad OR^{41} \end{array}$$

In Formula (VI), $R^{41}$, $R^{42}$, $R^{43}$, $R^{44}$, $R^{45}$, and $R^{46}$ each may be the same as or different from each other, and $R^{41}$, $R^{42}$, $R^{43}$, $R^{44}$, $R^{45}$, and $R^{46}$ each represent a hydrogen atom or a monovalent substituent.

Examples of the monovalent substituent include a halogen atom, an amino group, a substituted amino group, a substituted carbonyl group, a hydroxyl group, a substituted oxy group, a thiol group, a thioether group, a silyl group, a nitro group, a cyano group, an alkyl group, an alkenyl group, an aryl group, a heterocyclic group, a sulfo group, a substituted sulfonyl group, a sulfonate group, a substituted sulfinyl group, a phosphono group, a substituted phosphono group, a phosphonate group, and a substituted phosphonate group, and in the case of being introducible, $R^{41}$, $R^{42}$, $R^{43}$, $R^{44}$, $R^{45}$, and $R^{46}$ each may further have a substituent.

A compound (multimerized form) including two one more cation portions in the molecule as a result of bonding of the skeletons (cation portions) having a specific structure in the compound represented by Formula VI to each other through $R^{41}$ is also included in examples of the compound represented by Formula VI, and such a compound is also suitably used.

$Z^{41-}$ represents a counter ion having the same meaning as $Z^{11-}$.

Specific examples of the azinium salt compound represented by Formula VI include the compounds described in paragraphs 0047 to 0056 of JP2008-195018A.

In addition, a compound group having an N—O bond described in JP1988-138345A (JP-S63-138345A), JP1988-142345A (JP-S63-142345A), JP1988-142346A (JP-S63-142346A, JP1988-143537A (JP-S63-143537A), or JP1971-42363B (JP-S46-42363B) is also suitably used as the acid generator in the present invention.

More preferable examples of the acid generator which can be used in the present invention include the following compounds (PAG-1) to (PAG-5).

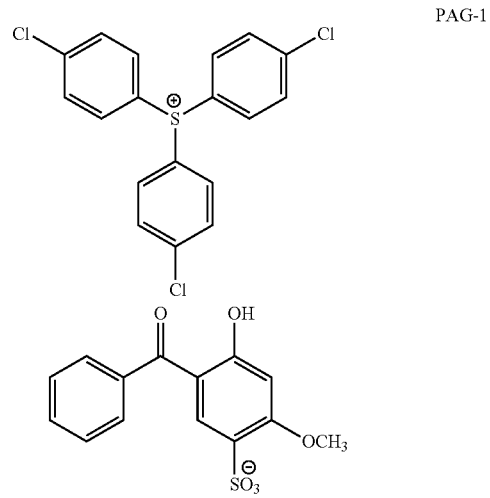

PAG-1

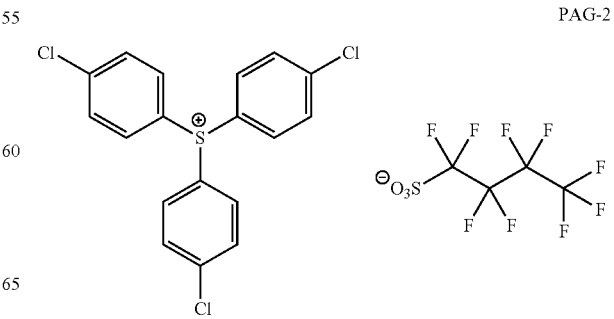

PAG-2

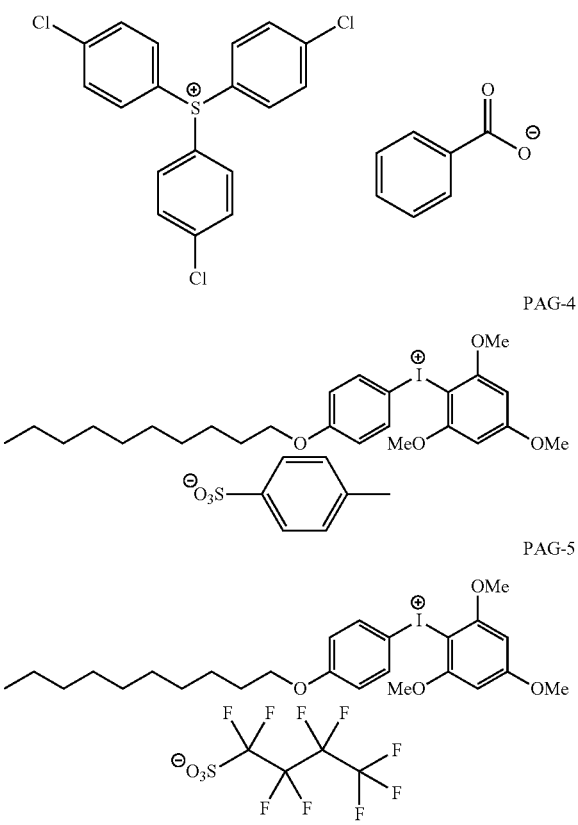

PAG-3

PAG-4

PAG-5

In a case where these acid generators are contained in the photosensitive resin composition of the present invention, these compounds may be used alone or in combination of two or more types thereof.

A preferable addition amount of acid generator is within a range of 0.01% by mass to 50% by mass, preferably within a range of 0.1% by mass to 40% by mass, and more preferably within a range of 0.5% by mass to 30% by mass, with respect to the total solid content in the photosensitive resin composition. If the addition amount is within the above range, improvement of sensitivity which is the effect of the addition of an acid generator is observed, and an occurrence of a residual film in the non-image portion is suppressed.

<Acid Proliferative Agent>

An acid proliferative agent may be added to the image recording layer of the present invention. The acid proliferative agent in the present invention is a compound substituted with a residue of a relatively strong acid, and a compound which newly generates an acid by being easily released in the presence of an acid catalyst. That is, the compound is decomposed by an acid catalyzed reaction, and generates an acid (hereinafter, referred to as ZOH in formulas) again. Since one or more acids per reaction are increased, and with the progress of the reaction, the acid concentration is increasingly increased, sensitivity is dramatically improved. The intensity of this generated acid is 3 or less as an acid dissociation constant (pKa), and preferably 2 or less. In the case of a weaker acid than this, it is not possible to cause the elimination reaction by an acid catalyst.

Examples of the acid used in such an acid catalyst include dichloroacetic acid, trichloroacetic acid, methanesulfonic acid, ethanesulfonic acid, benzenesulfonic acid, p-toluenesulfonic acid, naphthalenesulfonic acid, and phenyl sulfonic acid.

As the acid proliferative agent, the acid proliferative agents described in WO95/29968A, WO98/24000A, JP1996-305262A (JP-H08-305262A), JP1997-34106A (JP-H09-34106A), JP1996-248561A (JP-H08-248561A), JP1996-503082B (JP-H08-503082B), U.S. Pat. No. 5,445,917A, JP1996-503081B (JP-H08-503081B), U.S. Pat. Nos. 5,534,393A, 5,395,736A, 5,741,630A, 5,334,489A, 5,582,956A, 5,578,424A, 5,453,345A, 5,445,917A, EP665960, EP757628, EP665961, U.S. Pat. No. 5,667,943, or JP1998-1598A (JP-H10-1598A) can be used alone or in combination of two or more types thereof.

Preferable specific examples of the acid proliferative agent in the present invention include the compounds described in paragraphs 0056 to 0067 of JP2001-66765A. Among these, the following compounds described as an exemplary compound (ADD-1), (ADD-2), or (ADD-3) can be suitably used.

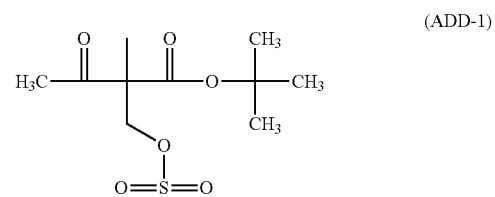

(ADD-1)

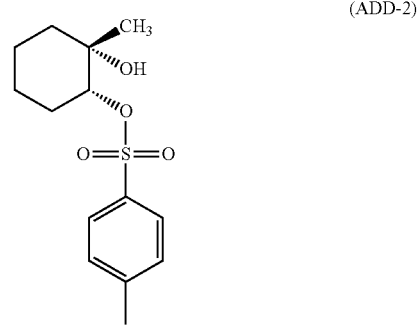

(ADD-2)

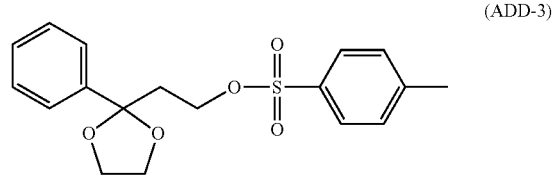

(ADD-3)

The addition amount in a case where the acid proliferative agent is added in an upper layer is within a range of 0.01% by mass to 20% by mass, preferably within a range of 0.01% by mass to 10% by mass, and more preferably within a range of 0.1% by mass to 5% by mass, in terms of the solid content. If the addition amount of the acid proliferative agent is within the above range, effects of adding acid proliferative agent is sufficiently obtained, improvement in sensitivity is achieved, and film hardness reduction of an image portion is suppressed.

<Other Additives>

The photosensitive resin composition of the present invention may include a development accelerator, a surfactant, a print-out agent/colorant, a plasticizer, or a wax agent, as other additives.

[Development Accelerator]

For the purpose of improving sensitivity, acid anhydrides, phenols, or organic acids may be added to the photosensitive resin composition of the present invention.

As the acid anhydrides, cyclic acid anhydride is preferable, and specifically, as the cyclic acid anhydride, phthalic anhydride, tetrahydrophthalic anhydride, hexahydrophthalic anhydride, 3,6-endooxytetrahydrophthalic anhydride, tetrachlorophthalic anhydride, maleic anhydride, chloromaleic anhydride, α-phenylmaleic anhydride, succinic anhydride, or pyromellitic anhydride described in U.S. Pat. No. 4,115,128A can be used. As the non-cyclic acid anhydride, acetic anhydride is exemplified.

Examples of the phenols include bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenxophenone, 4,4',4''-trihydroxytriphenyl methane, and 4,4',3'',4''-tetrahydroxy-3,5,3',5'-tetramethyltriphenyl methane.

The organic acids are described in JP1985-88942A (JP-S60-88942A), JP as JP1990-96755A (JP-H02-96755A), or the like, and specific examples thereof include p-toluenesulfonic acid, dodecylbenzenesulfonic acid, p-toluenesulfinic acid, ethyl sulfate, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The ratio of the acid anhydrides, the phenols, and the organic acids to the total solid content in the photosensitive resin composition is preferably 0.05% by mass to 20% by mass, more preferably 0.1% by mass to 15% by mass, and particularly preferably 0.1% by mass to 10% by mass.

[Surfactant]

To improve coating property and stability of a treatment with respect to development conditions, a nonionic surfactant as described in JP1987-251740A (JP-S62-251740A) or JP1991-208514A (JP-H03-208514A), an amphoteric surfactant as described in JP1984-121044A (JP-S59-121044A) or JP1992-13149A (JP-H04-13149A), or a fluorine-containing monomer copolymer such as JP1987-170950A (JP-S62-170950A), JP1999-288093A (JP-H11-288093A), or JP2003-57820A can be added to the photosensitive resin composition of the present invention.

Specific examples of the nonionic surfactant include sorbitan tristearate, sorbitan monopalmitate, sorbitan trioleate, monoglyceride stearate, and polyoxyethylenenonylphenyl ether.

Specific examples of the amphoteric surfactant include alkyl di(aminoethyl)glycine, alkylpolyaminoethylglycine hydrochloride, 2-alkyl-N-carboxyethyl-N-hydroxyethyl imidazolinium betaine, and an N-tetradecyl-N,N-betaine type (for example, product name "AMOGEN K" manufactured by Dai-ichi Kogyo Seiyaku Co., Ltd.).

The ratio of the surfactant to the total solid content in the photosensitive resin composition is preferably 0.01% by mass to 15% by mass, more preferably 0.01% by mass to 5% by mass, and particularly preferably 0.05% by mass to 2.0% by mass.

[Print-Out Agent/Colorant]

As a print-out agent for obtaining a visible image immediately after heating by exposure or a dye or a pigment as an image colorant can be added to the photosensitive resin composition of the present invention.

Examples of the print-out agent and the colorant are described in detail in paragraphs 0122 and 0123 of JP2009-229917A, and the compounds described here can be applied to the present invention.

The dye is preferably added in a ratio of 0.01% by mass to 10% by mass and more preferably added in a ratio of 0.1% by mass to 3% by mass with respect to the total solid content of the photosensitive resin composition.

[Plasticizer]

To impart flexibility or the like to the coating film, a plasticizer may be added to the photosensitive resin composition of the present invention. For example, butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, or an oligomer or a polymer of acrylic acid or methacrylic acid is used.

The plasticizer is preferably added in a ratio of 0.5% by mass to 10% by mass and more preferably added in a ratio of 1.0% by mass to 5% by mass with respect to the total solid content of the photosensitive resin composition.

[Wax Agent]

For the purpose of imparting resistance against scratches, a compound for reducing the coefficient of static friction of the surface can also be added to the photosensitive resin composition of the present invention. Specifically, the compounds having an ester of a long chain alkyl carboxylic acid as described in U.S. Pat. No. 6,117,913A, JP2003-149799A. JP2003-302750A, or JP2004-12770A can be exemplified.

As a preferable addition amount thereof, the ratio of the wax agent to the total solid content of the photosensitive resin composition is preferably 0.1% by mass to 10% by mass and more preferably 0.5% by mass to 5% by mass.

<Compositional Ratio of Respective Components>

The content of the specific polymer compound is preferably 10% by mass to 90% by mass, the content of the infrared absorbent is preferably 0.01% by mass to 50% by mass, the content of other alkali-soluble resins is preferably 0% by mass to 80% by mass, the content of the acid generator is preferably 0% by mass to 30% by mass, the content of the acid proliferative agent is preferably 0% by mass to 20% by mass, the content of the development accelerator is 0% by mass to 20% by mass, the content of the surfactant is preferably 0% by mass to 5% by mass, the content of the print-out agent/colorant is preferably 0% by mass to 10% by mass, the content of the plasticizer is preferably 0% by mass to 10% by mass, and the content of the wax agent is preferably 0% by mass to 10% by mass, with respect to the total solid content mass of the photosensitive resin composition of the present invention.

The photosensitive resin composition of the present invention can be applied to various fields requiring resin pattern formation excellent in durability, for example, various fields such as a resist, a display, a lithographic printing plate precursor, and the like, and since the photosensitive resin composition can be recorded with high sensitivity and has excellent image formability, and the durability of the image portion formed of the composition is good, by applying to an infrared sensitive positive type lithographic printing plate precursor described in detail below, the effects of the present invention can become significant.

(Lithographic Printing Plate Precursor)

The lithographic printing plate precursor of the present invention has an image recording layer including the photosensitive resin composition of the present invention.

In addition, the lithographic printing plate precursor of the present invention is preferably a positive type lithographic printing plate precursor.

Furthermore, the lithographic printing plate precursor is a positive type lithographic printing plate precursor having an image recording layer in which an underlayer and an upper layer are disposed in this order on the support having a hydrophilic surface, and the photosensitive resin composition is preferably contained in the underlayer and/or the upper layer, more preferably contained in the underlayer or the upper layer, and still more preferably contained only in the underlayer.

<Image Recording Layer>

The image recording layer used in the present invention can be formed by dissolving respective components of the photosensitive resin composition in a solvent and applying the resulting product to a suitable support.

Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethyl sulfoxide, sulfolane, γ-butyrolactone, toluene, and 1,3-dimethyl-2-imidazolidinone, and the present invention is not limited thereto. These solvents are used alone or in a mixture.

[Formation of Underlayer and Upper Layer]

In addition, the image recording layer is preferably an image recording layer (hereinafter, also referred to as a "lithographic printing plate precursor having a two-layer structure") in which an underlayer and an upper layer are disposed in this order on a support.

The underlayer and the upper layer are preferably separately formed in principle.

As the method of separately forming the two layers, for example, as described in paragraphs 0068 and 0069 of JP2011-209343A, a method of using the difference in the solvent solubilities between the components included in the underlayer and the components included in the upper layer and a method of rapidly drying and removing the solvent after application to the upper layer are exemplified. Since by using the latter method in combination, the separation between the layers is more favorably performed, the method is preferable.

The photosensitive resin composition of the present invention is preferably included in the upper layer and/or the underlayer, and more preferably included only in the underlayer.

The content of the specific polymer compound in the photosensitive resin composition included in the upper layer and/or the underlayer of the present invention is preferably 10% by mass to 100% by mass, more preferably 50% by mass to 98% by mass, and still more preferably 60% by mass to 95% by mass, with respect to the total solid content in the photosensitive resin composition. If the content is within the above range, the pattern formability at the time of development becomes good. Moreover, the total solid content mass of the photosensitive resin composition refers to the amount of the photosensitive resin composition excluding a volatile component such as a solvent.

The coating amount after drying of the underlayer applied to the support of the lithographic printing plate precursor of the present invention is preferably within a range of 0.5 $g/m^2$ to 4.0 $g/m^2$ and more preferably within a range of 0.6 $g/m^2$ to 2.5 $g/m^2$. If the coating amount is 0.5 $g/m^2$ or greater, printing durability is excellent, and if the coating amount is 4.0 $g/m^2$ or less, image reproducibility and sensitivity are excellent.

In addition, the coating amount after drying of the upper layer component is preferably 0.05 $g/m^2$ to 1.0 $g/m^2$ and more preferably 0.08 $g/m^2$ to 0.7 $g/m^2$. If the coating amount is 0.05 $g/m^2$ or greater, development latitude and scratch resistance are excellent, and if the coating amount is 1.0 $g/m^2$ or less, sensitivity is excellent.

The coating amount after drying of the underlayer and the upper layer is preferably within a range of 0.6 $g/m^2$ to 4.0 $g/m^2$ and more preferably within a range of 0.7 $g/m^2$ to 2.5 $g/m^2$. If the coating amount is 0.6 $g/m^2$ or greater, printing durability is excellent, and if the coating amount is 4.0 $g/m^2$ or less, image reproducibility and sensitivity are excellent.

<Upper Layer>

The upper layer of the lithographic printing plate precursor having a two-layer structure of the present invention can be preferably formed using the photosensitive resin composition of the present invention, and preferably formed using a resin composition other than the photosensitive resin composition of the present invention.

The upper layer of the lithographic printing plate precursor having a two-layer structure of the present invention is preferably an infrared sensitive positive type recording layer of which the solubility in an alkali aqueous solution is improved by heat.

The mechanism of improving the solubility in alkali aqueous solution by heat in the upper layer is not particularly limited, and any one can be used as long as it includes a binder resin and improves the solubility of the heated region. As the heat used in image formation, the heat generated in a case where the underlayer including an infrared absorbent is exposed is exemplified.

Preferable examples of the upper layer of which the solubility in an alkali aqueous solution is improved by heat include a layer including an alkali-soluble resin having a hydrogen-bonding capacity such as novolac or urethane, a layer including a water-insoluble and alkali-soluble resin and a compound having a dissolution suppressing action, and a layer including an ablation-possible compound.

In addition, by further adding an infrared absorbent to the upper layer, the heat generated from the upper layer can also be used in image formation. Preferable examples of the constitution of the upper layer including an infrared absorbent include a layer including an infrared absorbent, a water-insoluble and alkali-soluble resin, and a compound having a dissolution suppressing action, and a layer including an infrared absorbent, a water-insoluble and alkali-soluble resin, and an acid generator.

[Water-Insoluble and Alkali-Soluble Resin]

The upper layer according to the present invention preferably contains a water-insoluble and alkali-soluble resin. By containing the water-insoluble and alkali-soluble resin, an interaction is formed between the polar groups of the infrared absorbent and the water-insoluble and alkali-soluble resin, and a layer having a positive type photosensitivity is formed.

General water-insoluble and alkali-soluble resin will be described below in detail, and among these, a polyamide resin, an epoxy resin, a polyacetal resin, an acrylic resin, a methacrylic resin, a polystyrene-based resin, and a novolac-type phenolic resin are preferably exemplified.

The water-insoluble and alkali-soluble resin which can be used in the present invention is not particularly limited as long as it has a characteristic of being dissolved by contact with an alkali developer, and a homopolymer containing an acidic group in the main chain and/or a side chain in the polymer, a copolymer thereof, or a mixture thereof is preferable.

The water-insoluble and alkali-soluble resin having an acidic group preferably has a functional group such as a phenolic hydroxyl group, a carboxy group, a sulfonate group, a phosphate group, a sulfonamide group, or an active imide group. Therefore, such a resin can be suitably produced by copolymerizing a monomer mixture including one or more ethylenically unsaturated monomers having a functional group described above. As the ethylenically unsaturated monomer having a functional group described above, in addition to acrylic acid and methacrylic acid, a compound represented by the following formula and a mixture thereof can be preferably exemplified. Moreover, in the following formula, $R^{40}$ represents a hydrogen atom or a methyl group.

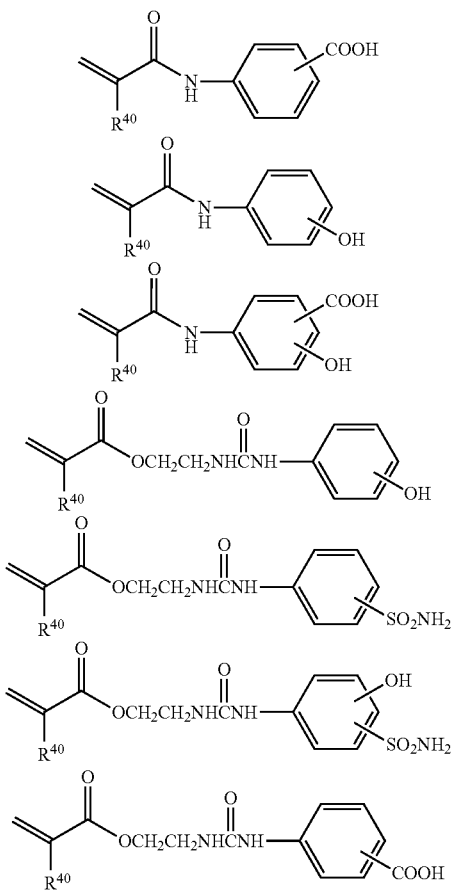

The water-insoluble and alkali-soluble resin which can be used in the present invention is preferably a polymer compound obtained by copolymerizing another polymerizable monomer in addition to the above-described polymerizable monomers. As the copolymerization ratio in this case, a monomer imparting alkali-solubility such as a monomer having a functional group such as a phenolic hydroxyl group, a carboxy group, a sulfonate group, a phosphate group, a sulfonamide group, or an active imide group is preferably included in 10 mol % or greater, and more preferably included in 20 mol % or greater. If the copolymerization component of the monomer imparting alkali-solubility is 10 mol % or greater, sufficient alkali-solubility is obtained, and developability is excellent.

Examples of other usable polymerizable monomers include compounds exemplified below.

Alkyl acrylates or alkyl methacrylates such as methyl acrylate, ethyl acrylate, propyl acrylate, benzyl acrylate, methyl methacrylate, ethyl methacrylate, cyclohexyl methacrylate, and benzyl methacrylate. Acrylic acid esters or methacrylic acid esters having an aliphatic hydroxyl group such as 2-hydroxyethyl acrylate and 2-hydroxyethyl methacrylate. Acrylamides or methacrylamides such as acrylamide, methacrylamide, N-methylacrylamide, N-ethylacrylamide, and N-phenylacrylamide. Vinyl esters such as vinyl acetate, vinyl chloroacetate, vinyl butyrate, and vinyl benzoate. Styrenes such as styrene, α-methylstyrene, methylstyrene, and chloromethylstyrene. Other nitrogen atom-containing monomers such as N-vinyl pyrrolidone, N-vinyl pyridine, acrylonitrile, and methacrylonitrile. Maleimides such as N-methylmaleimide, N-ethylmaleimide, N-propylmaleimide, N-butylmaleimide, N-phenylmaleimide, N-2-methylphenylmaleimide, N-2,6-diethylphenylmaleimide, N-2-chlorophenylmaleimide, N-cyclohexylmaleimide, N-laurylmaleimide, and N-hydroxyphenylmaleimide.

Among these other ethylenically unsaturated monomers, (meth)acrylic acid esters, (meth)acrylamides, maleimides, or (meth)acrylonitrile is suitably used.

In addition, as the alkali-soluble resin, a Novolac resin exemplified as other alkali-soluble resin exemplified as an arbitrary component of the photosensitive resin composition of the present invention may also be preferably exemplified.

In addition, the water-insoluble and alkali-soluble resin described above can also be used in the resin composition of the present invention.

Furthermore, in the upper layer of the present invention, other resins can be used in combination within a range not impairing the effects of the present invention. Since the upper layer is required to express alkali-solubility, in particular, in a non-image portion region, it is necessary to select a resin which does not impair this characteristic. From this viewpoint, as a resin usable in combination, a water-insoluble and alkali-soluble resin is exemplified. General water-insoluble and alkali-soluble resin will be described below in detail, and among these, a polyamide resin, an epoxy resin, a polyacetal resin, an acrylic resin, a methacrylic resin, a polystyrene-based resin, and a novolac-type phenolic resin are preferably exemplified.

In addition, the amount to be mixed is preferably 50% by mass or less with respect to the water-insoluble and alkali-soluble resin.

The water-insoluble and alkali-soluble resin preferably has a weight-average molecular weight of 2,000 or greater and a number average molecular weight of 500 or greater, and more preferably has a weight-average molecular weight of 5,000 to 300,000 and a number average molecular weight of 800 to 250,000. The dispersity (weight average molecular weight/number average molecular weight) of the alkali-soluble resin is preferably 1.1 to 10.

The alkali-soluble resin in other resin compositions of the photosensitive resin composition of the present invention may be used alone or in combination of two or more types thereof.

The content of the alkali-soluble resin with respect to the total solid content in other resin compositions of the present invention is preferably 2.0% by mass to 99.5% by mass, more preferably 10.0% by mass to 99.0% by mass, and still more preferably 20.0% by mass to 90.0% by mass, in the total solid content. If the addition amount of the alkali-soluble resin is 2.0% by mass or greater, the durability of a recording layer (photosensitive layer) is excellent, and if the addition amount of the alkali-soluble resin is 99.5% by mass or less, both the sensitivity and the durability are excellent.

[Infrared Absorbent]

An infrared absorbent may be included in other resin compositions described above.

The infrared absorbent is not particularly limited as long as it is a dye which generates heat by absorbing infrared light, and the infrared absorbent used in the resin composition of the present invention, described above, can also be used.

A particularly preferable dye is the cyanine dye represented by Formula a.

By containing an infrared absorbent in the upper layer, high sensitivity becomes good.

The addition amount of the infrared absorbent in the upper layer is preferably 0.01% by mass to 50% by mass, more preferably 0.1% by mass to 30% by mass, and particularly preferably 1.0% by mass to 10% by mass, with respect to the total solid content in the upper layer. If the addition amount is 0.01% by mass or greater, the sensitivity is improved, and if the addition amount is 50% by mass or less, the uniformity of the layer is good and the durability of the layer is excellent.

[Other Components]

In addition, the upper layer of the lithographic printing plate precursor of the two-layer structure may include an acid generator, an acid proliferative agent, a development accelerator, a surfactant, a print-out agent/colorant, a plasticizer, or a wax agent.

As these components, respective components used in the resin composition of the present invention, described above, can also be used, and preferable aspects thereof are also the same.

<Underlayer>

The underlayer of the lithographic printing plate precursor having a two-layer structure of the present invention is preferably formed by applying the photosensitive resin composition of the present invention.

By using the photosensitive resin composition of the present invention in the underlayer, a printing plate having excellent image formability and printing durability can be obtained.

In addition, by using the photosensitive resin composition of the present invention in the underlayer, in a case where materials such as an ink and paper having particularly poor quality are used, the printing durability is improved.

Though the detailed mechanism by which the effects as described above are obtained is unclear, it is assumed that for the printing durability in printing, the film strength of the resin used in the underlayer is important, and thus, it is assumed that, since the interaction between the binders is strong, by using the photosensitive resin composition of the present invention having a high film hardness in the underlayer, the printing durability is improved.

In a case where the photosensitive resin composition of the present invention is used in the upper layer, the underlayer is also preferably formed of the photosensitive resin composition of the present invention, and the underlayer may be formed using a resin composition other than the photosensitive resin composition of the present invention. A preferable aspect of the underlayer in this case is the same as the preferable aspect of the upper layer described above.

<Support>

The support used in the photosensitive resin composition of the present invention is not particularly limited as long as it is a dimensionally stable plate-shaped material having necessary strength and durability, and examples thereof include paper, paper on which plastic (for example, polyethylene, polypropylene, and polystyrene) has been laminated, a metal plate (for example, aluminum, zinc, and copper), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal), and paper or a plastic film on which the above-described metals have been laminated or vapor-deposited.

Moreover, the support in a case where the photosensitive resin composition of the present invention is applied to a lithographic printing plate precursor is preferably a polyester film or an aluminum plate, and among these, the aluminum plate which has good dimensional stability and is relatively inexpensive is particularly preferable. A suitable aluminum plate is a pure aluminum plate or an alloy plate which has aluminum as the main component and includes a small amount of other elements, or may be a plastic film on which aluminum has been laminated or vapor-deposited. Examples of other elements included in the aluminum alloy include silicon, iron, manganese, copper, magnesium, chromium, zinc, bismuth, nickel, and titanium. The content of other elements in the alloy is preferably 10% by mass or less.

Although particularly preferable aluminum in the invention is pure aluminum, it is difficult to produce completely pure aluminum on refining technique, and thus, other elements may be slightly contained.

The composition of the aluminum plate applied to the present invention as described above is not particularly limited, and aluminum plates formed of known and used materials in the related art can be appropriately used. The thickness of the aluminum plate used in the present invention is preferably 0.1 mm to 0.6 mm, more preferably 0.15 mm to 0.4 mm, and still more preferably 0.2 mm to 0.3 mm.

Such a aluminum plate may be subjected to a surface treatment such as a surface-roughening treatment and an anodization treatment, as necessary. As the surface treatment of the aluminum support, for example, a degreasing treatment with a surfactant, an organic solvent, or an alkaline aqueous solution, a roughening treatment of a surface, an anodization treatment, or the like, as described in detail in paragraphs 0167 to 0169 of JP2009-175195A, is suitably performed.

The aluminum plate on which an anodization treatment has been performed may be subjected to a hydrophilizing treatment, as necessary.

As the hydrophilizing treatment, the alkali metal silicate (for example, sodium silicate aqueous solution) method, the method of treating with potassium fluoride zirconate or polyvinylphosphonic acid, or the like, as disclosed in paragraph 0169 of JP2009-175195A, is used.

In addition, the supports described in JP2011-245844A can also be preferably used.

<Undercoat>

For example, in a case where the photosensitive resin composition of the present invention is applied to a lithographic printing plate precursor, an undercoat can be provided between a support and an under layer, as necessary.

As the undercoat component, various organic compounds can be used, and preferable examples thereof include phosphonic acids having an amino group such as carboxymethylcellulose or dextrin, an organic phosphonic acid, an organic phosphorus acid, an organic phosphinic acid, amino acids, and hydrochloride of an amine having a hydroxy group. In addition, these undercoat components may be used alone or in combination of two or more types thereof. Details of the compound used in the undercoat and the method of forming the undercoat are described in paragraphs 0171 and 0172 of JP2009-175195A, and those described here are also applied to the present invention.

The coating amount of the organic undercoat is preferably 2 mg/m$^2$ to 200 mg/m$^2$, and more preferably 5 mg/m$^2$ to 100 mg/m$^2$. If the coating amount is within the above range, sufficient printing durability is obtained.

<Back Coat Layer>

A back coat layover is provided on the rear surface of the support of the lithographic printing plate precursor of the present invention, if necessary. As the back coat layer, a coating layer formed of an organic polymer compound described in JP1993-45885A (JP-H05-45885A) or a metal oxide obtained by hydrolyzing and polycondensing an organic or inorganic metal compound described in JP1994-35174A (JP-H06-35174A) is preferably used. Among these coating layers, alkoxy compounds of silicon such as $Si(OCH_3)_4$, $Si(OC_2H_5)_4$, $Si(OC_3H_7)_4$, and $Si(OC_4H_9)_4$ are easily available at low cost, and coating layers of metal oxides obtained from these have excellent developer resistance, and thus, these are particularly preferable.

(Production Method for Lithographic Printing Plate)

The production method of the lithographic printing plate of the present invention includes a step of image-exposing the lithographic printing plate precursor and a step of developing using a developer in this order.

According to the production method of the lithographic printing plate of the present invention, the developability change becomes good, the contamination due to the residual film of the non-image portion does not occur in the obtained lithographic printing plate, and the strength of the image portion and the durability are excellent.

Hereinafter, each step of production method of the present invention will be described in detail.

<Exposure Step>

The production method of the lithographic printing plate of the present invention includes an exposure step of exposing the lithographic printing plate precursor of the present invention in an image shape. Moreover, the lithographic printing plate precursor is preferably a positive type lithographic printing plate precursor.

As a light source of active light used in image exposure of the lithographic printing plate precursor of the present invention, a light source having an emission wavelength in the near infrared region to the infrared region is preferable, and solid laser or semiconductor laser is more preferable. Among these, in the present invention, it is particularly preferable that image exposure is performed by solid laser or semiconductor laser emitting an infrared rays having a wavelength of 750 nm to 1,400 nm.

The output of the laser is preferably 100 mW or greater, and to shorten the exposure time, a multibeam laser device is preferably used. In addition, the exposure time per pixel is preferably within 20 μseconds.

Energy with which the lithographic printing plate precursor is irradiated is preferably 10 mJ/cm$^2$ to 300 mJ/cm$^2$. If the energy is within the above range, the laser ablation is suppressed, and thus, it is possible to prevent an image from being damaged.

In the exposure in the present invention, it is possible to expose by overlapping a light beam of the light source. The overlapping means that the sub-scanning pitch width is smaller than the beam diameter. For example, when the beam diameter is expressed by the half-value width (FWHM) of the beam intensity, the overlapping can be quantitatively expressed by FWHM/sub-scanning pitch width (overlap coefficient). In the present invention, this overlap coefficient is preferably 0.1 or greater.

The scanning method of the light source of an exposure device which can be used in the present invention is not particularly limited, and a drum outer surface scanning method, a drum inner surface scanning method, a planar scanning method, or the like can be used. In addition, the channel of the light source may be a single channel or a multichannel, and in the case of drum outer surface scanning method, the multichannel is preferably used.

<Development Step>

The production method of the lithographic printing plate of the present invention includes a development step of developing using an alkali aqueous solution (hereinafter, also referred to as "developer") with a pH of 8.5 to 13.5.

The developer used in the development step preferably has pH 12.5 to 13.5.

In addition, the developer preferably includes a surfactant, and more preferably includes at least am anionic surfactant or an nonionic surfactant. A surfactant contributes to improvement of processability.

As the surfactant used in the developer, any of an anionic surfactant, a nonionic surfactant, a cationic surfactant, and an amphoteric surfactant can be used, and as described above, an anionic surfactant or a nonionic surfactant is preferable.

As the anionic surfactant, the nonionic surfactant, the cationic surfactant, and the amphoteric surfactant used in the developer of the present invention, the surfactants described in paragraphs 0128 to 0131 of JP2013-134341A can be used.

In addition, from the viewpoint of stable solubility or turbidity in water, a surfactant preferably has a HLB value of 6 or greater and more preferably has a HLB value of 8 or greater.

As the surfactant used in the developer, an anionic surfactant or a nonionic surfactant is preferable, and an anionic surfactant containing sulfonic acid or sulfonate or a nonionic surfactant having an aromatic ring and an ethylene oxide chain is particularly preferable.

The surfactant may be used alone or in combination of two or more types thereof.

The content of the surfactant in the developer is preferably 0.01% by mass to 10% by mass, and more preferably 0.01% by mass to 5% by mass.

If as a buffer, carbonate ions or hydrogen carbonate ions are included to maintain the pH of the developer at 8.5 to 13.5, it is possible to suppress variations in pH even in a case where the developer is used for a long period of time, and it is possible to suppress developability deterioration and a development scum occurrence due to the variation in pH. To make carbonate ions and hydrogen carbonate ions present in the developer, carbonate and hydrogen carbonate may be added, or by adjusting the pH after carbonate or hydrogen carbonate is added, carbonate ions and hydrogen carbonate ions may be generated. Although carbonate and hydrogen carbonate are not particularly limited, an alkali metal salt is preferable. Examples of the alkali metal include lithium, sodium, and potassium, and sodium is particularly preferable. These may be used alone or in combination of two or more types thereof.

The total amount of carbonate and hydrogen carbonate is preferably 0.3% by mass to 20% by mass, more preferably 0.5% by mass to 10% by mass, and still more preferably 1% by mass to 5% by mass, with respect to the total mass of the developer. If the total amount is 0.3% by mass or greater, processing capability is not reduced, and if the total amount is 20% by mass or less, a precipitate or a crystal is less likely to be produced and at the time of the waste liquid treatment of the developer, gelation when neutralizing is less likely to occur, and thus, trouble does not occur in the waste liquid treatment.

In addition, for the purpose of finely adjusting the alkali concentration or assisting dissolution of the non-image portion photosensitive layer, supplementarily, other alkali agents, for example, organic alkali agents may be used in combination. Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. These alkali agents are used alone or in combination of two or more types thereof.

In addition to the above materials, the developer may contain a wetting agent, a preservative, a chelating compound, an anti-foaming agent, an organic acid, an organic solvent, an inorganic acid, an inorganic salt, or the like. If a water-soluble polymer compound is added, in particular, when the developer was fatigue, the plate surface is likely to be sticky, and thus, a water-soluble polymer compound is preferably not added.

As the wetting agent, the wetting agents described in paragraph 0141 of JP2013-134341A can be suitably used. The wetting agent may be used alone or in combination of two or more types thereof. The wetting agent is preferably used in an amount of 0.1% by mass to 5% by mass with respect to the total mass of the developer.

As the preservative, the preservatives described in paragraph 0142 of JP2013-134341A can be suitably used. Two or more preservatives are preferably used in combination various molds such that the preservatives have effect on various molds and of sterilization. The addition amount of the preservative is an amount in which the effect is stably exhibited on bacteria, fungi, yeast or the like, and although the addition amount varies depending on the type of bacteria, fungi, or yeast, the addition amount is preferably within a range of 0.01% by mass to 4% by mass with respect to the total mass of the developer.

As the chelate compound, the chelate compounds described in paragraph 0143 of JP2013-134341A can be suitably used. As the chelating agent, a chelating agent which is stably present in the developer composition and does not impair the printability is selected. The addition amount is preferably 0.001% by mass to 1.0% by mass with respect to the total mass of the developer.

As the anti-foaming agent, the anti-foaming agents described in paragraph 0144 of JP2013-134341A can be suitably used. The content of the anti-foaming agent is preferably within a range of 0.001% by mass to 1.0% by mass with respect to the total weight of the developer.

As the organic acid, the organic acids described in paragraph 0145 of JP2013-134341A can be suitably used. The content of the organic acid is preferably 0.01% by mass to 0.5% by mass with respect to the total mass of the developer.

Examples of the organic solvent include aliphatic hydrocarbons (hexane, heptane, "Isopar E, H, G" (manufactured by Exxon Chemical Company), gasoline, kerosene, and the like), aromatic hydrocarbons (toluene, xylene, and the like), halogenated hydrocarbons (methylene dichloride, ethylene dichloride, trichlene, monochlorobenzene, and the like), and polar solvents.

Examples of the polar solvent include alcohols (methanol, ethanol, propanol, isopropanol, benzyl alcohol, ethylene glycol monomethyl ether, 2-ethoxyethanol, and the like), ketones (methyl ethyl ketone, cyclohexanone, and the like), esters (ethyl acetate, methyl lactate, propylene glycol monomethyl ether acetate, and the like), and others (triethyl phosphate, tricresyl phosphate, N-phenylethanolamine, N-phenyldiethanolamine, and the like).

In addition, in a case where the organic solvent is insoluble in water, it is also possible to use by solubilizing the organic solvent in water using a surfactant or the like. In a case where the developer contains an organic solvent, from the viewpoint of safety and inflammability, the concentration of the solvent is preferably less than 40% by mass.

Examples of the inorganic acid and the inorganic salt include phosphoric acid, metaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, and nickel sulfate. The content of the inorganic salt is preferably 0.01% by mass to 0.5% by mass with respect to the total mass of the developer.

Although the temperature of development is not particularly limited, the temperature is preferably at 60° C. or lower, and more preferably 15° C. to 40° C. In the development treatment using an automatic developing device, the developer becomes fatigued according to the treatment amount, and thus, the processing capability may be restored using a replenisher or a fresh developer. In addition, by automatically setting a reference conductivity depending on which the timing of replenishing a development replenisher is determined, to a suitable value using an automatic developing device as described in JP1997-96910A (JP-H09-96910A), in consideration of the ratio of the processing fatigue and the carbonic acid gas fatigue, the activity of the developer may be maintained in good state for a long period of time.

As one example of the development or the treatment after the development, a method of performing alkali development, removing the alkali in a post-water washing step, performing a gum treatment in a gumming step, and drying in a drying step can be exemplified. In addition, as another example, a method of performing pre-washing, development, and gumming at the same time by using an aqueous solution containing carbonate ions, hydrogencarbonate ions, and a surfactant can be preferably exemplified. Thus, particularly, the pre-water washing may not be performed, and only by using one solution, pre-water washing, developing, and gumming are performed in one bath, and then, a drying step may be preferably performed. After developing, drying is preferably performed after the excess developer is removed using a squeeze roller or the like. In a case where there is an unnecessary image portion on the obtained lithographic printing plate, deletion of the unnecessary image portion is performed. As such deletion method, for example, a method in which deletion fluid as described in JP1990-13293B (JP-H02-13293B) is applied to the unnecessary image portion, and after the resulting product as it is allowed to stand for a predetermined time, washing with water is performed is preferable, and a method in which the unnecessary image portion is irradiated with active light introduced through an optical fiber as described in JP1993-174842A (JP-H05-174842A) and development is performed can also be used.

The development step can be suitably performed by an automatic processing machine equipped with a rubbing member. Examples of the automatic processing machine include an automatic processing machine which performs a rubbing treatment while transporting the lithographic printing plate precursor after image exposure, described in JP1990-220061A (JP-H02-220061A) and JP1985-59351A (JP-S60-59351A), and an automatic processing machine which performs a rubbing treatment on the lithographic printing plate precursor after image exposure, set on a cylinder while rotating the cylinder, described in U.S. Pat. Nos. 5,148,746A, 5,568,768A, and GB2297719B. Among these, as the rubbing member, an automatic treatment machine using a rotating brush roll is particularly preferable.

The rotating brush roller used in the present invention can be suitably selected in consideration of the difficulty in flawing of the image portion and the stiffness of the support of the lithographic printing plate precursor. As the rotating brush roll, a known rotating brush roll formed by implanting a brush material into a plastic or metal roll can be used. For example, the brush rolls described in JP1983-159533A (JP-S58-159533A) or JP1991-100554A (JP-H03-100554A) or a brush roll formed by closely and radially wrapping a metal or plastic grooved material into which a brush material has been implanted in a row on a plastic or metal roll which becomes a core, as described in JP1987-167253Y (JP-S62-167253Y), can be used.

As the brush material, plastic fibers (for example, polyester-based synthetic fibers such as polyethylene terephthalate and polybutylene terephthalate, polyamide-based synthetic fibers such as nylon 6.6 and nylon 6.10, polyacryl-based synthetic fibers such as polyacrylonitrile and polyalkyl(meth)acrylate, and polyolefin-based synthetic fibers such as polypropylene and polystyrene) can be used, and for example, a plastic fiber having a diameter of a fiber hair of 20 μm to 400 μm and a length of a hair of 5 mm to 30 mm can be suitably used.

The outer diameter of the rotating brush roll is preferably 30 mm to 200 mm, and the rotation speed of the front end of the brush rubbing the plate surface is preferably 0.1 m/sec to 5 m/sec. A plurality of the rotating brush rolls is preferably used.

Although the rotation direction of the rotating brush roll may be the same direction or may be the reverse direction, with respect to the transporting direction of the lithographic printing plate precursor, in a case where two or more rotating brush rolls are used, it is preferable that at least one rotating brush roll rotates in the same direction and at least one rotating brush roll rotates in the reverse direction. Thus, removal of the photosensitive layer of the non-image portion becomes more reliable. Furthermore, it is also effective to swing the rotating brush roller in the rotation axis direction of the brush roll.

After the development step, a continuous or discontinuous drying step is preferably performed. Drying is performed by hot air, infrared rays, or far infrared rays.

In the production method of the lithographic printing plate of the present invention, an automatic processing machine in which a developing and gumming are performed on a lithographic printing plate precursor in a developer tank, and then, the lithographic printing plate precursor is dried in the drying section, as a result, a lithographic printing plate is obtained may be used.

In addition, for the purpose of improving printing durability or the like, it is also possible to heat the printing plate after developing in very strong conditions. The heating temperature is preferably within a range of 200° C. to 500° C. In a case where the temperature is low, sufficient image strengthening effects are not obtained, and if the temperature is too high, there is a possibility that problems such as deterioration of the support or thermal decomposition of the image portion occur.

The lithographic printing plate obtained in this manner is mounted on an offset printing machine, and can be suitably used in printing a large number of sheets.

EXAMPLES

Hereinafter, the present invention will be described in detail using examples, but the present invention is not limited thereto. Moreover, "part" and "%" in the following examples respectively represent "part(s) by mass" and "% by mass" unless otherwise specified.

Synthesis Examples

Synthesis of Sulfonamide-Containing Diamine (SA-1)

Into a three-neck flask provided with a condenser and a stirrer, 350.0 g of chlorosulfonic acid was put, then, 46.1 g of toluene (manufactured by Wako Pure Chemical Industries, Ltd.) was added thereto under ice-cooling, and the resulting solution was stirred for 1 hour under ice-cooling. The temperature of the reaction solution was raised to 60° C., and the reaction solution was stirred for 3 hours. This reaction solution was cooled to room temperature while being stirred and added dropwise to a mixed solution of 1 L of ice water and 1 L of chloroform, and after being stirred for 30 minutes, this was transferred to a separating funnel, and the organic layer (chloroform layer) was separated. This chloroform solution was transferred again to a separating funnel and washed with a saturated sodium hydrogen carbonate aqueous solution, then, washing with pure water and liquid-liquid separation was performed two times, and washing with saturated saline and liquid-liquid separation was performed. After the organic layer (chloroform layer) was transferred to an Erlenmeyer flask, 30 g of magnesium sulfate was added thereto, followed by stirring, the solid content was removed by filtration, the chloroform was distilled off using an evaporator, and the resulting product was vacuum-dried at room temperature for 24 hours, whereby 70.0 g of a precursor S-1 (4-methyl-benzene-1,3-disulfonic chloride) which was a target substance was obtained. It was confirmed from the NMR spectrum that the obtained product was the precursor S-1. Analysis by $^1$NMR was performed on the precursor S-1. The result thereof is shown below.

$^1$H-NMR data (deuterated chloroform, 400 MHz, internal standard: tetramethylsilane) δ (ppm)=2.95 (s, 3H), 7.73-7.75 (d, 1H), 8.24-8.27 (d, 1H), 8.70 (s, 1H)

Into a three-neck flask provided with a condenser and a stirrer, 97.3 g of 1,4-phenylenediamine (manufactured by Tokyo Chemical Industry Co., Ltd.) and 400 g of acetonitrile were put, and the resulting product was stirred while being cooled to 0° C. to 5° C. After 43.4 g of the obtained precursor (S-1) was dissolved in 400 g of tetrahydrofuran, the resulting product was transferred to a dropping funnel, and the solution was added dropwise into the above three-neck flask under stirring over 1 hour and stirred for 1 hour. After the temperature of the reaction solution was returned to room temperature, the solution was stirred for 2 hours, then, 615 g of a 1 M sodium hydroxide aqueous solution and 500 g of pure water were added thereto, and these were dissolved. This reaction solution was transferred to a separating funnel, then, washing with 500 mL of ethyl acetate and liquid-liquid separation was performed three times, and the aqueous layer was collected. After 33.7 g of ammonium chloride (manufactured by Kanto Chemical Co., Inc.) was put into a 5 L beaker, this ammonium chloride was dissolved in 2 L of pure water, and the resulting solution was stirred at room temperature. After the aqueous layer was added dropwise into the 5 L beaker, the precipitated crystals were collected by filtration, then, the crystals were reslurry-washed with 1 L of pure water, and the crystals were collected by filtration. The collected crystals were reslurry-washed with 500 mL of chloroform, then, the crystals were collected by filtration, and the collected crystals were vacuum-dried at 40° C. for 24 hours, whereby 56.5 g of a target substance (SA-1) was obtained. It was confirmed from the NMR spectrum that the obtained product was the target substance.

Analysis by $^1$NMR was performed on the target substance (SA-1). The result thereof is shown below.

$^1$H-NMR data (deuterated DMSO, 400 MHz, internal standard: tetramethylsilane) δ (ppm)=2.55 (s, 3H), 5.00 (s, 4H), 6.35-6.38 (t, 4H), 6.55-6.57 (d, 2H), 6.60-6.62 (d, 2H), 7.46-7.48 (d, 1H), 7.58-7.61 (d, 1H), 8.10 (s, 1H), 9.61 (s, 1H), 9.75 (s, 1H)

In the same manner, SA-2 to SA-7 can be synthesized.

Synthesis Example of Polyurea Resin (PU-1)

Into a three-neck flask provided with a condenser and a stirrer, 4.32 g of 3,3'-dihydroxybenzidine (DADHB, manufactured by Tokyo Chemical Industry Co., Ltd.), 0.0083 g of cyclohexylamine (manufactured by Tokyo Chemical Industry Co., Ltd.), 33.6 g of N,N-dimethylacetamide (manufactured by Kanto Chemical Co., Inc.) were put, then, the temperature of the reaction solution was adjusted to room temperature, and the reaction solution was made to be homogeneous.

After 3.36 g of hexamethylene diisocyanate (HDI, manufactured by Tokyo Chemical Industry Co., Ltd.) was dissolved in 10.00 g of N,N-dimethylacetamide (manufactured by Kanto Chemical Co., Inc.), the resulting product was added dropwise thereto at room temperature over a period of 15 minutes using a dropping funnel, followed by allowing to react with stirring for 30 minutes at room temperature, then, 0.30 g of cyclohexylamine (manufactured by Tokyo Chemical Industry Co., Ltd.) was added thereto, and the resulting product was stirred for 15 minutes. Next, 15 mL of methanol was added to the reaction solution, then, the mixture was allowed to react at 65° C. for 2 hours, and the resulting product was cooled to room temperature and dissolved.

The above reaction solution was poured into a mixed solution of 0.3 L of pure water and 0.3 L of methanol, and as a result, a polymer was precipitated. This was collected by filtration, washed, and dried, whereby 7.01 g of a binder polymer (PU-1) having a weight average molecular weight of 56,000 was obtained.

It was confirmed from the NMR spectrum, the IR spectrum, and GPC (polystyrene conversion) that the obtained product was the target substance. In the same manner. PU-2 to PU-29 can be synthesized.

Synthesis Example of Polyurea Resin (PX-1) Including Sulfonamide

Into a three-neck flask provided with a condenser and a stirrer, 3.24 g of SA-1 obtained in the same manner as the above synthesis method, 1.62 g of 3,3'-dihydroxybenzidine (manufactured by Tokyo Chemical Industry Co., Ltd.), 0.5 g of o-aminophenol diluted to be 1% by mass with N,N-dimethylacetamide (manufactured by Tokyo Chemical Industry Co., Ltd.), and 27.54 g of N,N-dimethylacetamide were put, and by being stirred at room temperature, the resulting solution became homogeneous.

2.40 g of 1,4-phenylene diisocyanate (manufactured by Tokyo Chemical Industry Co., Ltd.) was added to the reaction solution at room temperature, followed by allowing to react with stirring at 60° C. for 2 hours, then, 0.3 g of o-aminophenol (manufactured by Tokyo Chemical Industry Co., Ltd.) was added thereto, and the resulting product was stirred for 15 minutes. Next, 20 mL of methanol was added to the reaction solution, then, the mixture was allowed to react at 65° C. for 3 hours. The reaction solution was poured into a mixed solution of 0.1 L of pure water and 0.2 L of methanol, and as a result, a polymer was precipitated. This was collected by filtration, washed, and dried, whereby 7.2 g of a binder polymer (PX-1) having a weight average molecular weight of 65,000 was obtained.

It was confirmed from the NMR spectrum, the IR spectrum, and GPC (polystyrene conversion) that the obtained product was the target substance.

In the same manner, PX-2 to PX-9 can be synthesized.

Synthesis Example of Polyurea Resin (PX-10) Including Imide

Into a three-neck flask provided with a condenser and a stirrer, 2.16 g of 3,3'-dihydroxybenzidine (DADHB, manufactured by Tokyo Chemical Industry Co., Ltd.), 26.2 g of N-methylpyrrolidone, and 0.22 g of triethylamine were put, and by being stirred under ice-cooling, the resulting solution became homogeneous. 0.42 g of trimellitic anhydride chloride (manufactured by Tokyo Chemical Industry Co., Ltd.) and 1.35 g of hexamethylene diisocyanate (HDI, manufactured by Tokyo Chemical Industry Co., Ltd.) were added thereto in this order, and the resulting product was allowed to react at room temperature for 3 hours. Next, 3.2 g of pyridine and 2.2 g of acetic anhydride were added thereto in this order, and the resulting product was allowed to react at 80° C. for 3 hours. The reaction solution was poured into a mixed solution of 0.4 L of pure water and 0.4 L of methanol to precipitate polyurea resin. This was collected by filtration, washed, and dried, whereby 3.54 g of a binder polymer (PX-10) having a weight average molecular weight of 59,000 was obtained. It was confirmed from the NMR spectrum, the IR spectrum, and GPC (polystyrene conversion) that the obtained product was the target substance. In the same manner, PX-11 to PX-15 can be synthesized.

Examples 1 to 31 and Comparative Examples 1 and 2

<Production of Support>

An aluminum alloy plate having a thickness of 0.3 mm of a material 1S was subjected to the treatment shown in the following Table 4 among (A) to (F) described below, whereby and a support for a lithographic printing plate was manufactured. Moreover, during all treatment steps, a washing treatment with water was performed, and after the washing treatment with water, liquid cutting was performed using a nip roller.

[Treatment A]

(A-a) Mechanical Roughening Treatment (Brush Grain Method)

While supplying a suspension of pumice (specific gravity of 1.1 g/cm$^3$) to the surface of an aluminum plate as a polishing slurry liquid, a mechanical roughening treatment was performed using rotating bundle bristle brushes.

The median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having ϕ300 mm. The distance between two supporting rollers (ϕ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(A-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m$^2$.

(A-c) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(A-d) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 185 C/dm$^2$ as the sum total of electric quantity at the time of anodizatinon of the aluminum plate. Thereafter, washing with water by spraying was performed.

(A-e) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 g/m$^2$.

(A-f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(A-g) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1, the electrochemical surface-roughening treatment was performed using a carbon electrode as a counter electrode. As an auxiliary anode, ferrite was used.

The current density was 25 A/dm$^2$ as the peak current value, and the electric quantity (C/dm$^2$) in the hydrochloric acid electrolysis was 63 C/dm$^2$ as the sum total of electric quantity at the time of anodizatinon of the aluminum plate. Thereafter, washing with water by spraying was performed.

(A-h) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(A-i) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(A-j) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(A-k) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment B]

(B-a) Mechanical Roughening Treatment (Brush Grain Method)

While supplying a suspension of pumice (specific gravity of 1.1 g/cm$^3$) to the surface of an aluminum plate as a polishing slurry liquid, a mechanical roughening treatment was performed using rotating bundle bristle brushes.

The median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having ϕ300 mm. The distance between two supporting rollers (ϕ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(B-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m$^2$.

(B-c) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(B-d) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 185 C/dm$^2$ as the sum total of electric quantity at the time of anodizatinon of the aluminum plate. Thereafter, washing with water by spraying was performed.

(B-e) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 g/m$^2$.

(B-f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(B-g) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1, the electrochemical surface-roughening treatment was performed using a carbon electrode as a counter electrode. As an auxiliary anode, ferrite was used.

The current density was 25 A/dm$^2$ as the peak current value, and the electric quantity (C/dm$^2$) in the hydrochloric acid electrolysis was 63 C/dm$^2$ as the sum total of electric quantity at the time of anodizatinon of the aluminum plate. Thereafter, washing with water by spraying was performed.

(B-h) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(B-i) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(B-j) First Stage of Anodization Treatment

A first stage of the anodization treatment was performed using an anodizing apparatus by DC electrolysis. The anodization treatment was performed using a solution obtained by dissolving aluminum ions of 7 g/L in a sulfuric acid aqueous solution of 170 g/L as an electrolytic bath under the conditions of a liquid temperature of 43° C. and a current density of 30 A/dm$^2$. The depth of the micropores was 27 μm, and the obtained coating amount was 0.13 g/m$^2$.

(B-k) Pore-Widening Treatment

A pore-widening treatment was performed by immersing the aluminum plate subjected to the anodization treatment in a caustic soda aqueous solution in which the concentration of caustic soda was 5% by mass and the concentration of aluminum ions was 0.5% by mass at a temperature of 35° C. for 1 second. Thereafter, washing with water by spraying was performed.

(B-1) Second Stage of Anodization Treatment

A second stage of the anodizing treatment was performed using an anodizing apparatus by DC electrolysis.

The anodizing treatment was performed using a solution obtained by dissolving aluminum ions of 7 g/L in a sulfuric acid aqueous solution of 170 g/L as an electrolytic bath under the conditions of a liquid temperature of 55° C. and a current density of 20 A/dm$^2$. The obtained coating amount was 2.6 g/m$^2$.

(B-m) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment (C)]

(C-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 1.0 g/m$^2$.

(C-b) Desmutting Treatment in Acidic Aqueous Solution (First Desmutting Treatment)

Next, a desmutting treatment was performed in an acidic aqueous solution. As the acidic aqueous solution used in the desmutting treatment, a sulfuric acid aqueous solution having a concentration of 150 g/L was used. The temperature was 30° C. The desmutting treatment was performed for 3 seconds by spraying the desmutting liquid using a spray. Thereafter, washing with water was performed.

(C-c) Electrochemical Roughening Treatment in Acidic Aqueous Solution

Next, an electrolytic surface-roughening treatment was performed using an electrolyte in which the concentration of hydrochloric acid was 14 g/L, the concentration of aluminum ions was 13 g/L, and the concentration of sulfuric acid was 3 g/L. The temperature of the electrolyte was 30° C. The concentration of aluminum ions was adjusted by adding aluminum chloride.

The waveform of AC was a sine wave in which the positive waveform and the negative waveform were symmetrical, the frequency was 50 Hz, the anode reaction time and the cathode reaction time at one period of AC was 1:1, and the current density was 75 A/dm$^2$ at the peak current value of AC waveform. In addition, the electric quantity was 450 C/dm$^2$ as the sum total of electric quantity which the aluminum plate taken in the anode reaction, and the electrolytic treatment was performed four times with an interval of 4 seconds by 125 C/dm$^2$. As the counter electrode of the aluminum plate, a carbon electrode was used. Thereafter, washing with water was performed.

(C-d) Alkali Etching Treatment

The aluminum plate after the electrochemical roughening treatment was subjected to an etching treatment by spraying a caustic soda aqueous solution in which the concentration of caustic soda was 5% by mass and the concentration of aluminum ions was 0.5% by mass using a spray tube at a temperature of 35° C. The amount of aluminum dissolved on the surface subjected to the electrochemical roughening treatment was 0.1 g/m$^2$. Thereafter, washing with water was performed.

(C-e) Desmutting Treatment in Acidic Aqueous Solution

Next, a desmutting treatment was performed in an acidic aqueous solution. As the acidic aqueous solution used in the desmutting treatment, the waste liquid (aluminum ions of 5.0 g/L were dissolved in a sulfuric acid aqueous solution of 170 g/L) generated in the anodization treatment step was used. The temperature was 30° C. The desmutting treatment was performed for 3 seconds by spraying the desmutting liquid using a spray.

(C-f) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(C-g) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment (D)]

(D-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 5 g/m$^2$.

(D-b) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(D-c) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 250 C/dm$^2$ as the sum total of electric quantity at the time of anodizatinon of the aluminum plate. Thereafter, washing with water by spraying was performed.

(D-d) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.2 g/m$^2$.

(D-e) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(D-f) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 25 A/dm$^2$ as the peak current value, and the electric quantity (C/dm$^2$) in the hydrochloric acid electrolysis was 63 C/dm$^2$ as the sum total of electric quantity at the time of anodizatinon of the aluminum plate. Thereafter, washing with water by spraying was performed.

(D-g) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(D-h) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(D-i) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(D-j) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment (E)]

(E-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 5 g/m$^2$.

(E-b) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(E-c) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 250 C/dm$^2$ as the sum total of electric quantity at the time of anodizatinon of the aluminum plate. Thereafter, washing with water by spraying was performed.

(E-d) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.2 g/m$^2$.

(E-e) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(E-f) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 25 A/dm$^2$ as the peak current value, and the electric quantity (C/dm$^2$) in the hydrochloric acid electrolysis was 63 C/dm$^2$ as the sum total of electric quantity at the time of anodizatinon of the aluminum plate. Thereafter, washing with water by spraying was performed.

(E-g) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(E-h) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(E-i) First Stage of Anodization Treatment

A first stage of the anodization treatment was performed using an anodizing apparatus by DC electrolysis.

The anodization treatment was performed using a solution obtained by dissolving aluminum ions of 7 g/L in a sulfuric acid aqueous solution of 170 g/L as an electrolytic bath under the conditions of a liquid temperature of 43° C. and a current density of 30 A/dm$^2$. The depth of the micropores was 27 μm, and the obtained coating amount was 0.13 g/m$^2$.

(E-j) Pore-Widening Treatment

A pore-widening treatment was performed by immersing the aluminum plate subjected to the anodization treatment in a caustic soda aqueous solution in which the concentration of caustic soda was 5% by mass and the concentration of aluminum ions was 0.5% by mass at a temperature of 35° C. for 1 second. Thereafter, washing with water by spraying was performed.

(E-k) Second Stage of Anodization Treatment

A second stage of the anodizing treatment was performed using an anodizing apparatus by DC electrolysis. The anodizing treatment was performed using a solution obtained by dissolving aluminum ions of 7 g/L in a sulfuric acid aqueous solution of 170 g/L as an electrolytic bath under the conditions of a liquid temperature of 40° C. and a current density of 20 A/dm$^2$. The obtained coating amount was 2.6 g/m$^2$.

(E-l) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment (F)]

(F-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 5 g/m$^2$.

(F-b) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(F-c) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 250 C/dm$^2$ as the sum total of electric quantity at the time of anodizatinon of the aluminum plate. Thereafter, washing with water by spraying was performed.

(F-d) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.2 g/m$^2$.

(F-e) Desmutting Treatment in Acidic Aqueous Solution

Next, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed in a sulfuric acid aqueous solution. The desmutting treatment was performed for 3 seconds by spraying the desmutting liquid using a spray.

(F-f) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(F-g) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment (G)]

(G-a) Mechanical Roughening Treatment (Brush Grain Method)

While supplying a suspension of pumice (specific gravity of 1.1 g/cm$^3$) to the surface of an aluminum plate as a polishing slurry liquid, a mechanical roughening treatment was performed using rotating bundle bristle brushes.

In the mechanical roughening treatment, the median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having ϕ300 mm. The distance between two supporting rollers (ϕ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(G-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m$^2$.

(G-c) Desmutting Treatment in Acidic Aqueous Solution

Next, a desmutting treatment was performed in an acidic aqueous solution. As the acidic aqueous solution used in the desmutting treatment, the waste liquid (aluminum ions of 5.0 g/L were dissolved in a sulfuric acid aqueous solution of 170 g/L) generated in the anodization treatment step was used. The temperature was 30° C. The desmutting treatment was performed for 3 seconds by spraying the desmutting liquid using a spray.

(G-d) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(G-e) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment (H)]

(H-a) Mechanical Roughening Treatment (Brush Grain Method)

While supplying a suspension of pumice (specific gravity of 1.1 g/cm$^3$) to the surface of an aluminum plate as a polishing slurry liquid, a mechanical roughening treatment was performed using rotating bundle bristle brushes.

In the mechanical roughening treatment, the median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having ϕ300 mm. The distance between two supporting rollers (ϕ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(H-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m$^2$.

(H-c) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(H-d) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 185 C/dm$^2$ as the sum total of electric quantity at the time of anodizatinon of the aluminum plate. Thereafter, washing with water by spraying was performed.

(H-e) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 g/m².

(H-f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(H-g) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(H-h) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m². Thereafter, washing with water by spraying was performed.

[Formation of Undercoat]

An undercoat coating solution 1 shown below was applied to each of the supports [A] to [H] produced in the above manner, followed by drying at 80° C. for 15 seconds, whereby supports [A-1] to [H-1] provided with an undercoat were obtained. The coating amount after drying was 15 mg/m².

<Undercoat Coating Liquid 1>

Following copolymer having a weight average molecular weight of 28,000 0.3 parts
Methanol 100 parts
Water 1 part

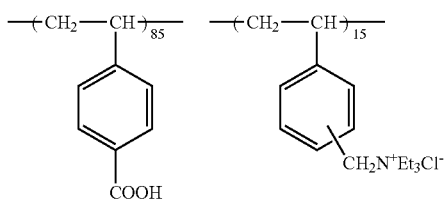

<Formation of Image Recording Layer>

After a coating solution composition (I) for forming an underlayer having the following composition was applied to the obtained supports [A-1] to [H-1] using a wire bar, the resulting product was dried in a drying oven at 150° C. for 40 seconds such that the coating amount became 1.0 g/m², whereby an underlayer was provided. After the underlayer was provided, a coating solution composition (II) for forming an upper layer having the following composition was applied using a wire bar, whereby an upper layer was provided. After application, the resulting product was dried at 150° C. for 40 seconds, whereby a lithographic printing plate precursor in which the amount of the underlayer and the upper layer coated was 1.2 g/m² was obtained.

(Coating Solution Composition (I) for Forming Underlayer)

Specific polymer compound described in Table 4: 3.5 parts
m, p-Cresol novolac (m/p ratio=6/4, weight average molecular weight of 6,000): 0.6 parts
Infrared absorbent (IR coloring agent (1): following structure): 0.2 parts
4,4'-Bishydroxyphenyl sulfone: 0.3 parts
Tetrahydrophthalic acid: 0.4 parts
p-Toluenesulfonic acid: 0.02 parts
3-Methoxy-4-diazodiphenylamine hexafluorophosphate: 0.06 parts
Product obtained by replacing an counter ion of ethyl violet with 6-hydroxynaphthalenesulfonic acid: 0.15 parts
Fluorine-based surfactant (MEGAFAC F-780, manufactured by DIC Corporation): 0.07 parts
Methyl ethyl ketone: 30 parts
1-Methoxy-2-propanol: 15 parts
N,N-dimethylacetamide: 15 parts

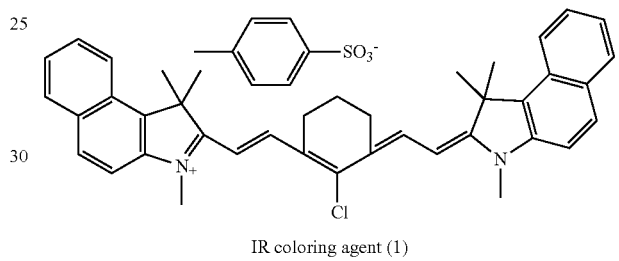

IR coloring agent (1)

(Coating Solution Composition (II) for Forming Upper Layer)

Novolac resin (m-cresol/p-cresolphenol=3/2/5, Mw 8,000): 0.68 parts
Infrared absorbent (IR coloring agent (1): above structure): 0.045 parts
Fluorine-based surfactant (MEGAFAC F-780, manufactured by DIC Corporation): 0.03 parts
Methyl ethyl ketone: 15.0 parts
1-Methoxy-2-propanol: 30.0 parts
5-Benzoyl-4-hydroxy-2-methoxybenzenesulfonate of 1-(4-methylbenzyl)-1-phenylpiperidinium: 0.01 parts The following evaluations were performed on the obtained lithographic printing plate precursor, and the results are shown in the following Table 4.

<Evaluation of Non-Image Portion Development Time>

Drawing of a test pattern in an image was performed on the lithographic printing plate precursor while changing the exposure energy using a Trendsetter VX manufactured by Creo company. Thereafter, the resulting product was immersed in a developing bath charged with a developer XP-D (which was made to have a conductivity of 43 mS/cm by diluting, pH 13.1) manufactured by Fujifilm Corporation, and the time required for developing the non-image portion at a developing temperature of 30° C. was measured. The immersion time in which the image density became equal to the image density of the Al substrate was taken as a non-Image portion development time. The results are shown in Table 4.

As the non-image portion development time is shorter, an alkali aqueous solution developability is good. The results are shown in Table 4.

<Evaluation of Printing Durability>

Drawing of a test pattern in an image was performed on the lithographic printing plate precursor using a Trendsetter VX manufactured by Creo company at a beam intensity of 9 W and a drum rotation speed of 150 rpm. Thereafter, using PS PROCESSOR LP940H manufactured by Fujifilm Corporation charged with a developer XP-D (which was made to have a conductivity of 43 mS/cm by diluting, pH 13.1) manufactured by Fujifilm Corporation, development was performed at a developing temperature of 30° C. The development time was made to be the non-image portion development time added with 5 seconds. This was continuously printed using a printer Lithrone manufactured by KOMORI Corporation. As the ink, a tokunen black ink manufactured by TOYO INK CO., LTD. which contains calcium carbonate, as a model of low-grade material was used. At this time, by visually observing how much sheets could be printed while maintaining a sufficient ink density, the printing durability was evaluated. As the number of sheets was larger, the printing durability was evaluated to be excellent. The results are shown in Table 4.

In addition, when the printing durability was evaluated under the same conditions as the above conditions except that development was performed while managing the conductivity using a PS PROCESSOR XP-940R instead of the PS processor LP940H, in all of the examples and comparative examples, the results were the same as in a case where the PS PROCESSOR LP940H was used.

<Evaluation of Chemical Resistance>

Exposure, development, and printing were performed on the lithographic printing plate precursors of the examples in the same manner as in the evaluation of the printing durability. In this time, every time 5,000 sheets were printed, a step of wiping 5 times the plate surface with a PS sponge including a cleaner (MC-E, manufactured by Fujifilm Corporation, multi cleaner) was performed, and the chemical resistance was evaluated. The printing durability (chemical resistance memo) at this time was evaluated as 1 in a case where the number of printed sheets was 95% to 100% of the number of printing endurable sheets described above, evaluated as 2 in a case where the number of printed sheets was 80% or greater and less than 95%, evaluated as 3 in a case where the number of printed sheets was 60% or greater and less than 80%, and evaluated as 4 in a case where the number of printed sheets was less than 60%. Even in a case where the step of wiping the plate surface with a cleaner was performed, as the change in the printing durability index was smaller, the chemical resistance was evaluated to be excellent. The results are shown in the following Table 4.

TABLE 4

|  | Support | Specific polymer compound | Non-image portion development time (seconds) | Printing durability Number of printed sheets (x 10,000) | Chemical resistance |
|---|---|---|---|---|---|
| Example 1 | A | PU-1 | 6 | 15 | 1 |
| Example 2 | B | PU-1 | 6 | 16 | 1 |
| Example 3 | C | PU-1 | 6 | 17 | 1 |
| Example 4 | D | PU-1 | 6 | 18 | 1 |
| Example 5 | E | PU-1 | 6 | 18 | 1 |
| Example 6 | F | PU-1 | 6 | 17 | 1 |
| Example 7 | G | PU-1 | 6 | 13 | 1 |
| Example 8 | H | PU-1 | 6 | 14 | 1 |
| Example 9 | A | PU-4 | 8 | 12 | 1 |
| Example 10 | A | PU-5 | 4 | 12 | 2 |

TABLE 4-continued

|  | Support | Specific polymer compound | Non-image portion development time (seconds) | Printing durability Number of printed sheets (x 10,000) | Chemical resistance |
|---|---|---|---|---|---|
| Example 11 | A | PU-7 | 8 | 12 | 1 |
| Example 12 | A | PU-15 | 4 | 10 | 2 |
| Example 13 | A | PU-17 | 10 | 10 | 1 |
| Example 14 | A | PU-18 | 8 | 12 | 2 |
| Example 15 | A | PU-19 | 10 | 11 | 2 |
| Example 16 | A | PU-20 | 10 | 11 | 2 |
| Example 17 | A | PU-21 | 10 | 11 | 2 |
| Example 18 | A | PU-22 | 10 | 11 | 2 |
| Example 19 | A | PU-23 | 12 | 11 | 1 |
| Example 20 | A | PU-24 | 12 | 11 | 1 |
| Example 21 | A | PU-25 | 12 | 11 | 1 |
| Example 22 | A | PU-26 | 12 | 12 | 1 |
| Example 23 | A | PU-27 | 12 | 10 | 1 |
| Example 24 | A | PU-28 | 8 | 11 | 2 |
| Example 25 | A | PU-29 | 8 | 11 | 2 |
| Example 26 | A | PX-1 | 4 | 12 | 2 |
| Example 27 | A | PX-3 | 4 | 10 | 2 |
| Example 28 | A | PX-4 | 4 | 12 | 2 |
| Example 29 | A | PX-7 | 4 | 13 | 2 |
| Example 30 | A | PX-10 | 6 | 10 | 1 |
| Example 31 | A | PX-14 | 6 | 10 | 2 |
| Comparative Example 1 | A | CP-1 | 20 | 6 | 3 |
| Comparative Example 2 | A | CP-2 | 12 | 8 | 2 |

Synthesis Example of CP-1)

Into a three-neck round bottom flask provided with a condenser and a stirrer, 62.53 g of the following compound CP-1-1, 48.0 g of 1,4-phenylene isocyanate (manufactured by Tokyo Chemical Industry Co., Ltd.), 44.45 g of isophorone diisocyanate (manufactured by Tokyo Chemical Industry Co., Ltd.), the following compounds CP-1-2 (82.08 g), N,N-dimethylacetamide (800 g, manufactured by Wako Pure Chemical Industries, Ltd.), and di-n-butyltin dilaurate (5 drops, manufactured by Tokyo Chemical Industry Co., Ltd.) were put, and the resulting product was heated at 100° C. for 8 hours. Thereafter, dilution was performed with methanol (100 ml) and N,N-dimethylacetamide (800 g). The reaction solution was poured into water (4 L) with stirring, and as a result, a white polymer was precipitated. This polymer was separated by filtration, washed with water, and vacuum-dried, whereby a polyurethane resin (CP-1) (51.35 g) was obtained.

When the weight average molecular weight of the obtained polyurethane resin (CP-1) was measured by gel permeation chromatography (GPC), the weight average molecular weight was 51,000 in terms of polystyrene, and the acid value was 0.72 meq/g.

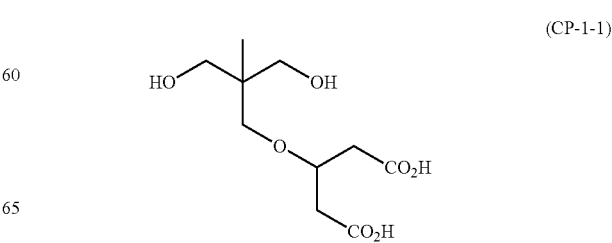

(CP-1-1)

(CP-1-2)

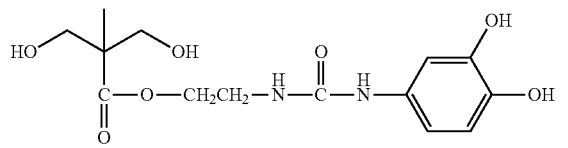

Into a flask provided with a stirrer and a heating device, 30 g of methanol and 5 g of N,N-dimethylacetamide were put. Next, 13.87 g (0.126 mol) of catechol and 13.76 g (0.115 mol) of N,N'-dimethylol urea were added thereto. After while stirring this at room temperature, 6 g (12 N) of concentrated hydrochloric acid was added thereto, heating was performed, and when the temperature reaches 55° C., while maintaining the temperature, the resulting product was allowed to react at 55° C. to 60° C. for 5 hours. This reaction solution was poured into 400 ml of water with stirring, and as a result, a pale yellow solid was precipitated. This was separated by filtration and dried, whereby 20 g of CP-2 was obtained. The yield at this time was 72%. When the weight average molecular weight of the obtained polyurea resin (CP-2) was measured by gel permeation chromatography (GPC), the weight average molecular weight was 47,000 in terms of polystyrene.

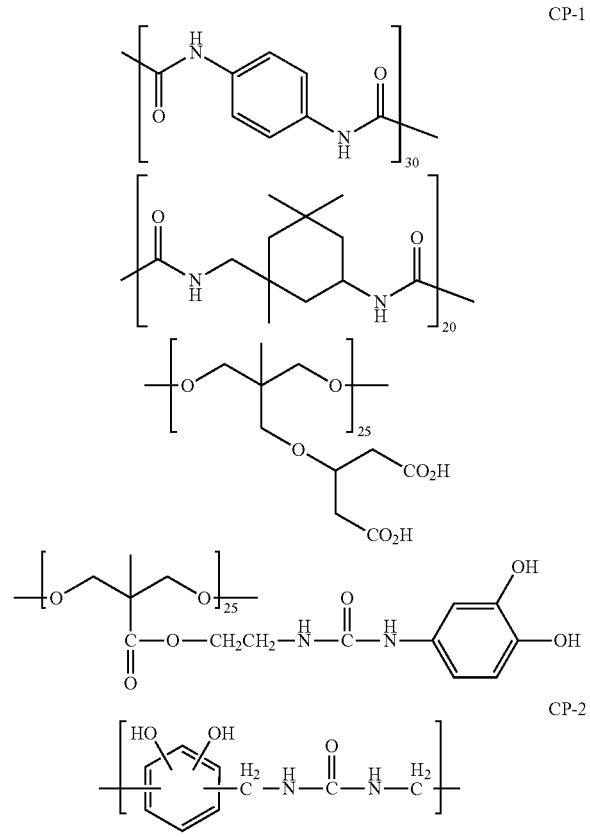

As apparent from the results shown in Table 4, it is found that, in a case where the photosensitive resin composition of the present invention is used, developability and printing durability are improved.

Examples 32 to 62 and Comparative Examples 3 and 4

<Production of Support>

In the same manner as in Examples 1 to 31 and Comparative Examples 1 and 2, supports [A] to [H] were produced.

<Formation of Undercoat>

An undercoat coating solution 2 shown below was applied to each of the supports [A] to [H] produced in the above manner, followed by drying at 80° C. for 15 seconds, whereby supports [A-1] to [H-1] provided with an undercoat were obtained. The coating amount after drying was 15 mg/m².

(Undercoat Coating Solution 2)

β-alanine: 0.5 parts

Methanol: 95 parts

Water: 5 parts

<Formation of Recording Layer>

After a coating solution composition (V) for forming an underlayer having the following composition was applied to the obtained supports [A-1] to [H-1] using a wire bar such that the coating amount became 1.5 g/m², the resulting product was dried in a drying oven at 160° C. for 40 seconds and, immediately, cooled until the temperature of the support reached 35° C. using a cold air at 17° C. to 20° C., whereby an underlayer was provided. After the underlayer was provided, a coating solution composition (VI) for forming an upper layer having the following composition was applied thereto using a wire bar such that the coating amount became 0.5 g/m², and by drying the resulting product at 130° C. for 40 seconds and slowly cooling using an air at 20° C. to 26° C. an upper layer was provided, whereby a lithographic printing plate precursor was obtained.

(Coating Solution Composition (V) for Forming Underlayer)

Specific polymer compound described in Table 5: 0.8 parts

Infrared absorbent (IR coloring agent (1): above structure): 0.017 parts

Crystal Violet (manufactured by HODOGAYA CHEMICAL CO., LTD.): 0.017 parts

MEGAFAC F-177 (manufactured by DIC Corporation, fluorine-based surfactant): 0.015 parts N,N-dimethylacetamide: 10 parts Methyl ethyl ketone: 10 parts 1-Methoxy-2-propanol: 8 parts (Coating Solution Composition (VI) for Forming Upper Layer)

Styrene/acrylonitrile/methacrylic acid copolymers (compositional ratio of 69 mol %/25 mol %/6 mol %, weight average molecular weight=45,000): 20 parts Alkali-soluble resin: following polyurethane 1: 10 parts Ethyl Violet: 0.03 parts MEGAFAC F-177 (manufactured by DIC Corporation, fluorine-based surfactant): 0.05 parts 3-Pentanone: 60 parts Propylene glycol monomethyl ether-2-acetate: 8 parts (Polyurethane 1)

A diisocyanate compound and a diol compound represented by the following formulas was polymerized to be a molar ratio of 1:1 (weight-average molecular weight of 36,000).

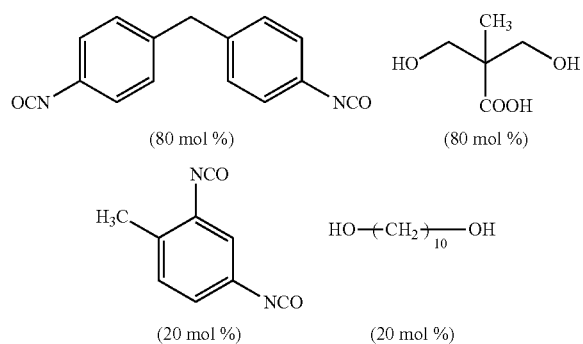

Evaluation was performed on the obtained lithographic printing plate precursor under the same conditions as in Example 1 except that PS PROCESSOR FLH 85P manufactured by Fujifilm Corporation charged with a Goldstar Premium Plate Developer (pH 13.0) manufactured by Eastman Kodak Company was used in a development treatment, the temperature was maintained at 23° C., and the development time was 40 seconds.

TABLE 5

|  | Support | Specific polymer compound | Non-image portion development time (seconds) | Printing durability Number of printed sheets (x 10,000) | Chemical resistance |
| --- | --- | --- | --- | --- | --- |
| Example 32 | A | PU-1 | 10 | 17 | 1 |
| Example 33 | B | PU-1 | 10 | 18 | 1 |
| Example 34 | C | PU-1 | 10 | 19 | 1 |
| Example 35 | D | PU-1 | 10 | 20 | 1 |
| Example 36 | E | PU-1 | 10 | 21 | 1 |
| Example 37 | F | PU-1 | 10 | 19 | 1 |
| Example 38 | G | PU-1 | 10 | 15 | 1 |
| Example 39 | H | PU-1 | 10 | 16 | 1 |
| Example 40 | A | PU-4 | 12 | 13 | 1 |
| Example 41 | A | PU-5 | 8 | 13 | 2 |
| Example 42 | A | PU-7 | 12 | 13 | 1 |
| Example 43 | A | PU-15 | 8 | 11 | 2 |
| Example 44 | A | PU-17 | 14 | 11 | 1 |
| Example 45 | A | PU-18 | 10 | 14 | 2 |
| Example 46 | A | PU-19 | 12 | 14 | 2 |
| Example 47 | A | PU-20 | 12 | 14 | 2 |
| Example 48 | A | PU-21 | 12 | 14 | 2 |
| Example 49 | A | PU-22 | 12 | 14 | 2 |
| Example 50 | A | PU-23 | 16 | 14 | 1 |
| Example 51 | A | PU-24 | 16 | 14 | 1 |
| Example 52 | A | PU-25 | 16 | 14 | 1 |
| Example 53 | A | PU-26 | 16 | 15 | 1 |
| Example 54 | A | PU-27 | 16 | 13 | 1 |
| Example 55 | A | PU-28 | 10 | 14 | 2 |
| Example 56 | A | PU-29 | 10 | 14 | 2 |
| Example 57 | A | PX-1 | 8 | 13 | 2 |
| Example 58 | A | PX-3 | 8 | 11 | 2 |
| Example 59 | A | PX-4 | 8 | 13 | 2 |
| Example 60 | A | PX-7 | 8 | 14 | 2 |
| Example 61 | A | PX-10 | 10 | 11 | 1 |
| Example 62 | A | PX-14 | 10 | 11 | 2 |
| Comparative Example 3 | A | CP-1 | 28 | 6 | 3 |
| Comparative Example 4 | A | CP-2 | 20 | 9 | 2 |

As apparent from the results shown in Table 5, it is found that, in a case where the photosensitive resin composition of the present invention is used, developability and printing durability are improved.

Examples 63 to 93 and Comparative Examples 5 and 6

<Production of Support>

In the same manner as in Examples 1 to 31 and Comparative Examples 1 and 2, supports [A] to [H] were produced.

<Formation of Undercoat>

In the same manner as in Examples 1 to 31, supports [A-1] to [H-1] having an undercoat were produced.

<Formation of Recording Layer>

After a coating solution composition (IX) having the following composition was applied to the obtained supports [A-1] to [H-1] using a wire bar, the resulting product was dried in a drying oven at 140° C. for 50 seconds, whereby a lithographic printing plate precursor having a coating amount of 1.0 g/m² was obtained.

(Coating Solution Composition (IX))

m, p-Cresol novolac (m/p ratio=6/4, weight average molecular weight of 5,000): 0.474 parts
Specific polymer compound described in Table 6: 2.37 parts
Infrared absorbent (above IR coloring agent (1)): 0.155 parts
2-Methoxy-4-(N-phenylamino)benzenediazonium hexafluorophosphate: 0.03 parts
Tetrahydrophthalic anhydride: 0.19 parts
Product obtained by replacing an counter ion of ethyl violet with 6-hydroxy-β-naphthalenesulfonic acid: 0.11 parts
Fluorine-based surfactant (MEGAFAC F-780, manufactured by DIC Corporation): 0.07 parts
p-Toluenesulfonic acid: 0.008 parts
Bis-p-hydroxyphenyl sulfone: 0.13 parts
3,3'-Dimyristyl thiodipropionate: 0.04 parts
Lauryl stearate: 0.02 parts
N,N-dimethylacetamide: 13 parts
Methyl ethyl ketone: 24 parts
1-Methoxy-2-propanol: 11 parts Evaluation was performed on the obtained lithographic printing plate precursor under the same conditions as in Example 1 except that a developer LH-DS (pH 13.5) manufactured by Fujifilm Corporation was used in a development treatment, and the results are shown in the following Table 6.

TABLE 6

|  | Support | Specific polymer compound | Non-image portion development time (seconds) | Printing durability Number of printed sheets (x 10,000) | Chemical resistance |
| --- | --- | --- | --- | --- | --- |
| Example 63 | A | PU-1 | 10 | 15 | 1 |
| Example 64 | B | PU-1 | 10 | 16 | 1 |
| Example 65 | C | PU-1 | 10 | 17 | 1 |
| Example 66 | D | PU-1 | 10 | 18 | 1 |
| Example 67 | E | PU-1 | 10 | 18 | 1 |
| Example 68 | F | PU-1 | 10 | 17 | 1 |
| Example 69 | G | PU-1 | 10 | 13 | 1 |
| Example 70 | H | PU-1 | 10 | 14 | 1 |
| Example 71 | A | PU-4 | 12 | 12 | 1 |
| Example 72 | A | PU-5 | 8 | 12 | 2 |
| Example 73 | A | PU-7 | 12 | 12 | 1 |
| Example 74 | A | PU-15 | 8 | 9 | 2 |
| Example 75 | A | PU-17 | 14 | 11 | 1 |
| Example 76 | A | PU-18 | 12 | 11 | 2 |
| Example 77 | A | PU-19 | 14 | 10 | 2 |

TABLE 6-continued

| | Support | Specific polymer compound | Non-image portion development time (seconds) | Printing durability Number of printed sheets (x 10,000) | Chemical resistance |
|---|---|---|---|---|---|
| Example 78 | A | PU-20 | 14 | 10 | 2 |
| Example 79 | A | PU-21 | 14 | 10 | 2 |
| Example 80 | A | PU-22 | 14 | 10 | 2 |
| Example 81 | A | PU-23 | 16 | 10 | 1 |
| Example 82 | A | PU-24 | 16 | 10 | 1 |
| Example 83 | A | PU-25 | 16 | 10 | 1 |
| Example 84 | A | PU-26 | 16 | 11 | 1 |
| Example 85 | A | PU-27 | 16 | 9 | 1 |
| Example 86 | A | PU-28 | 12 | 10 | 2 |
| Example 87 | A | PU-29 | 12 | 10 | 2 |
| Example 88 | A | PX-1 | 8 | 12 | 2 |
| Example 89 | A | PX-3 | 8 | 10 | 2 |
| Example 90 | A | PX-4 | 8 | 12 | 2 |
| Example 91 | A | PX-7 | 8 | 13 | 2 |
| Example 92 | A | PX-10 | 10 | 10 | 1 |
| Example 93 | A | PX-14 | 10 | 10 | 2 |
| Comparative Example 5 | A | CP-1 | 28 | 6 | 3 |
| Comparative Example 6 | A | CP-2 | 20 | 8 | 2 |

As apparent from the results shown in Table 6, it is found that, in a case where the photosensitive resin composition of the present invention is used, developability and printing durability are improved.

Examples 94 to 124 and Comparative Examples 7 and 8

Production and evaluation of lithographic printing plate precursors were performed in the same manner as in Examples 1 to 31 and Comparative Examples 1 and 2 except that dimethyl sulfoxide was used instead of N,N'-dimethylacetamide of the coating solution composition (I) for forming an underlayer. The evaluation results are shown in Table 7.

TABLE 7

| | Support | Specific polymer compound | Non-image portion development time (seconds) | Printing durability Number of printed sheets (x 10,000) | Chemical resistance |
|---|---|---|---|---|---|
| Example 94 | A | PU-1 | 10 | 15 | 1 |
| Example 95 | B | PU-1 | 10 | 16 | 1 |
| Example 96 | C | PU-1 | 10 | 17 | 1 |
| Example 97 | D | PU-1 | 10 | 18 | 1 |
| Example 98 | E | PU-1 | 10 | 18 | 1 |
| Example 99 | F | PU-1 | 10 | 17 | 1 |
| Example 100 | G | PU-1 | 10 | 13 | 1 |
| Example 101 | H | PU-1 | 10 | 14 | 1 |
| Example 102 | A | PU-4 | 12 | 12 | 1 |
| Example 103 | A | PU-5 | 8 | 12 | 2 |
| Example 104 | A | PU-7 | 12 | 12 | 1 |
| Example 105 | A | PU-15 | 8 | 10 | 2 |
| Example 106 | A | PU-17 | 14 | 10 | 1 |
| Example 107 | A | PU-18 | 12 | 12 | 2 |
| Example 108 | A | PU-19 | 14 | 11 | 2 |
| Example 109 | A | PU-20 | 14 | 11 | 2 |
| Example 110 | A | PU-21 | 14 | 11 | 2 |
| Example 111 | A | PU-22 | 14 | 11 | 2 |
| Example 112 | A | PU-23 | 16 | 11 | 1 |
| Example 113 | A | PU-24 | 16 | 11 | 1 |
| Example 114 | A | PU-25 | 16 | 11 | 1 |
| Example 115 | A | PU-26 | 16 | 12 | 1 |
| Example 116 | A | PU-27 | 16 | 10 | 1 |
| Example 117 | A | PU-28 | 12 | 11 | 2 |
| Example 118 | A | PU-29 | 12 | 11 | 2 |
| Example 119 | A | PX-1 | 8 | 12 | 2 |
| Example 120 | A | PX-3 | 8 | 10 | 2 |
| Example 121 | A | PX-4 | 8 | 12 | 2 |
| Example 122 | A | PX-7 | 8 | 13 | 2 |
| Example 123 | A | PX-10 | 10 | 10 | 1 |
| Example 124 | A | PX-14 | 10 | 10 | 2 |
| Comparative Example 7 | A | CP-1 | 26 | 6 | 3 |
| Comparative Example 8 | A | CP-2 | 16 | 8 | 2 |

As apparent from the results shown in Table 7, it is found that, in a case where the photosensitive resin composition of the present invention is used, developability and printing durability are improved.

Examples 125 to 155 and Comparative Examples 9 and 10

Production and evaluation of lithographic printing plate precursors were performed in the same manner as in Examples 32 to 62 and Comparative Examples 3 and 4 except that dimethyl sulfoxide was used instead of N,N'-dimethylacetamide of the coating solution composition (V) for forming an underlayer. The evaluation results are shown in Table 8.

TABLE 8

| | Support | Specific polymer compound | Non-image portion development time (seconds) | Printing durability Number of printed sheets (x 10,000) | Chemical resistance |
|---|---|---|---|---|---|
| Example 125 | A | PU-1 | 12 | 17 | 1 |
| Example 126 | B | PU-1 | 12 | 18 | 1 |
| Example 127 | C | PU-1 | 12 | 19 | 1 |
| Example 128 | D | PU-1 | 12 | 20 | 1 |
| Example 129 | E | PU-1 | 12 | 21 | 1 |
| Example 130 | F | PU-1 | 12 | 19 | 1 |
| Example 131 | G | PU-1 | 12 | 15 | 1 |
| Example 132 | H | PU-1 | 12 | 16 | 1 |
| Example 133 | A | PU-4 | 14 | 13 | 1 |
| Example 134 | A | PU-5 | 10 | 13 | 2 |
| Example 135 | A | PU-7 | 14 | 13 | 1 |
| Example 136 | A | PU-15 | 10 | 11 | 2 |
| Example 137 | A | PU-17 | 16 | 11 | 1 |
| Example 138 | A | PU-18 | 12 | 14 | 2 |
| Example 139 | A | PU-19 | 14 | 14 | 2 |
| Example 140 | A | PU-20 | 14 | 14 | 2 |
| Example 141 | A | PU-21 | 14 | 14 | 2 |
| Example 142 | A | PU-22 | 14 | 14 | 2 |
| Example 143 | A | PU-23 | 18 | 14 | 1 |
| Example 144 | A | PU-24 | 18 | 14 | 1 |
| Example 145 | A | PU-25 | 18 | 14 | 1 |
| Example 146 | A | PU-26 | 18 | 15 | 1 |
| Example 147 | A | PU-27 | 18 | 13 | 1 |
| Example 148 | A | PU-28 | 12 | 14 | 2 |
| Example 149 | A | PU-29 | 12 | 14 | 2 |
| Example 150 | A | PX-1 | 10 | 13 | 2 |
| Example 151 | A | PX-3 | 10 | 11 | 2 |
| Example 152 | A | PX-4 | 10 | 13 | 2 |
| Example 153 | A | PX-7 | 10 | 14 | 2 |

TABLE 8-continued

| | Support | Specific polymer compound | Non-image portion development time (seconds) | Printing durability Number of printed sheets (× 10,000) | Chemical resistance |
|---|---|---|---|---|---|
| Example 154 | A | PX-10 | 12 | 11 | 1 |
| Example 155 | A | PX-14 | 12 | 11 | 2 |
| Comparative Example 9 | A | CP-1 | 32 | 6 | 3 |
| Comparative Example 10 | A | CP-2 | 22 | 9 | 2 |

As apparent from the results shown in Table 8, it is found that, in a case where the photosensitive resin composition of the present invention is used, developability and printing durability are improved.

Examples 156 to 186 and Comparative Examples 11 and 12

Production and evaluation of lithographic printing plate precursors were performed in the same manner as in Examples 63 to 93 and Comparative Examples 5 and 6 except that dimethyl sulfoxide was used instead of N,N'-dimethylacetamide of the coating solution composition (IX). The evaluation results are shown in Table 9.

TABLE 9

| | Support | Specific polymer compound | Non-image portion development time (seconds) | Printing durability Number of printed sheets (× 10,000) | Chemical resistance |
|---|---|---|---|---|---|
| Example 156 | A | PU-1 | 12 | 15 | 1 |
| Example 157 | B | PU-1 | 12 | 16 | 1 |
| Example 158 | C | PU-1 | 12 | 17 | 1 |
| Example 159 | D | PU-1 | 12 | 18 | 1 |
| Example 160 | E | PU-1 | 12 | 18 | 1 |
| Example 161 | F | PU-1 | 12 | 17 | 1 |
| Example 162 | G | PU-1 | 12 | 13 | 1 |
| Example 163 | H | PU-1 | 12 | 14 | 1 |
| Example 164 | A | PU-4 | 14 | 12 | 1 |
| Example 165 | A | PU-5 | 10 | 12 | 2 |
| Example 166 | A | PU-7 | 14 | 12 | 1 |
| Example 167 | A | PU-15 | 10 | 9 | 2 |
| Example 168 | A | PU-17 | 16 | 11 | 1 |
| Example 169 | A | PU-18 | 14 | 11 | 2 |
| Example 170 | A | PU-19 | 16 | 10 | 2 |
| Example 171 | A | PU-20 | 16 | 10 | 2 |
| Example 172 | A | PU-21 | 16 | 10 | 2 |
| Example 173 | A | PU-22 | 16 | 10 | 2 |
| Example 174 | A | PU-23 | 18 | 10 | 1 |
| Example 175 | A | PU-24 | 18 | 10 | 1 |
| Example 176 | A | PU-25 | 18 | 10 | 1 |
| Example 177 | A | PU-26 | 18 | 11 | 1 |
| Example 178 | A | PU-27 | 18 | 9 | 1 |
| Example 179 | A | PU-28 | 14 | 10 | 2 |
| Example 180 | A | PU-29 | 14 | 10 | 2 |
| Example 181 | A | PX-1 | 10 | 12 | 2 |
| Example 182 | A | PX-3 | 10 | 10 | 2 |
| Example 183 | A | PX-4 | 10 | 12 | 2 |
| Example 184 | A | PX-7 | 10 | 13 | 2 |
| Example 185 | A | PX-10 | 12 | 10 | 1 |
| Example 186 | A | PX-14 | 12 | 10 | 2 |
| Comparative Example 11 | A | CP-1 | 30 | 6 | 3 |
| Comparative Example 12 | A | CP-2 | 22 | 8 | 2 |

As apparent from the results shown in Table 9, it is found that, in a case where the photosensitive resin composition of the present invention is used, developability and printing durability are improved.

What is claimed is:

1. A lithographic printing plate precursor, comprising:
   an image recording layer including a photosensitive resin composition on a support having a hydrophilic surface,
   wherein the photosensitive resin composition comprises:
   a polymer compound having a weight average molecular weight of from 5,000 to 300,000 and having a linking group represented by Formula A-1 in a main chain; and
   an infrared absorbing material,

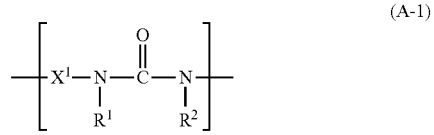

(A-1)

wherein in Formula A-1, $R^1$ and $R^2$ each independently represent a hydrogen atom or a monovalent organic group, and $X^1$ represents a linking group represented by any one of the following Formulas A-2 to A-6, and

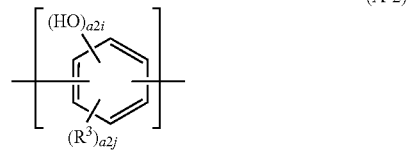

(A-2)

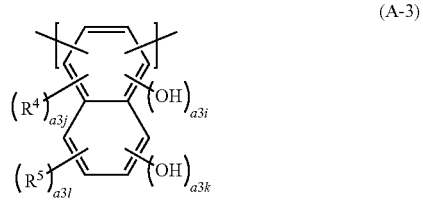

(A-3)

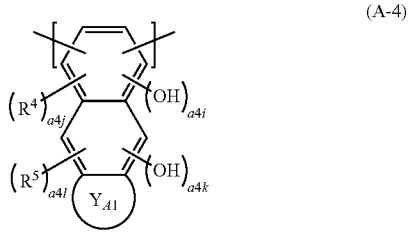

(A-4)

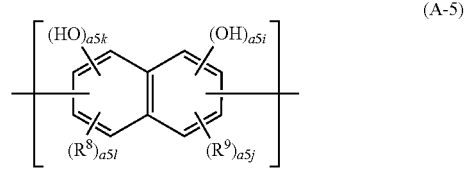

(A-5)

-continued

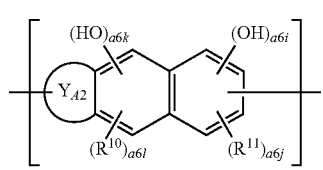
(A-6)

in Formulas A-2 to A-6, $R^3$ represents a halogen atom or a monovalent organic group, a2i represents an integer of 1 to 4, a2j represents an integer of 0 to 3, a2i+a2j is 1 to 4, $R^4$ and $R^5$ each independently represent a halogen atom or a monovalent organic group, a3i and a3j each independently represent an integer of 0 to 2, a3k and a3l each independently represent an integer of 0 to 4, a3i+a3k is 1 to 6, a3j+a3l is 0 to 6−(a3i+a3k), $R^6$ and $R^7$ each independently represent a halogen atom or a monovalent organic group, a4i and a4k each independently represent an integer of 0 to 2, a4i+a4k is 1 to 4, a4j and a4l each independently represent an integer of 0 to 2, a4j+a4l is 0 to 4−(a4i+a4k), $Y_{A1}$ represents an aromatic hydrocarbon ring or an aliphatic hydrocarbon ring, $R^8$ and $R^9$ each independently represent a halogen atom or a monovalent organic group, a5i and a5k each independently represent an integer of 0 to 3, a5i+a5k is 1 to 6, a5j and a5l each independently represent an integer of 0 to 3, a5j+a5l is 0 to 6−(a5i+a5k), $R^{10}$ and $R^{11}$ each independently represent a halogen atom or a monovalent organic group, a6k represents an integer of 0 to 2, a6i represents an integer of 0 to 3, a6i+a6k is 1 to 5, a6l represents an integer of 0 to 2, a6j represents an integer of 0 to 3, a6l+a6j is 0 to 5−(a6i+a6k), and $Y_{A2}$ represents an aromatic hydrocarbon ring or an aliphatic hydrocarbon ring.

2. The lithographic printing plate precursor according to claim 1 which is a positive type.

3. The lithographic printing plate precursor according to claim 1 which is a positive type lithographic printing plate precursor having an image recording layer formed of an underlayer and an upper layer on a support,
wherein the photosensitive resin composition is contained in the underlayer and/or the upper layer.

4. The lithographic printing plate precursor according to claim 3,
wherein the photosensitive resin composition is contained in the underlayer.

5. A method for producing a lithographic printing plate, comprising in the following order:
image-exposing the lithographic printing plate precursor according to claim 1; and
developing using an alkali aqueous solution with a pH of 8.5 to 13.5.

6. The lithographic printing plate precursor according to claim 1,
wherein the polymer compound includes a linking group represented by the following Formula A-7 in the main chain, and

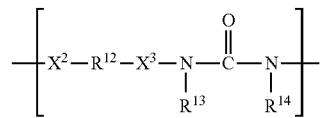
(A-7)

in Formula A-7, $R^{12}$ represents a single bond or a divalent linking group, $R^{13}$ and $R^{14}$ each independently represent a hydrogen atom or a monovalent organic group, and $X^2$ and $X^3$ each independently represent a linking group represented by any one of Formulas A-2 to A-6.

7. The lithographic printing plate precursor according to claim 6,
wherein the linking group represented by Formula A-7 is a linking group represented by the following Formula A-8, and

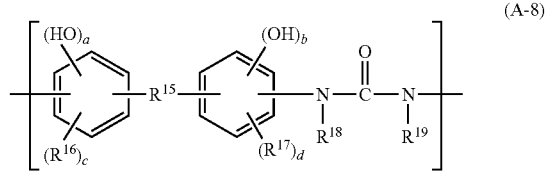
(A-8)

in Formula A-8, $R^{15}$ represents a single bond or a divalent linking group, $R^{16}$ and $R^{17}$ each independently represent a halogen atom or a monovalent organic group, $R^{18}$ and $R^{19}$ each independently represent a hydrogen atom or a monovalent organic group, a, b, c and d each independently represent an integer of 0 to 4, a+b is 1 to 8, and c+d is 0 to 8−(a+b).

8. The lithographic printing plate precursor according to claim 1,
wherein the polymer compound further has a linking group represented by the following Formula A-9 in the main chain, and

(A-9)

in Formula A-9, $R^{49}$ represents a hydrogen atom or a monovalent organic group.

9. The lithographic printing plate precursor according to claim 6,
wherein the polymer compound further has a linking group represented by the following Formula A-9 in the main chain, and

(A-9)

in Formula A-9, $R^{49}$ represents a hydrogen atom or a monovalent organic group.

10. The lithographic printing plate precursor according to claim 7,
 wherein the polymer compound further has a linking group represented by the following Formula A-9 in the main chain, and

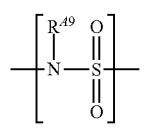
(A-9)

in Formula A-9, $R^{A9}$ represents a hydrogen atom or a monovalent organic group.

11. The lithographic printing plate precursor according to claim 1,
 wherein the polymer compound has a linking group represented by the following Formula B-1 or B-2 in the main chain, and

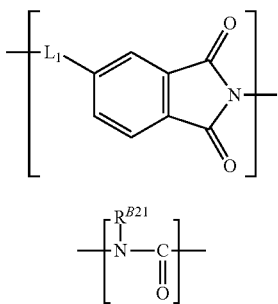
(B-1)

(B-2)

in Formula B-1 and B-2, $L_1$ represents a single bond or a divalent linking group, and $R^{B21}$ represents a hydrogen atom or a monovalent organic group.

12. The lithographic printing plate precursor according to claim 8,
 wherein the polymer compound has a linking group represented by the following Formula B-1 or B-2 in the main chain, and

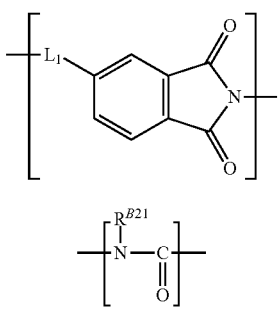
(B-1)

(B-2)

in Formula B-1 and B-2, $L_1$ represents a single bond or a divalent linking group, and $R^{B21}$ represents a hydrogen atom or a monovalent organic group.

13. The lithographic printing plate precursor according to claim 9,
 wherein the polymer compound has a linking group represented by the following Formula B-1 or B-2 in the main chain, and

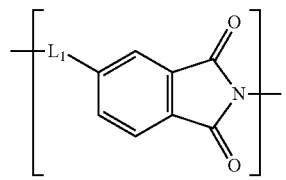
(B-1)

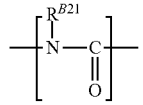
(B-2)

in Formula B-1 and B-2, $L_1$ represents a single bond or a divalent linking group, and $R^{B21}$ represents a hydrogen atom or a monovalent organic group.

14. The lithographic printing plate precursor according to claim 10,
 wherein the polymer compound has a linking group represented by the following Formula B-1 or B-2 in the main chain, and

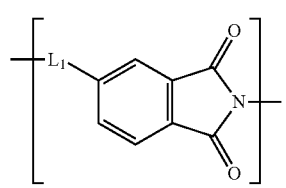
(B-1)

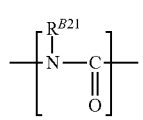
(B-2)

in Formula B-1 and B-2, $L_1$ represents a single bond or a divalent linking group, and $R^{B21}$ represents a hydrogen atom or a monovalent organic group.

15. The lithographic printing plate precursor according to claim 1,
 wherein the polymer compound further has at least one selected from the group consisting of linking groups represented by each of the following Formulas B-3 to B-7 in the main chain, and

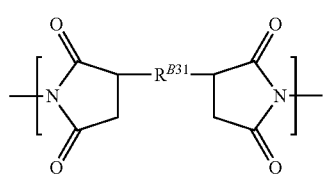
(B-3)

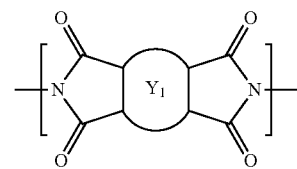
(B-4)

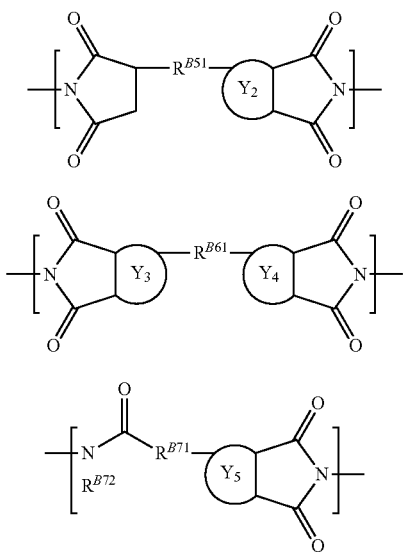

(B-5)

(B-6)

(B-7)

in Formulas B-3 to B-7, $R^{B31}$, $R^{B51}$, $R^{B61}$, and $R^{B71}$ each independently represent a single bond or a divalent linking group, $R^{B72}$ represents a hydrogen atom or a monovalent organic group, and $Y_1$ to $Y_5$ each independently represent an aromatic hydrocarbon ring or an aliphatic hydrocarbon ring.

16. The lithographic printing plate precursor according to claim 8, wherein the polymer compound further has at least one selected from the group consisting of linking groups represented by each of the following Formulas B-3 to B-7 in the main chain, and

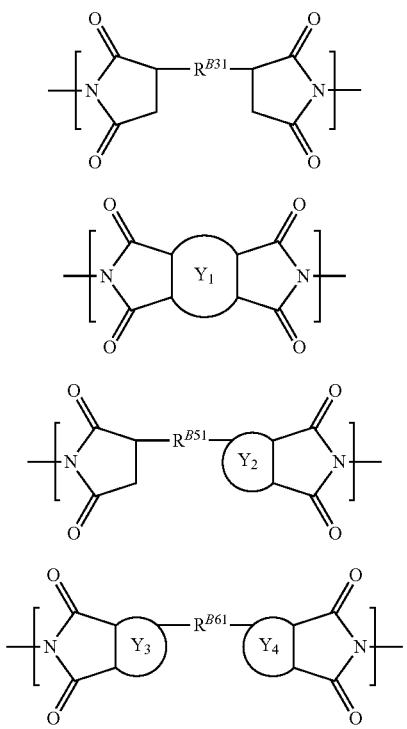

(B-3)

(B-4)

(B-5)

(B-6)

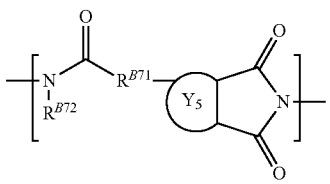

(B-7)

in Formulas B-3 to B-7, $R^{B31}$, $R^{B51}$, $R^{B61}$, and $R^{B71}$ each independently represent a single bond or a divalent linking group, $R^{B72}$ represents a hydrogen atom or a monovalent organic group, and $Y_1$ to $Y_5$ each independently represent an aromatic hydrocarbon ring or an aliphatic hydrocarbon ring.

17. The lithographic printing plate precursor according to claim 9, wherein the polymer compound further has at least one selected from the group consisting of linking groups represented by each of the following Formulas B-3 to B-7 in the main chain, and

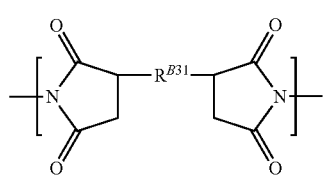

(B-3)

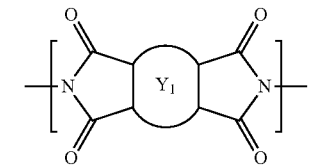

(B-4)

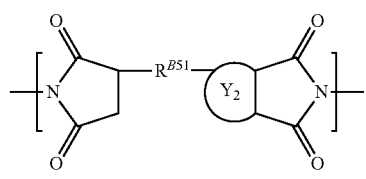

(B-5)

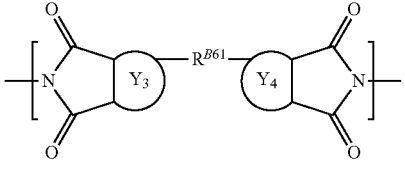

(B-6)

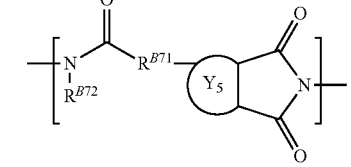

(B-7)

in Formulas B-3 to B-7, $R^{B31}$, $R^{B51}$, $R^{B61}$, and $R^{B71}$ each independently represent a single bond or a divalent linking group, $R^{B72}$ represents a hydrogen atom or a monovalent organic group, and $Y_1$ to $Y_5$ each independently represent an aromatic hydrocarbon ring or an aliphatic hydrocarbon ring.

18. The lithographic printing plate precursor according to claim 10,
wherein the polymer compound further has at least one selected from the group consisting of linking groups represented by each of the following Formulas B-3 to B-7 in the main chain, and

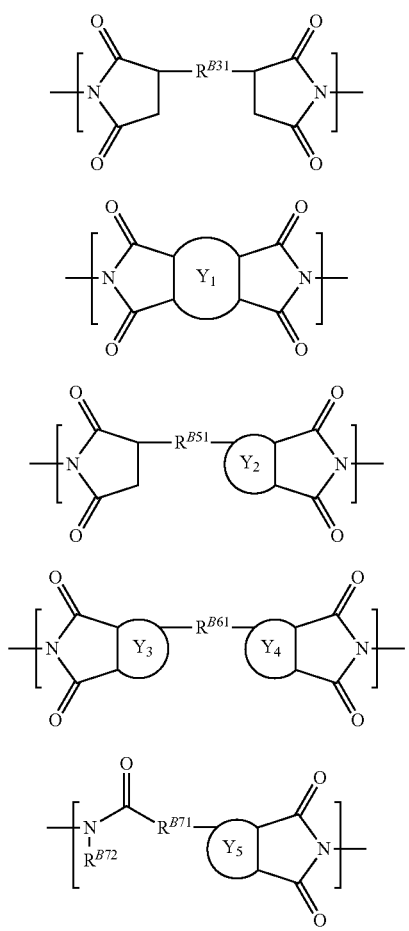

in Formulas B-3 to B-7, $R^{B31}$, $R^{B51}$, $R^{B61}$, and $R^{B71}$ each independently represent a single bond or a divalent linking group, $R^{B72}$ represents a hydrogen atom or a monovalent organic group, and $Y_1$ to $Y_5$ each independently represent an aromatic hydrocarbon ring or an aliphatic hydrocarbon ring.

19. The lithographic printing plate precursor according to claim 1,
wherein the polymer compound further has at least one selected from the group consisting of linking groups represented by each of the following Formulas B-4 or B-7 in the main chain, and

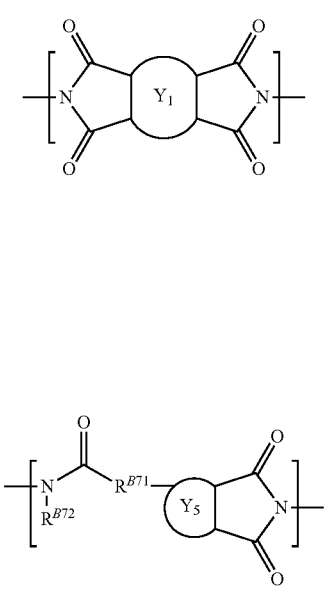

in Formulas B-4 and B-7, $R^{B71}$ represents a single bond or a divalent linking group, $R^{B72}$ represents a hydrogen atom or a monovalent organic group, and $Y_i$ and $Y_5$ represent an aromatic hydrocarbon ring or an aliphatic hydrocarbon ring.

* * * * *